United States Patent
Hayashibe et al.

(10) Patent No.: US 9,288,891 B2
(45) Date of Patent: *Mar. 15, 2016

(54) CONDUCTIVE ELEMENT AND METHOD OF MANUFACTURING THE SAME, WIRING ELEMENT, AND MASTER COPY

(71) Applicant: Sony Corporation, Tokyo (JP)

(72) Inventors: Kazuya Hayashibe, Kanagawa (JP); Hiroshi Tazawa, Kanagawa (JP); Shunichi Kajiya, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/387,145

(22) PCT Filed: Mar. 8, 2013

(86) PCT No.: PCT/JP2013/057324
§ 371 (c)(1),
(2) Date: Sep. 22, 2014

(87) PCT Pub. No.: WO2013/146331
PCT Pub. Date: Oct. 3, 2013

(65) Prior Publication Data
US 2015/0027759 A1 Jan. 29, 2015

(30) Foreign Application Priority Data

Mar. 28, 2012 (JP) ................................. 2012-075247

(51) Int. Cl.
*H05K 1/03* (2006.01)
*H05K 1/09* (2006.01)
(Continued)

(52) U.S. Cl.
CPC *H05K 1/02* (2013.01); *G06F 3/041* (2013.01); *G09F 9/00* (2013.01); *H05B 33/14* (2013.01);
(Continued)

(58) Field of Classification Search
CPC .................................... H05K 1/02; H05K 3/02
USPC .................................... 174/255, 257; 428/98.4
See application file for complete search history.

(56) References Cited

U.S. PATENT DOCUMENTS

2008/0304155 A1* 12/2008 Endoh .................... G02B 1/118
359/558
2009/0252932 A1* 10/2009 Kitano ........................ C08J 3/28
428/195.1
(Continued)

FOREIGN PATENT DOCUMENTS

JP 2005-149807 6/2005
JP 2009-266025 11/2009
(Continued)

OTHER PUBLICATIONS

International Search Report issued in connection with International Patent Application No. PCT/JP2013/057324, dated Jun. 4, 2013. (2 pages).

*Primary Examiner* — Sherman Ng
(74) *Attorney, Agent, or Firm* — Hazuki International, LLC

(57) ABSTRACT

A conductive element includes: a substrate having a first wavy surface, a second wavy surface, and a third wavy surface; a first layer provided on the first wavy surface; and a second layer formed on the second wavy surface. The first and second layers form a conductive pattern portion. The first, second, and third wavy surfaces satisfy the following relationship:

$$0 \leq (Am1/\lambda m1) < (Am2/\lambda m2) < (Am3/\lambda m3) \leq 1.8$$

(where $Am1$ is an average width of vibrations of the first wavy surface, $Am2$ is an average width of vibrations of the second wavy surface, $Am3$ is an average width of vibrations of the third wavy surface, $\lambda m1$ is an average wavelength of the first wavy surface, $\lambda m2$ is an average wavelength of the second wavy surface, and $\lambda m3$ is an average wavelength of the third wavy surface.)

20 Claims, 36 Drawing Sheets

(51) Int. Cl.
*C23C 26/00* (2006.01)
*H05K 1/02* (2006.01)
*G06F 3/041* (2006.01)
*G09F 9/00* (2006.01)
*H05B 33/14* (2006.01)
*H05K 3/00* (2006.01)
*H05K 3/06* (2006.01)
*H05K 3/02* (2006.01)
*H05K 3/38* (2006.01)

(52) U.S. Cl.
CPC ............ *H05K 1/0306* (2013.01); *H05K 3/0014* (2013.01); *H05K 3/02* (2013.01); *H05K 3/06* (2013.01); *H05K 3/389* (2013.01); *H05K 2201/0317* (2013.01); *H05K 2201/0326* (2013.01); *H05K 2201/09027* (2013.01); *H05K 2203/0108* (2013.01); *H05K 2203/0143* (2013.01); *H05K 2203/0537* (2013.01); *H05K 2203/10* (2013.01)

(56) References Cited

U.S. PATENT DOCUMENTS

| | | | |
|---|---|---|---|
| 2010/0323165 A1* | 12/2010 | Sakuma | G02B 1/118 428/167 |
| 2011/0310489 A1 | 12/2011 | Kajiya et al. | |
| 2012/0147472 A1 | 6/2012 | Kajiya et al. | |
| 2012/0241198 A1 | 9/2012 | Kajiya et al. | |
| 2013/0003181 A1 | 1/2013 | Hayashibe et al. | |
| 2013/0284497 A1 | 10/2013 | Kajiya et al. | |

FOREIGN PATENT DOCUMENTS

| | | |
|---|---|---|
| JP | 2011-230431 | 11/2011 |
| JP | 2012-204170 | 10/2012 |
| JP | 2013-073334 | 4/2013 |
| WO | 2011/027909 | 3/2011 |
| WO | 2011/080890 | 7/2011 |
| WO | 2012/098693 | 7/2012 |
| WO | 2012/098694 | 7/2012 |

* cited by examiner

FIG. 1
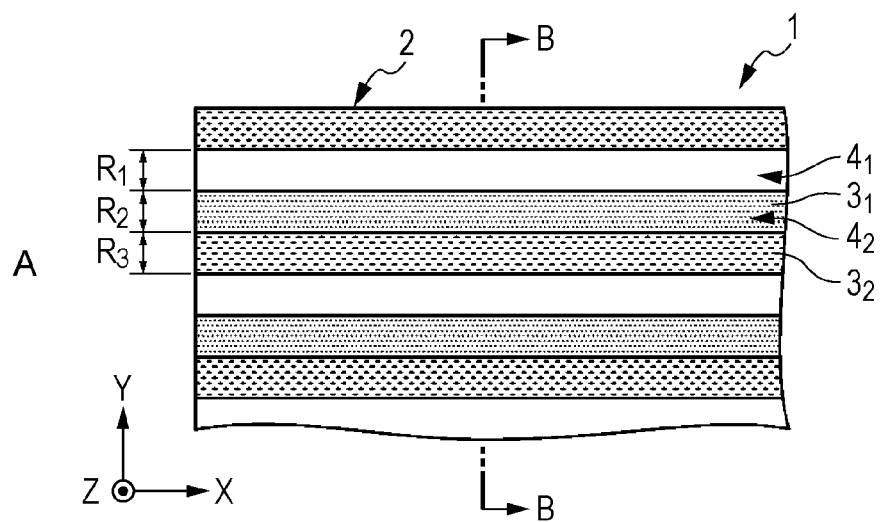
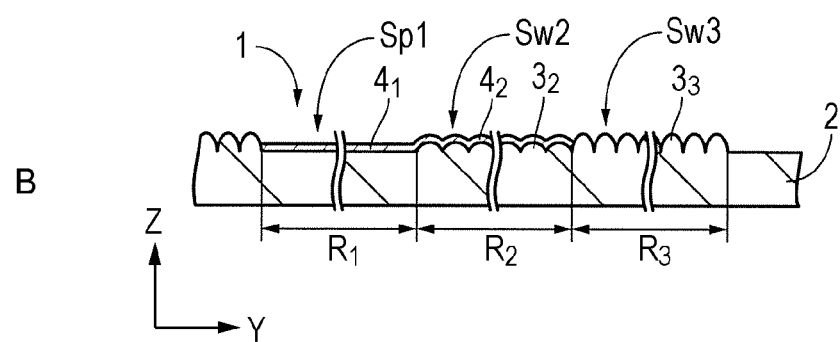
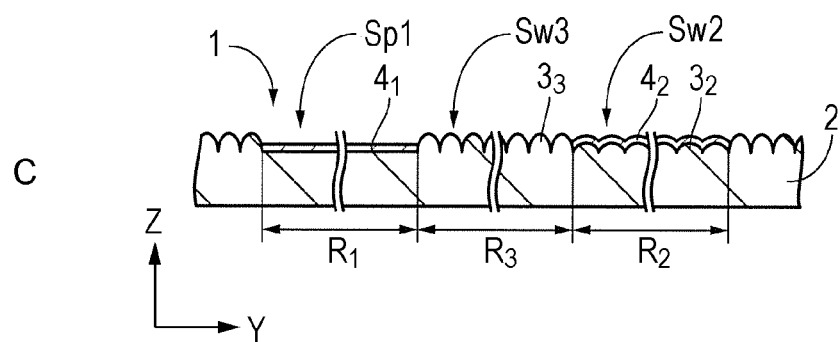

FIG. 2
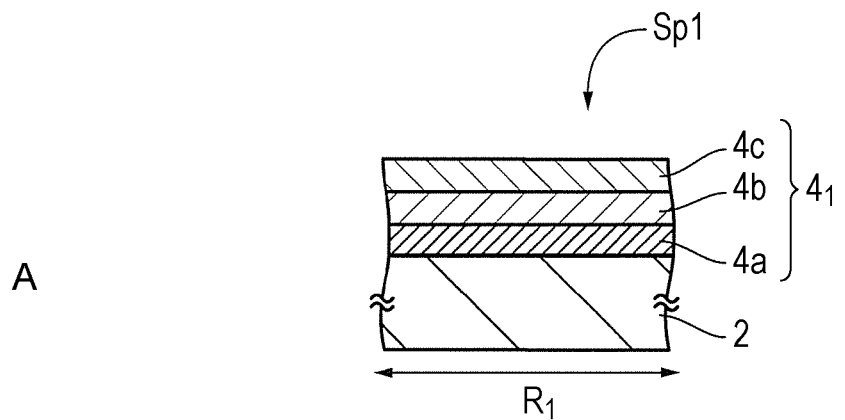
A
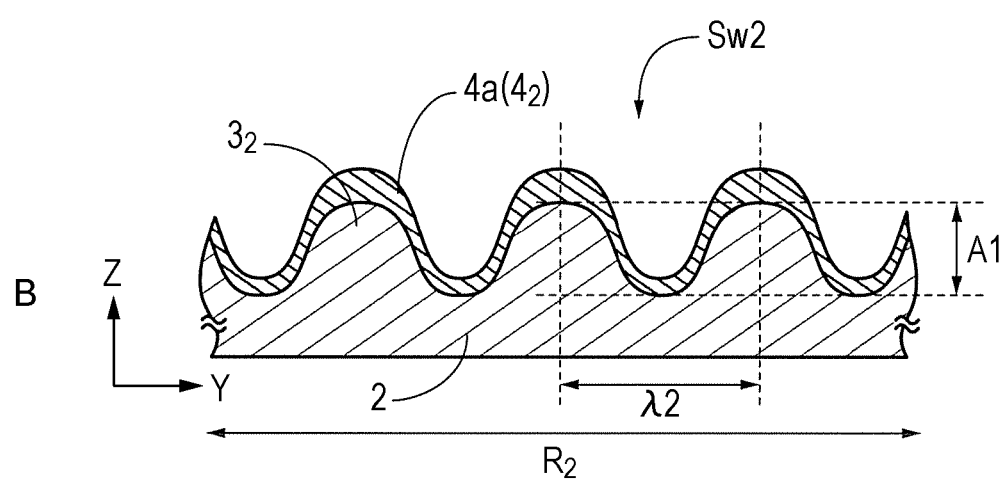
B
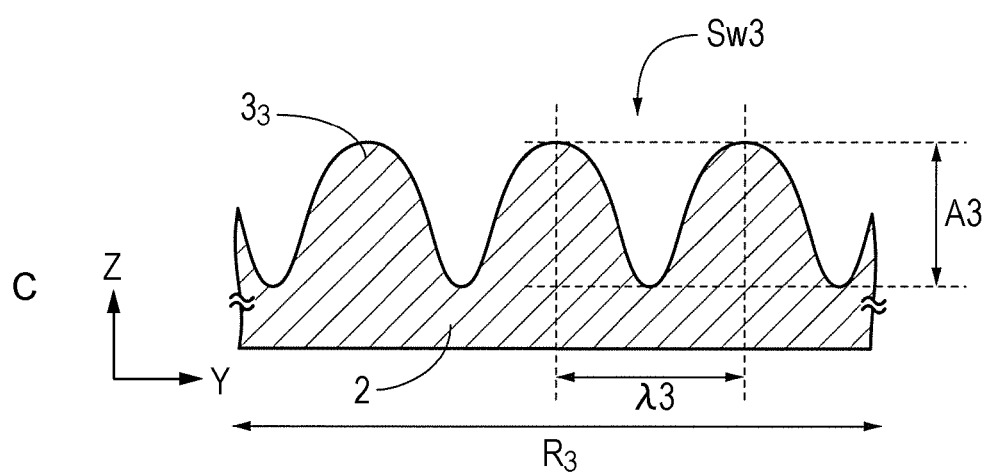
C

FIG. 3
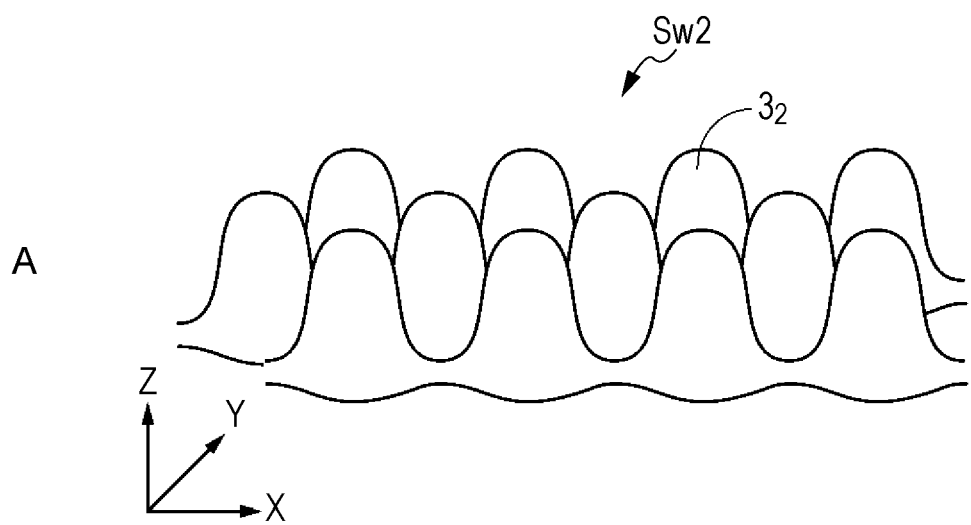
A
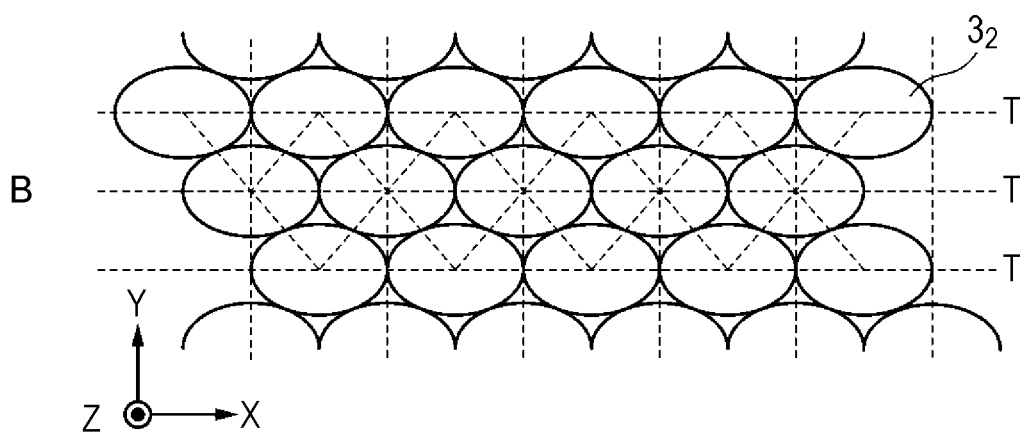
B

FIG. 4
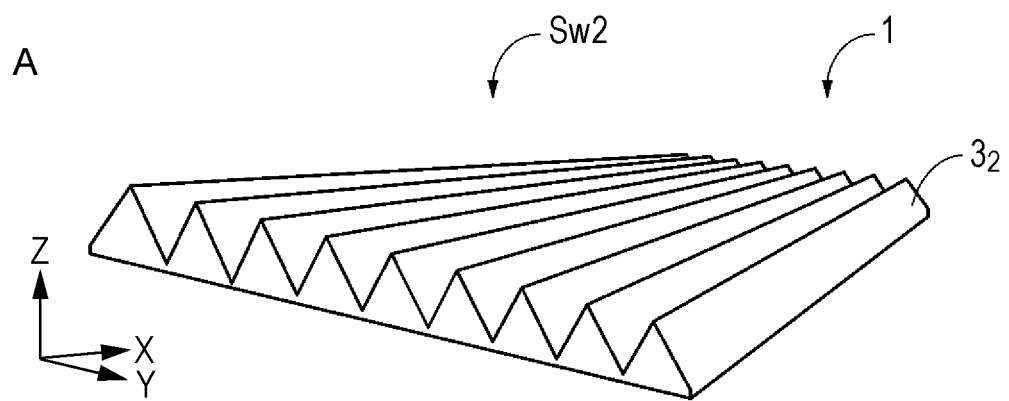
A
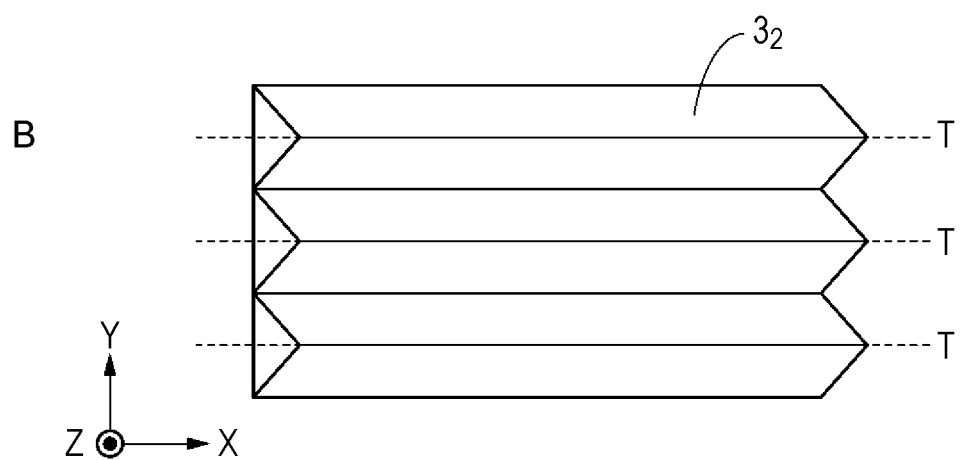
B

FIG. 5
A
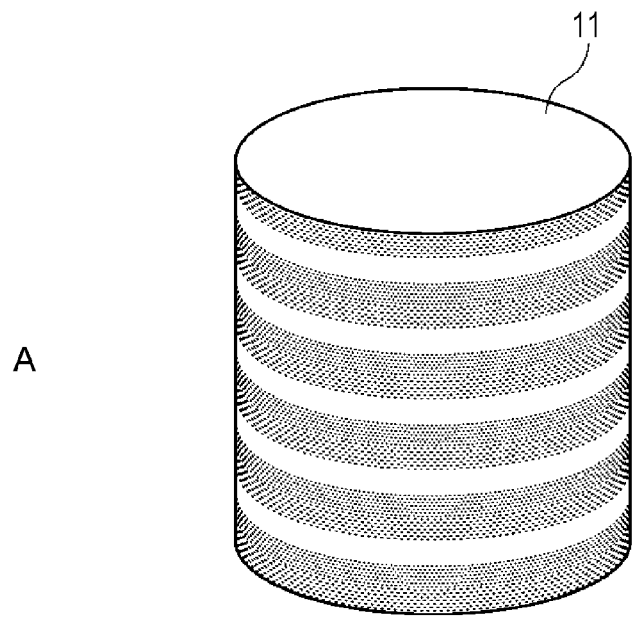
B
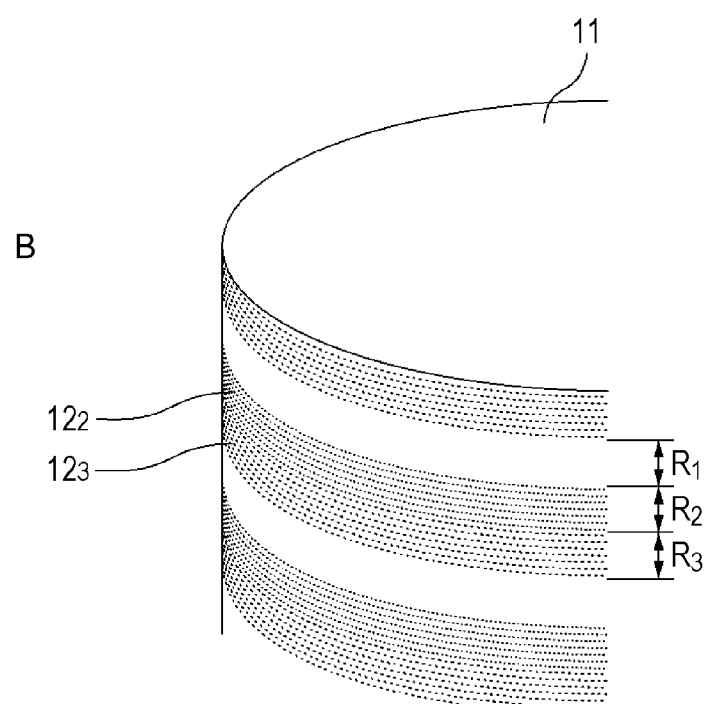

FIG. 6
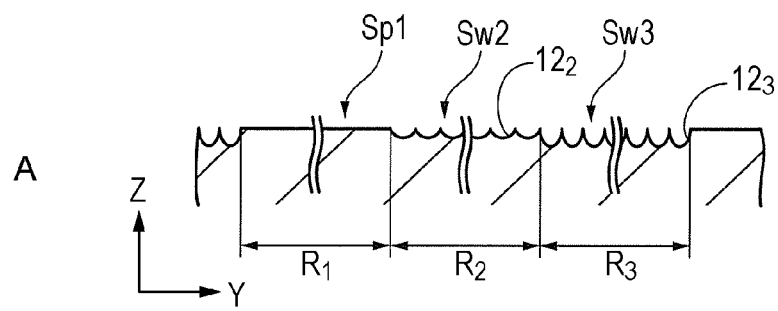
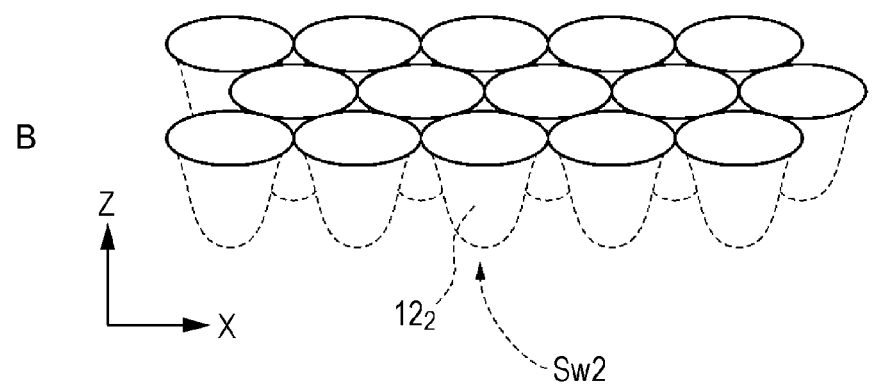
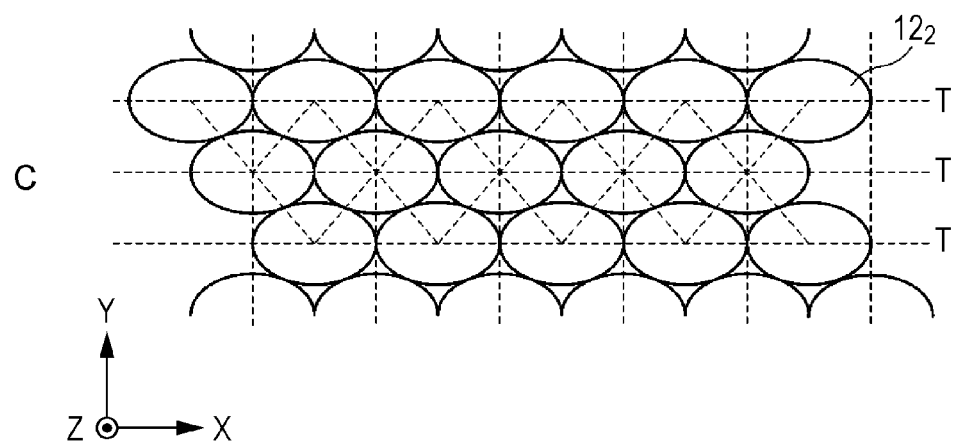

FIG. 9
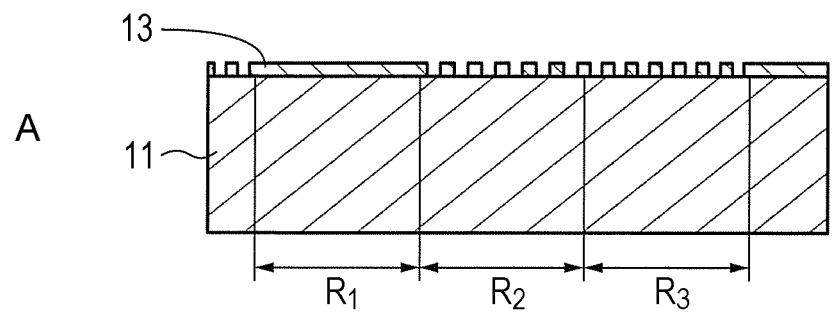
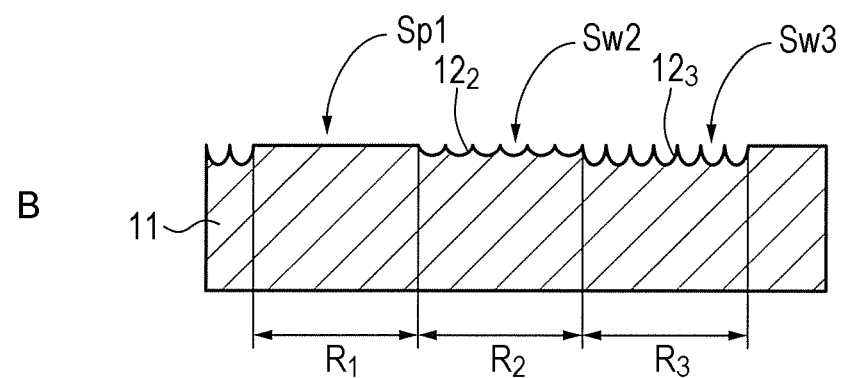
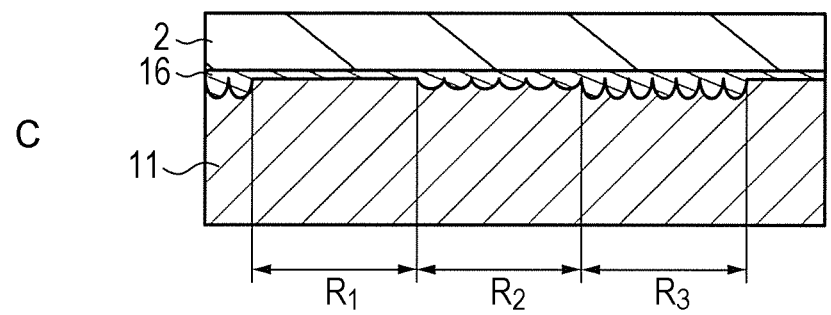

FIG. 13
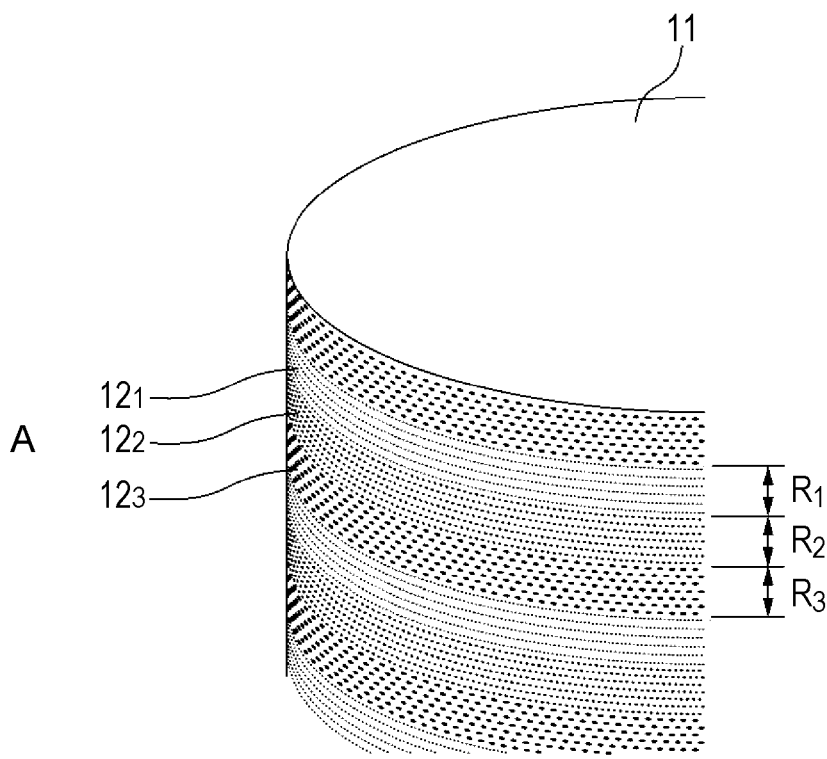
A
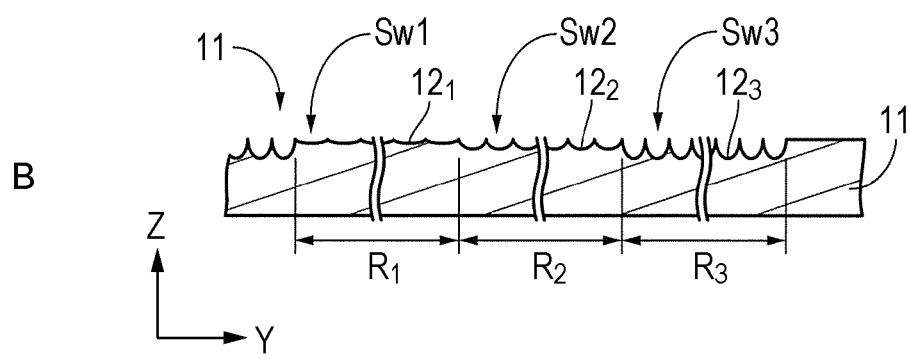
B

FIG. 16
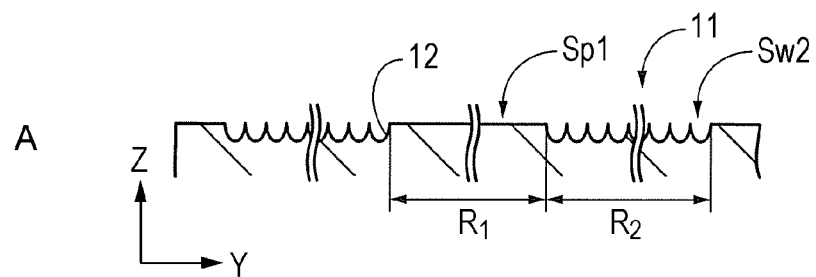
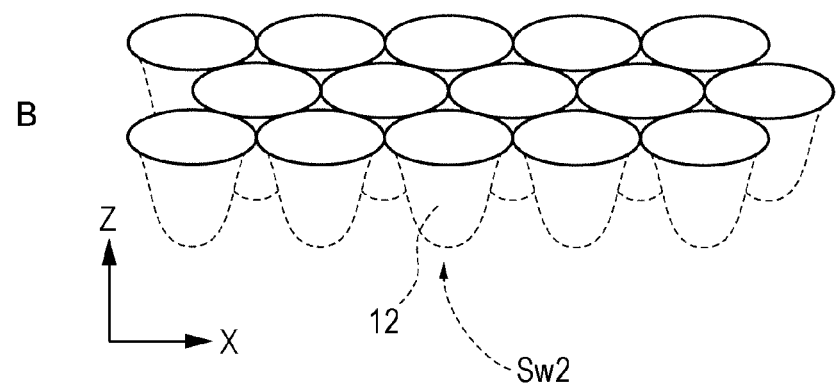
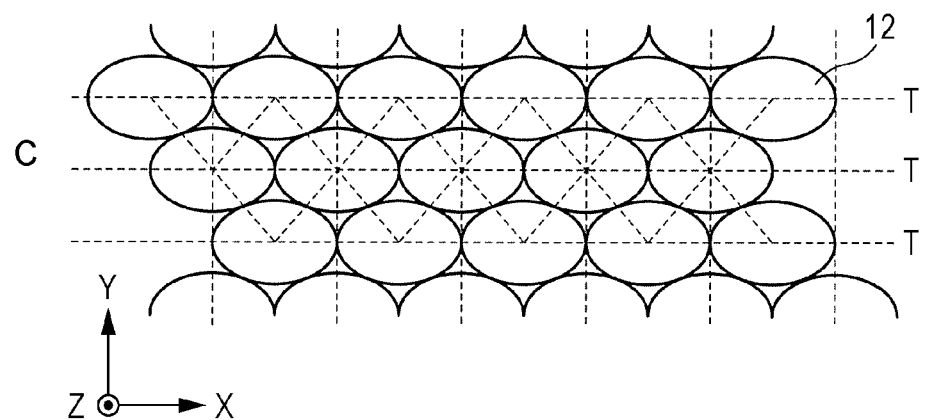

FIG. 18
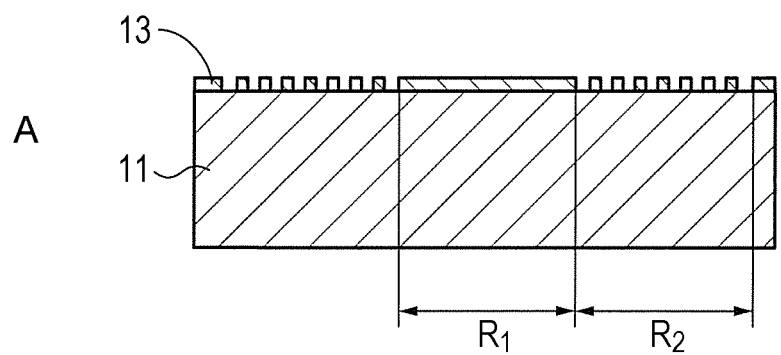
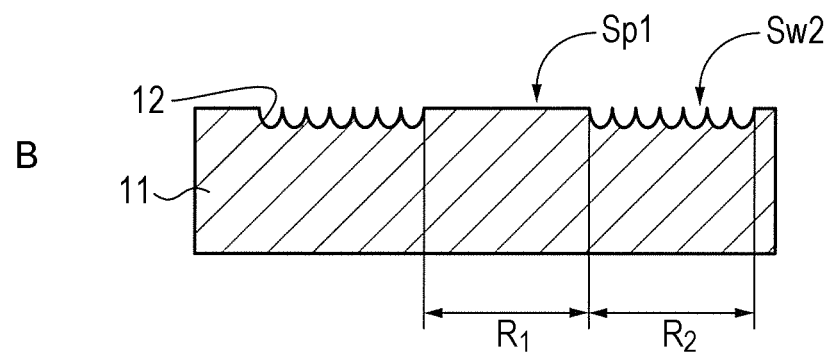
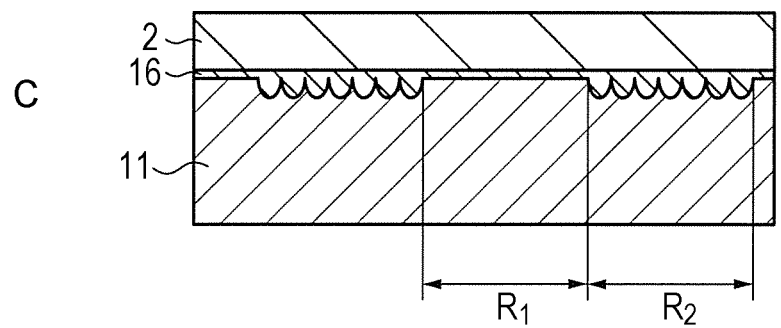

FIG. 19
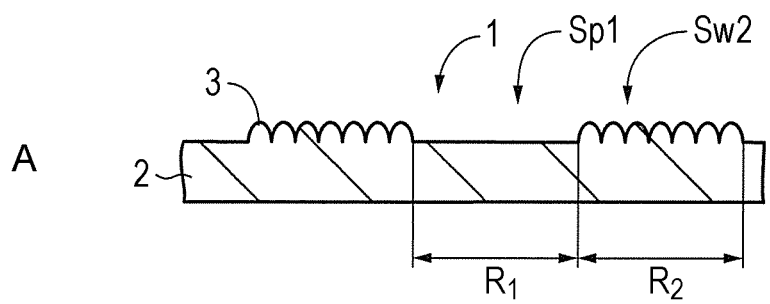
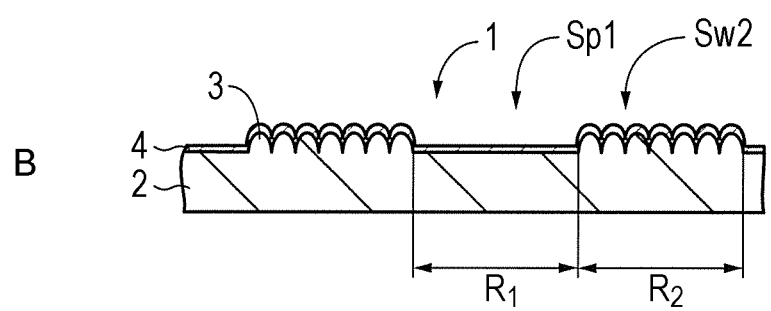
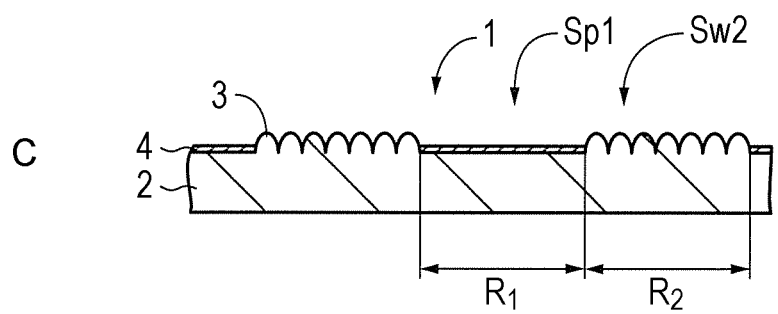

FIG. 21
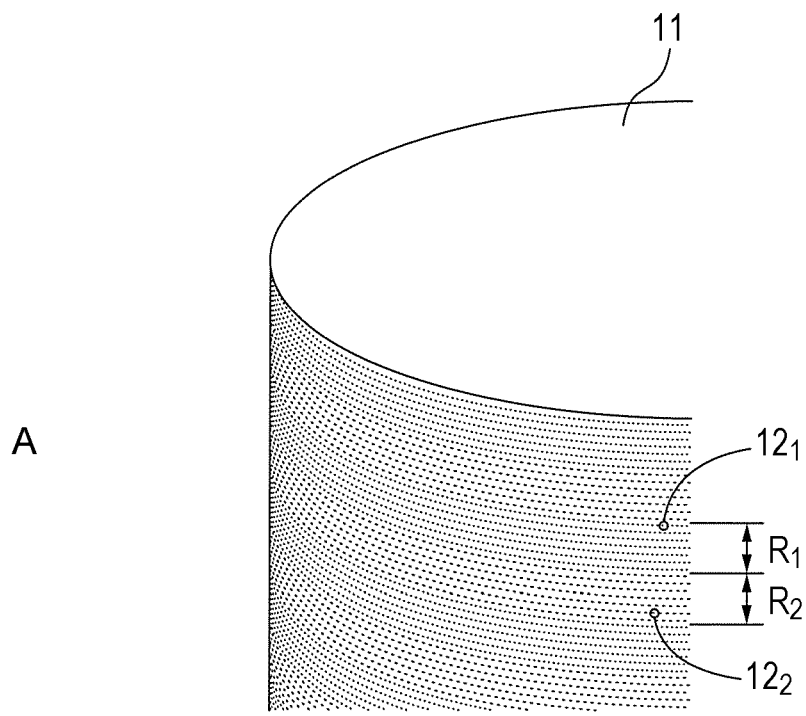
A
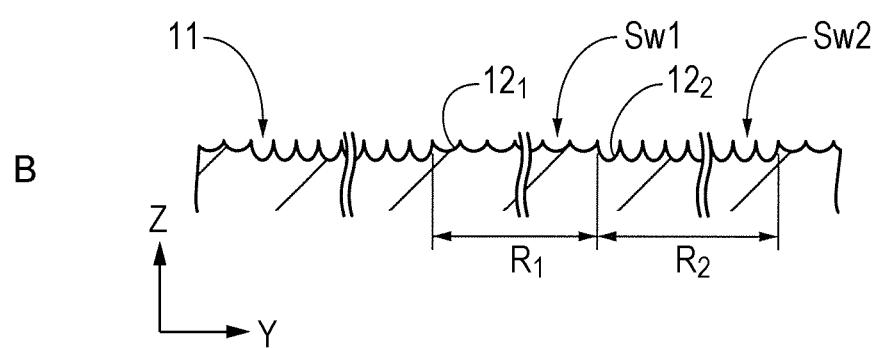
B

FIG. 22
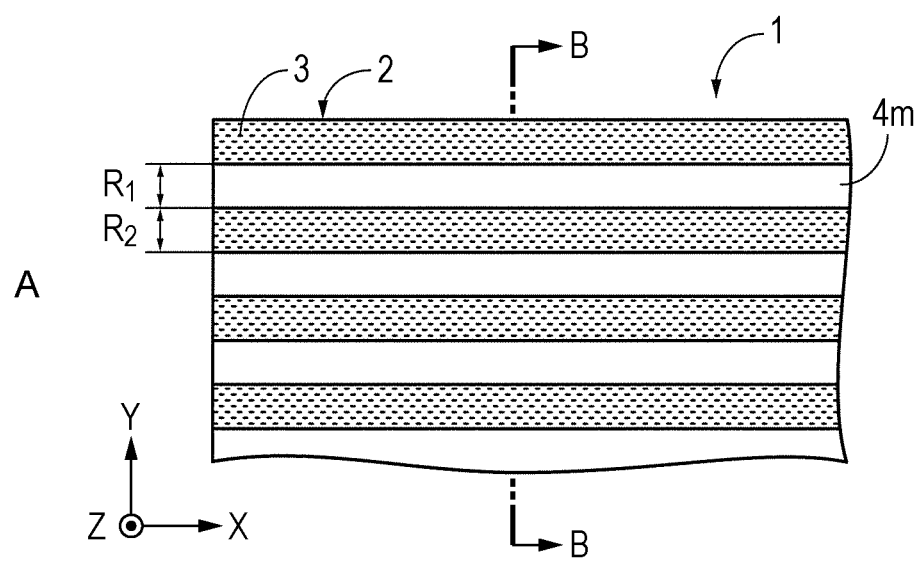
A
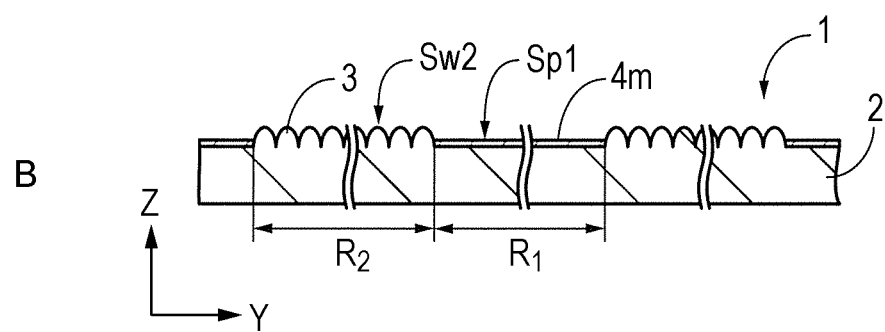
B
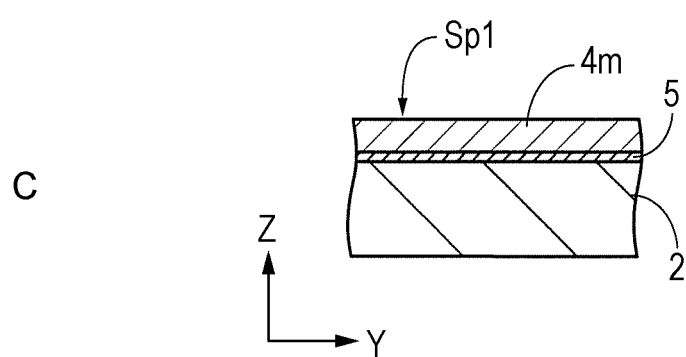
C

FIG. 23
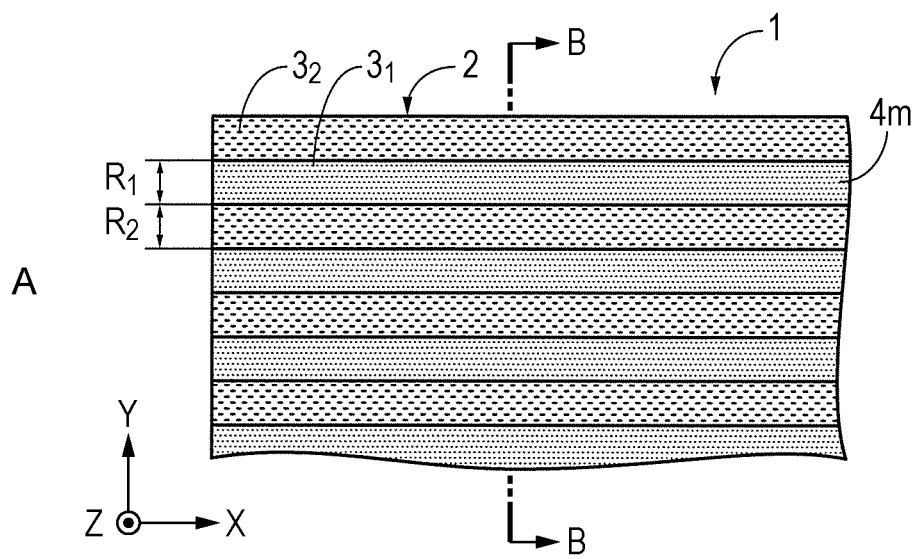
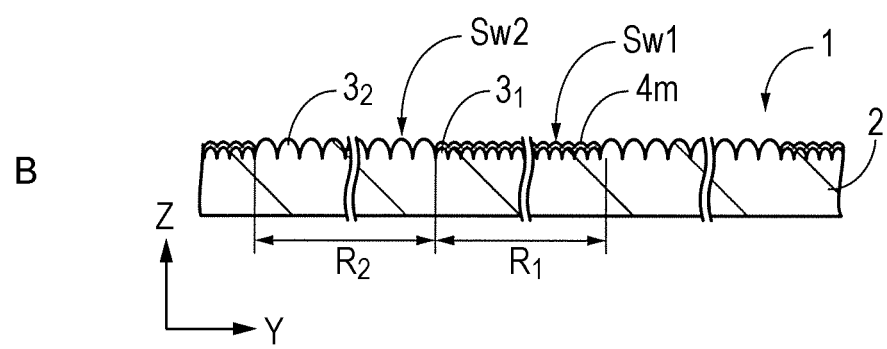
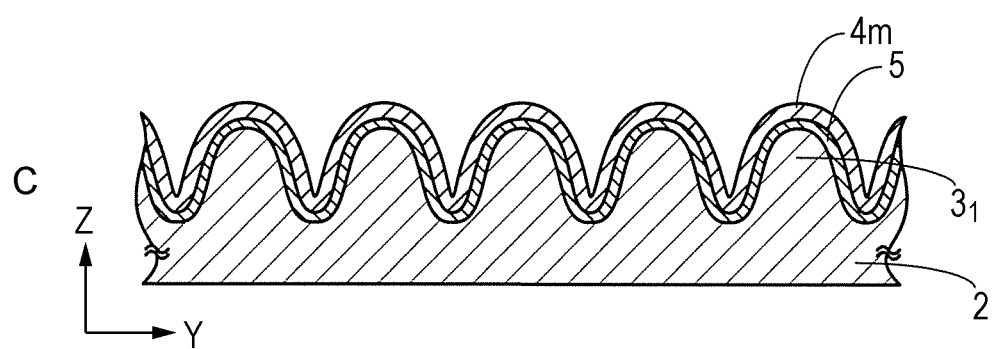

FIG. 30
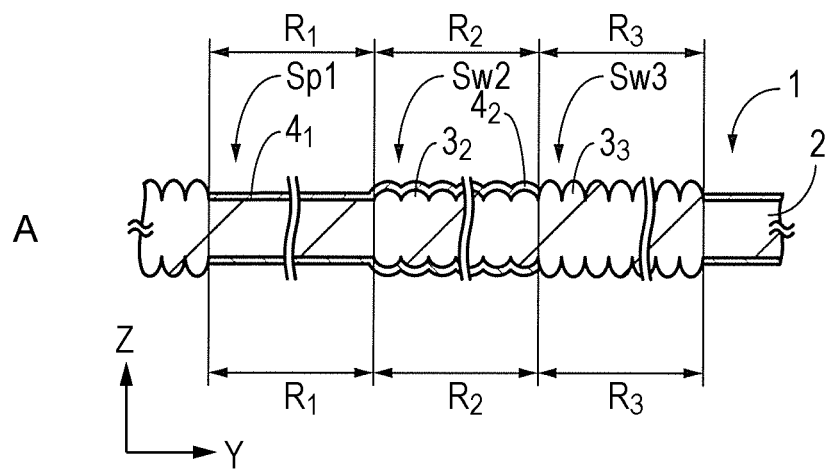
A
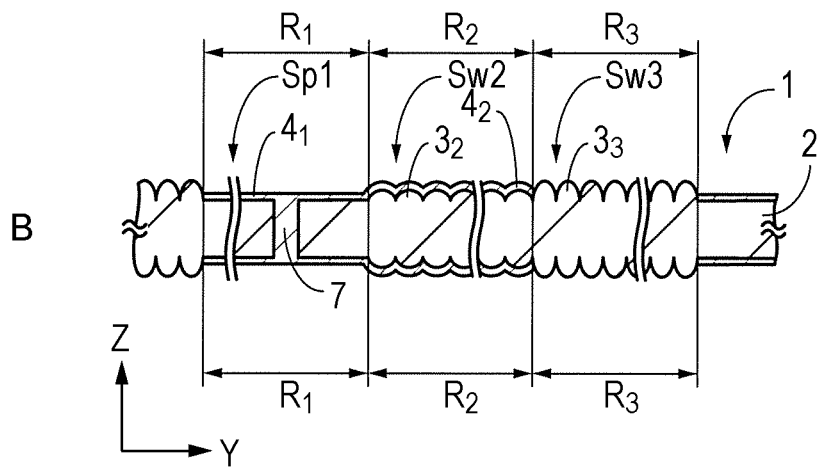
B

FIG. 32
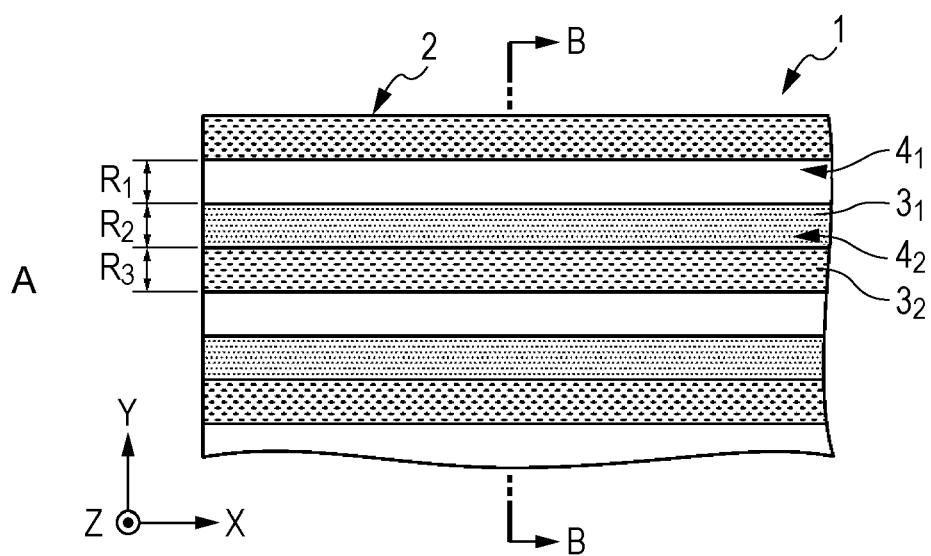
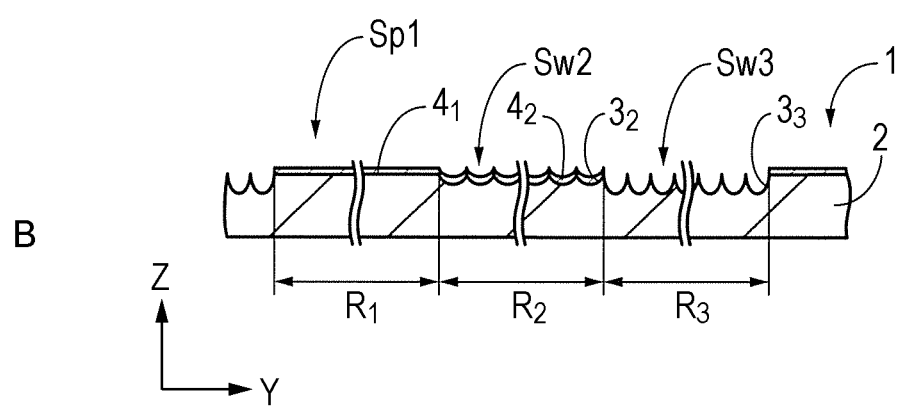

CONDUCTIVE ELEMENT AND METHOD OF MANUFACTURING THE SAME, WIRING ELEMENT, AND MASTER COPY

CROSS REFERENCES TO RELATED APPLICATIONS

The present application is a national stage of International Application No. PCT/JP2013/057324 filed on Mar. 8, 2013 and claims priority to Japanese Patent Application No. 2012-075247 filed on Mar. 28, 2012, the disclosure of which is incorporated herein by reference.

BACKGROUND

The present technology relates to a conductive element and a method of manufacturing the same, a wiring element, and a master copy. Specifically, the present technology relates to a conductive element having a conductive pattern portion formed on a substrate surface.

Hitherto, as a method of forming a conductive layer having a predetermined circuit pattern on an insulating substrate made of glass, plastic, or the like, a method of forming a circuit pattern using photolithography is widely used. In the method of forming a circuit pattern, a step and repeat method or a similar method is generally used. Specifically, in the forming method, the circuit pattern is formed through processes of "metal layer coating", "resist application", "exposing", "developing", "removing", and "resist peeling" performed in this order. Therefore, the method of forming a circuit pattern using photolithography has a low throughput.

Here, in order to realize the enhancement of the throughput, a method of forming a circuit pattern using screen printing is suggested. The method of forming a circuit pattern using screen printing is a method of forming a conductive layer having a predetermined circuit pattern by applying a metal paste or the like onto an insulating substrate using a squeegee via a mask and baking the result. The method of forming a circuit pattern using screen printing has excellent throughput and thus the application of the method to various types of devices is considered. For example, in Patent Document 1, a method of forming an electrode of a touch panel using screen printing is disclosed. In addition, in Patent Document 2, a method of forming an electrode of an image display apparatus using screen printing is disclosed.

However, screen printing has problems in that the mask is expensive, accurately positioning the mask is difficult, and the holes of the mask are easily clogged. Therefore, other than the screen printing, a method of forming a circuit pattern capable of realizing an excellent throughput is desirable.

CITATION LIST

Patent Document

Patent Document 1: Japanese Unexamined Patent Application Publication No. 2009-266025
Patent Document 2: Japanese Unexamined Patent Application Publication No. 2005-149807

SUMMARY

Technical Problem

Therefore, an object of the present technology is to provide a conductive element and a method of manufacturing the same, a wiring element, and a master copy capable of realizing an excellent throughput.

Technical Solution

In order to solve the above-described problems, a first technology is a conductive element including:
a substrate;
a shape layer which is provided on a surface of the substrate and has a first wavy surface, a second wavy surface, and a third wavy surface;
a first layer provided on the first wavy surface; and
a second layer provided on the second wavy surface,
wherein the shape layer contains an energy ray-curable resin composition,
the first layer has a laminated structure in which two or more layers are laminated,
the second layer has a single-layered structure or a laminated structure including a partial layer of the first layer,
the first and second layers form a conductive pattern portion, and
the first, second, and third wavy surfaces satisfy the following relationship:

$$0 \leq (Am1/\lambda m1) < (Am2/\lambda m2) < (Am3/\lambda m3) \leq 1.8$$

(where $Am1$ is an average width of vibrations of the first wavy surface, $Am2$ is an average width of vibrations of the second wavy surface, $Am3$ is an average width of vibrations of the third wavy surface, $\lambda m1$ is an average wavelength of the first wavy surface, $\lambda m2$ is an average wavelength of the second wavy surface, and $\lambda m3$ is an average wavelength of the third wavy surface.)

A second technology is a wiring element including:
a substrate;
a shape layer which is provided on a surface of the substrate and has a first wavy surface, a second wavy surface, and a third wavy surface;
a first layer provided on the first wavy surface; and
a second layer provided on the second wavy surface,
wherein the shape layer contains an energy ray-curable resin composition,
the first layer has a laminated structure in which two or more layers are laminated,
the second layer has a single-layered structure or a laminated structure including a partial layer of the first layer,
the first and second layers form a conductive pattern portion,
the first, second, and third wavy surfaces satisfy the following relationship:

$$0 \leq (Am1/\lambda m1) < (Am2/\lambda m2) < (Am3/\lambda m3) \leq 1.8$$

(where $Am1$ is an average width of vibrations of the first wavy surface, $Am2$ is an average width of vibrations of the second wavy surface, $Am3$ is an average width of vibrations of the third wavy surface, $\lambda m1$ is an average wavelength of the first wavy surface, $\lambda m2$ is an average wavelength of the second wavy surface, and $\lambda m3$ is an average wavelength of the third wavy surface.)

A third technology is a method of manufacturing a conductive element including:
applying an energy ray-curable resin composition to a surface of a substrate;
while a rotation surface of a rotation master copy is rotated and is brought into close contact with the energy ray-curable resin composition applied to the surface of the substrate, irradiating the energy ray-curable resin composition with energy rays emitted by an energy ray source provided in the rotation master copy via the rotation surface so as to be cured, thereby forming a shape layer having a first wavy surface, a second wavy surface, and a third wavy surface on the surface of the substrate;

forming a laminated film on the first, second, and third wavy surfaces; and removing the laminated film formed on the third wavy surface among the first, second, and third wavy surfaces, allowing the laminated film formed on the first wavy surface to remain as a first layer, and allowing a partial layer of the laminated film formed on the second wavy surface to remain as a second layer, thereby forming a conductive pattern portion, wherein the first, second, and third wavy surfaces satisfy the following relationship:

$$0 \le (Am1/\lambda m1) < (Am2/\lambda m2) < (Am3/\lambda m3) \le 1.8$$

(where Am1 is an average width of vibrations of the first wavy surface, Am2 is an average width of vibrations of the second wavy surface, Am3 is an average width of vibrations of the third wavy surface, $\lambda m1$ is an average wavelength of the first wavy surface, $\lambda m2$ is an average wavelength of the second wavy surface, and $\lambda m3$ is an average wavelength of the third wavy surface.)

In the present technology, the energy ray-curable resin composition is a composition containing an energy ray-curable resin composition as its main component. As blended components other than the energy ray-curable resin composition, for example, various materials such as a thermosetting resin, a silicone resin, organic fine particles, inorganic fine particles, a conductive polymer, metal powder, and a pigment may be used. However, the blended components are not limited thereto, and various materials may be used depending on the desired characteristics of the substrate, the conductive element, or the wiring element.

In addition, impenetrability to energy rays means impenetrability of a degree at which it is difficult to cure the energy ray-curable resin composition.

It is preferable that the unit region be a transfer region formed by making one revolution of a rotation surface of a rotation master copy. As the rotation master copy, a roll master copy or a belt master copy is preferably used. However, the rotation master copy is not limited thereto as long as it has a rotation surface provided with an uneven shape.

It is preferable that the arrangement of structures be a regular arrangement, an irregular arrangement, and a combination thereof. It is preferable that the arrangement of structures be a one-dimensional arrangement or a two-dimensional arrangement. It is preferable that, as the shape of the substrate, a film-like or a plate-like shape having two principal surfaces, a polyhedral shape having three or more principal surfaces, a curved surface shape having a curved surface such as a spherical surface or a free-form surface, or a polyhedral shape having a flat surface or a spherical surface be used. It is preferable that the shape layer be formed on at least one of a plurality of principal surfaces included in the substrate. It is preferable that the substrate have at least one flat surface or curved surface, and the shape layer be formed on the flat surface or the curved surface.

In a case where the uneven shape of the shape layer is connected without causing inconsistency between the unit regions, characteristic deterioration and shape disorder of the substrate, the conductive element, and the wiring element caused by inconsistency between the unit regions do not occur. Therefore, the conductive element or the wiring element having excellent characteristics and appearance can be obtained. In a case where the uneven shape is a pattern of a sub-wavelength structure or the like, excellent optical characteristics can be obtained even between the unit regions.

In the present technology, by using the difference in state between the laminated films formed on the first, second, and third wavy surfaces of the substrate, the laminated film formed on the third wavy surface among the first, second, and third wavy surfaces is removed, while the laminated film formed on the first wavy surface remains as the first layer and a partial layer of the laminated film formed on the second wavy surface remains as the second layer, thereby forming the conductive pattern portion.

Advantageous Effects

As described above, according to the present technology, a conductive element or a wiring element which is precise and has a high throughput can be realized.

Additional features and advantages are described herein, and will be apparent from the following Detailed Description and the figures.

BRIEF DESCRIPTION OF THE FIGURES

FIG. 1A is a plan view illustrating a configuration example of a conductive element according to a first embodiment of the present technology. FIG. 1B is a cross-sectional view taken along the line B-B illustrated in FIG. 1A. FIG. 1C is a cross-sectional view illustrating a modification example of the arrangement order of a first region, a second region, and a third region.

FIG. 2A is an enlarged cross-sectional view illustrating a part of the first region illustrated in FIG. 1B. FIG. 2B is an enlarged cross-sectional view illustrating a part of the second region illustrated in FIG. 1B. FIG. 2C is an enlarged cross-sectional view illustrating a part of the third region illustrated in FIG. 1B.

FIG. 3A is an enlarged perspective view illustrating the second region in which a plurality of structures are two-dimensionally arranged. FIG. 3B is an enlarged plan view illustrating the second region in which the plurality of structures are two-dimensionally arranged.

FIG. 4A is an enlarged perspective view illustrating the second region in which a plurality of structures are one-dimensionally arranged. FIG. 4B is an enlarged plan view illustrating the second region in which the plurality of structures are one-dimensionally arranged.

FIG. 5A is a perspective view illustrating a configuration example of a roll master copy for producing the substrate. FIG. 5B is an enlarged perspective view illustrating a part of the roll master copy illustrated in FIG. 5A.

FIG. 6A is an enlarged cross-sectional view illustrating a part of the roll master copy. FIG. 6B is an enlarged perspective view illustrating a part of a second region. FIG. 6C is an enlarged plan view illustrating the part of the second region.

FIGS. 9A to 9C are process diagrams illustrating the example of the method of manufacturing the conductive element according to the first embodiment of the present technology.

FIG. 13A is an enlarged perspective view illustrating a part of a roll master copy for producing a substrate. FIG. 13B is an enlarged cross-sectional view illustrating a part of the roll master copy illustrated in FIG. 13A.

FIG. 16A is an enlarged cross-sectional view illustrating a part of the roll master copy. FIG. 16B is an enlarged perspective view illustrating a part of a second region. FIG. 16C is an enlarged plan view illustrating a part of the second region.

FIGS. 18A to 18C are process diagrams illustrating the example of the method of manufacturing the conductive element according to the third embodiment of the present technology.

FIGS. 19A to 19C are process diagrams illustrating the example of the method of manufacturing the conductive element according to the third embodiment of the present technology.

FIG. 21A is an enlarged perspective view illustrating a part of a roll master copy for producing the substrate. FIG. 21B is an enlarged cross-sectional view illustrating a part of the roll master copy illustrated in FIG. 21A.

FIG. 22A is a plan view illustrating a configuration example of a conductive element according to a fifth embodiment of the present technology. FIG. 22B is a cross-sectional view illustrating the configuration example of the conductive element according to the fifth embodiment of the present technology. FIG. 22C is a cross-sectional view illustrating the layer configuration of a first region of the conductive element according to the fifth embodiment of the present technology.

FIG. 23A is a plan view illustrating a configuration example of a conductive element according to a sixth embodiment of the present technology. FIG. 23B is a cross-sectional view illustrating the configuration example of the conductive element according to the sixth embodiment of the present technology. FIG. 23C is a cross-sectional view illustrating the layer configuration of a first region of the conductive element according to the sixth embodiment of the present technology.

FIG. 30A is a cross-sectional view illustrating a configuration example of a conductive element according to a tenth embodiment of the present technology. FIG. 30B is a cross-sectional view illustrating a modification example of the conductive element according to the tenth embodiment of the present technology.

FIG. 32A is a plan view illustrating a configuration example of a conductive element according to a twelfth embodiment of the present technology. FIG. 32B is a cross-sectional illustrating a modification example of the conductive element according to the twelfth embodiment of the present technology.

DETAILED DESCRIPTION

Figure 7:
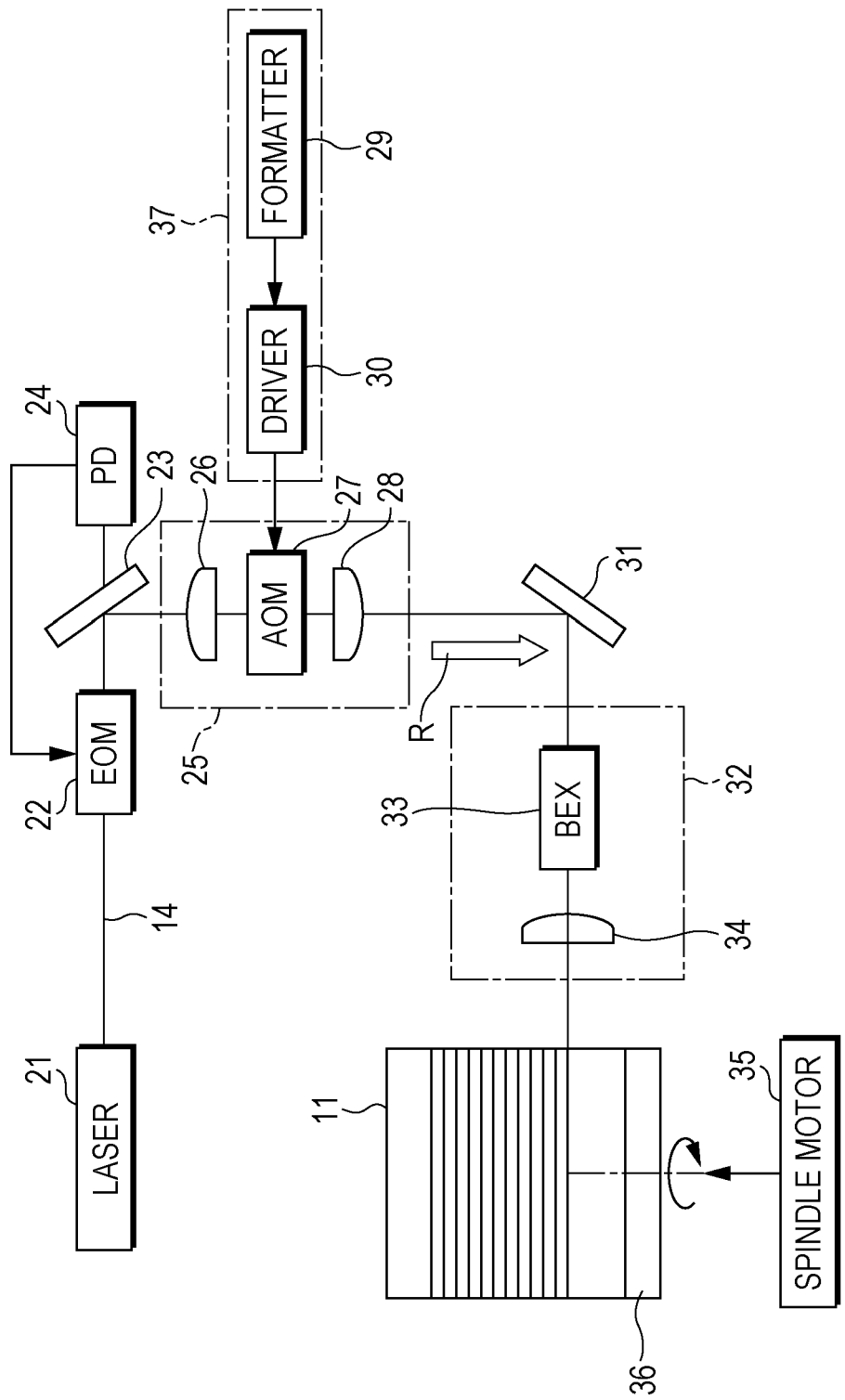
FIG. 7 is a schematic view illustrating a configuration example of a roll master copy exposure apparatus.
Figure 8:
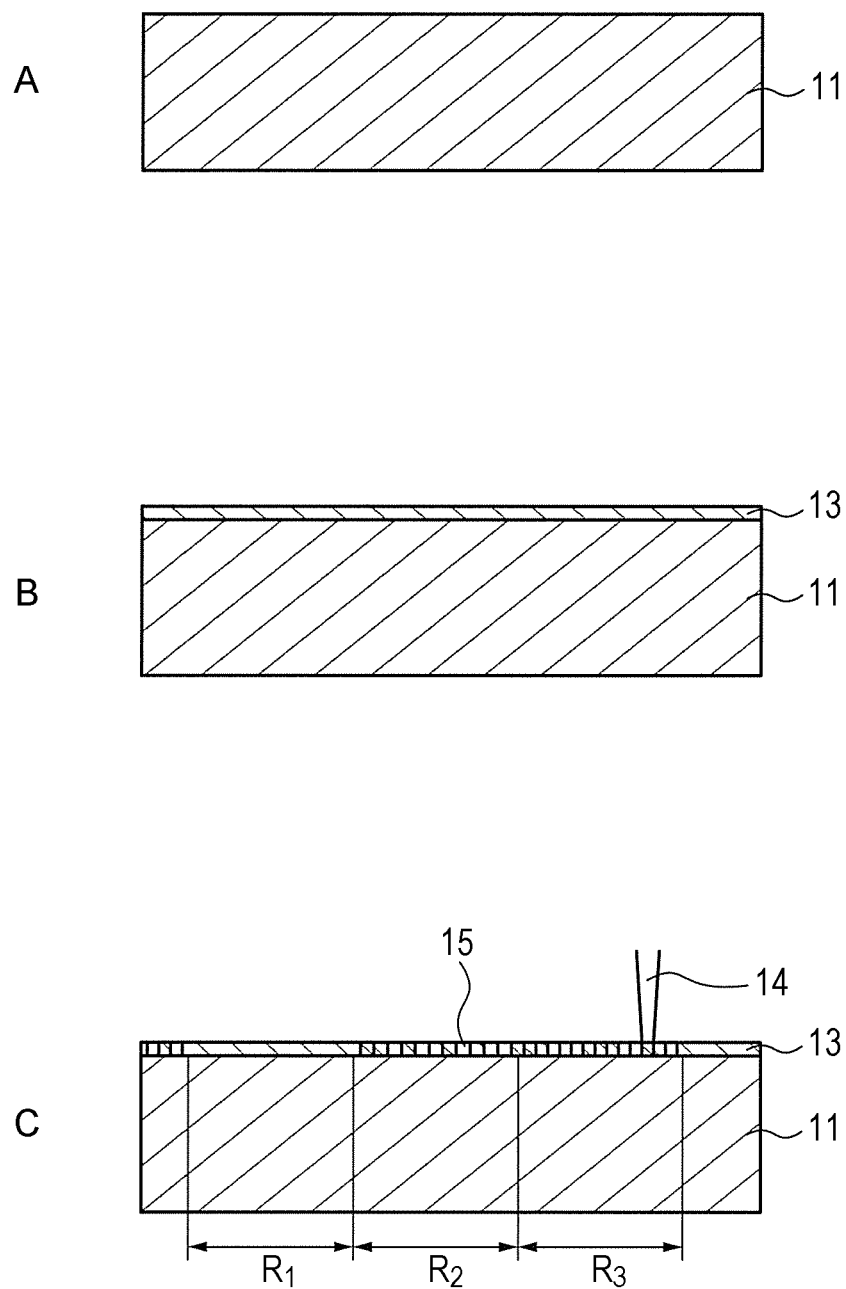
FIGS. 8A to 8C are process diagrams illustrating an example of a method of manufacturing the conductive element according to the first embodiment of the present technology.

The embodiments of the present technology will be described in the following order with reference to the drawings.

1. First Embodiment (an example of forming a conductive pattern portion on a substrate surface by using the difference between a flat surface and two types of wavy surfaces)
2. Second Embodiment (an example of forming a conductive pattern portion on a substrate surface by using the difference between three types of wavy surfaces)
3. Third Embodiment (an example of forming a conductive pattern portion on a substrate surface by using the presence or absence of a wavy surface)
4. Fourth Embodiment (an example of forming a conductive pattern portion on a substrate surface by using the difference between two types of wavy surfaces)
5. Fifth Embodiment (an example of forming a conductive pattern portion on a substrate surface by using the presence or absence of a wavy surface)
6. Sixth Embodiment (an example of forming a conductive pattern portion on a substrate surface by using the difference between two types of wavy surfaces)
7. Seventh Embodiment (an example of a conductive element using a substrate having impenetrability)
8. Eighth Embodiment (an example of a transfer apparatus which transports a substrate using a stage)
9. Ninth Embodiment (an example of a transfer apparatus provided with an annular belt master copy)
10. Tenth Embodiment (an example of forming a conductive pattern portion on both surfaces of a substrate)
11. Eleventh Embodiment (an example using a plurality of structures having impenetrability)
12. Twelfth Embodiment (an example of forming concave structures)

1. First Embodiment

Configuration of Conductive Element

FIG. 1A is a plan view illustrating a configuration example of a conductive element according to a first embodiment of the present technology. FIG. 1B is a cross-sectional view taken along the line B-B illustrated in FIG. 1A. FIG. 2A is an enlarged cross-sectional view illustrating a part of a first region illustrated in FIG. 1B. FIG. 2B is an enlarged cross-sectional view illustrating a part of a second region illustrated in FIG. 1B. FIG. 2C is an enlarged cross-sectional view illustrating a part of a third region illustrated in FIG. 1B. Hereinafter, two directions which are orthogonal to each other on a plane of the principal surface of a conductive element 1 are respectively referred to as an X-axis direction and a Y-axis direction, and a direction perpendicular to the principal surface is referred to as a Z-axis direction.

The conductive element 1 according to the first embodiment includes a substrate 2 including a first region $R_1$, a second region $R_2$, and a third region $R_3$, a first layer $4_1$ formed in the first region $R_1$, and a second layer $4_2$ formed in the second region $R_2$. The first layer $4_1$ is continuously formed in the first region $R_1$ to form a conductive pattern portion. The second layer $4_2$ is continuously formed in the second region $R_2$ to form a conductive pattern portion. The first and second layers $4_1$ and $4_2$ may form separate conductive pattern portions or the first and second layers $4_1$ and $4_2$ may form a single conductive pattern portion.

The conductive pattern portion is, for example, a wiring pattern portion or an electrode pattern portion. The first layer $4_1$ has a laminated structure in which two or more layers are laminated and preferably includes a layer at least having conductivity. The second layer $4_2$ has a single-layered structure or a laminated structure including a partial layer of the first layer $4_1$ and preferably includes a layer at least having conductivity. Here, the partial layer of the first layer $4_1$ means a layer formed by removing one or more layers from the uppermost layer of the first layer having the laminated structure or a layer in which one or more layers from the uppermost layer of the first layer having the laminated structure are discontinuously formed in island shapes or the like and the remaining layers are continuously formed.

The conductive element 1 is, for example, a printed-circuit board, an image display element, or an input element. Examples of the printed-circuit board include a rigid board, a flexible board, and a rigid flexible board. Examples of the image display element include a liquid crystal display element, an electroluminescence (EL) element (for example, an organic EL element or an inorganic EL element), and electronic paper. Examples of the input element include a capacitive touch panel and a resistive touch panel.

In FIG. 1B, the first region $R_1$, the second region $R_2$, and the third region $R_3$ are provided in this order. However, this order is an example, and the order of the regions may be a desired order depending on the design of circuits or elements and the like. For example, as illustrated in FIG. 1C, the third region $R_3$ may be provided between the first and second regions $R_1$ and $R_2$ so that the first and second layers $4_1$ and $4_2$ function as separate conductive pattern portions. That is, the first layer $4_1$ formed on the first region $R_1$ may function as a first conductive pattern portion and the second layer $4_2$ formed on the second region $R_2$ may function as a second conductive pattern portion.

(First Region and Second Region)

On the substrate surface of the first region $R_1$, for example, a flat surface Sp1 is formed, and on the flat surface Sp1, the first layer $4_1$ is continuously formed. On the substrate surface of the second region $R_2$, for example, a wavy surface Sw2 is formed, and on the wavy surface Sw2, the second layer $4_2$ is continuously formed. On the other hand, on the substrate surface of the third region $R_3$, for example, a wavy surface Sw3 is formed, and on the wavy surface Sw3, a layer such as the first layer $4_1$ or the second layer $4_2$ is not formed. Therefore, the third region $R_3$ functions as an insulating region for insulation between the two first layers $4_1$, between the two second layers $4_2$, or between the first and second layers $4_1$ and $4_2$. On the other hand, the first layer $4_1$ which is continuously formed on the first region $R_1$ has conductivity in an extension direction of the first region $R_1$ and functions as the conductive pattern portion. In addition, the second layer $4_2$ which is continuously formed on the second region $R_2$ also has conductivity in an extension direction of the second region $R_2$ and functions as the conductive pattern portion. On the surface of the substrate 2, for example, a shape layer having the flat surface Sp1 and the wavy surfaces Sw2 and Sw3 is provided. The shape layer includes a structure $3_2$ and a structure 3, which will be described later. The shape layer contains, for example, an energy ray-curable resin composition.

The flat surface Sp1 and the wavy surfaces Sw2 and Sw3 preferably satisfy the following relationship.

$$(Am1/\lambda m1)=0, 0<(Am2/\lambda m2)<(Am3/\lambda m3)\leq 1.8$$

(where Am1 is the average width of vibrations of the flat surface Sp1, Am2 is the average width of vibrations of the wavy surface Sw2, Am3 is the average width of vibrations of the wavy surface Sw3, $\lambda m1$ is the average wavelength of the flat surface Sp1, $\lambda m2$ is the average wavelength of the wavy surface Sw2, and $\lambda m3$ is the average wavelength of the wavy surface Sw3.)

In addition, since the flat surface Sp1 can be regarded as a wavy surface having an average width Am1 of vibrations of "0", as described above, the average width Am1 of vibrations, the average wavelength λm1, and the ratio (Am1/λm1) of the flat surface Sp1 can be defined.

When the ratio (Am3/λm3) is higher than 1.8, peeling failure occurs at the time of transferring the wavy surface Sw3 and the wavy surface Sw tends to be broken.

Here, the average wavelength λm2 and the average width Am2 of vibrations of the wavy surface Sw2 are obtained as follows. First, the cross-section of the conductive element 1 is cut to include a position where the width of vibration of the wavy surface Sw2 is maximized, and the cross-section is photographed by a transmission electron microscope (TEM). Next, the wavelength λ2 and the width A2 of vibration of the wavy surface Sw2 are obtained from the taken TEM photograph. This measurement is repeatedly performed on 10 points which are selected from the conductive element 1 at random, and the measured values are simply averaged (arithmetic average), thereby obtaining the average wavelength λm2 and the average width Am2 of vibrations of the wavy surface Sw2. Next, the ratio (Am2/λm2) of the wavy surface Sw2 is obtained by using the average wavelength λm2 and the average width Am2 of vibrations.

The average wavelength λm3 and the average width Am3 of vibrations of the wavy surface Sw3 and the ratio (Am3/λm3) thereof are obtained in the same manner as the average wavelength λm2 and the average width Am2 of vibrations of the wavy surface Sw2 and the ratio (Am2/λm2) thereof.

The wavy surfaces Sw2 and Sw3 are, for example, one-dimensional or two-dimensional wavy surfaces. Both the wavy surfaces Sw2 and Sw3 may be one-dimensional or two-dimensional wavy surfaces. However, the wavy surfaces Sw2 and Sw3 are not limited thereto, and one of the wavy surfaces Sw2 and Sw3 may be a one-dimensional wavy surface and the other thereof may be a two-dimensional wavy surface.

The shapes of the cross-sections of the wavy surfaces Sw2 and Sw3 which are cut in one direction to include the positions where the widths of vibrations of the wavy surfaces Sw2 and Sw3 are maximized are, for example, triangular waveform shapes, sine waveform shapes, waveform shapes in which a quadratic curve or a portion of a quadratic curve is repeated, or shapes which approximate the mentioned shapes. The quadratic curve may be a circle, an ellipse, a parabola, or the like.

The wavelength λ2 of the wavy surface Sw2 and the wavelength λ3 and of the wavy surface Sw3 are preferably equal to or shorter than 100 μm, and more preferably in a range of equal to or longer than 100 nm and equal to or shorter than 100 μm. When the wavelengths λ2 and λ3 are shorter than 100 nm, there is a tendency that the production of the wavy surfaces Sw2 and Sw3 may become difficult. On the other hand, when the wavelengths λ2 and λ3 are longer than 100 μm, there is a tendency that problems in height differences and coverage may occur during imprinting and film forming and thus defects may occur.

From the viewpoint of reducing light reflection on the surface of the conductive element, it is preferable that the wavelengths λ2 and λ3 be equal to or shorter than the wavelength band of light which is aimed at reducing reflection. The wavelength band of light which is aimed at reducing reflection is, for example, the wavelength band of ultraviolet light, the wavelength band of visible light, or the wavelength band of infrared light. Here, the wavelength band of ultraviolet light refers to a wavelength band of equal to or longer than 10 nm and equal to or shorter than 360 nm, the wavelength band of visible light refers to a wavelength band of equal to or longer than 360 nm and equal to or shorter than 830 nm, and the wavelength band of infrared light refers to a wavelength band of equal to or longer than 830 nm and equal to or shorter than 1 mm. Specifically, the wavelengths λ2 and λ3 are preferably equal to or longer than 100 nm and equal to or shorter than 350 nm, more preferably equal to or longer than 100 nm and equal to or shorter than 320 nm, and even more preferably equal to or longer than 110 nm and equal to or shorter than 280 nm. When the wavelengths λ2 and λ3 are shorter than 100 nm, there is a tendency that the production of the wavy surfaces Sw2 and Sw3 may become difficult. On the other hand, when the wavelengths λ2 and λ3 are longer than 350 nm, there is a tendency for visible light to be diffracted.

Both the wavy surfaces Sw2 and Sw3 may be wavy surfaces on the order of nanometers or on the order of micrometers. However, the wavy surfaces Sw2 and Sw3 are not limited thereto, and one of the wavy surfaces Sw2 and Sw3 may be a wavy surface having a wavelength on the order of nanometers and the other thereof may be a wavy surface having a wavelength on the order of micrometers.

It is preferable that a partial layer of the first layer $4_2$ or the second layer $4_2$ (hereinafter, referred to as a third layer) be completely absent in the third region $R_3$ as a residual layer. However, the third layer may be present as a residual layer as long as the third layer does not form a conductive pattern portion and the third region $R_3$ functions as an insulating region.

In the case where the third layer is present as a residual layer, the first layer $4_1$, the second layer $4_2$, and the third layer preferably satisfy the following relationship.

$S1 > S2 > S3$ (where S1 is the unit region of the first layer, S2 is the unit region of the second layer, and S3 is the unit region of the third layer.)

In a case where the relationship is satisfied, specifically, it is preferable that the first layer $4_1$ be continuously formed in the first region $R_1$, the second layer $4_2$ be continuously formed in the second region $R_2$, and the third layer be discontinuously formed in the third region $R_3$ in island shapes or the like.

In addition, in the case where the third layer is present as a residual layer, the first layer $4_1$, the second layer $4_2$, and the third layer preferably satisfy the following relationship.

$d1 > d2 > d3$ (where d1 is the average thickness of the first layer $4_1$, d2 is the average thickness of the second layer $4_2$, and d3 is the average thickness of the third layer.)

In a case where the relationship is satisfied, specifically, it is preferable that the average thickness of the third layer be less than those of the first and second layers $4_2$ and $4_2$ so as not to substantially exhibit conductivity and the third region $R_3$ function as the insulating region.

In addition, as described above, since the third layer does not function as the conductive pattern portion, illustration of the third layer is omitted in FIGS. 1B, 1C, and 2C. Further, in FIG. 1A, an example in which the first, second, and third regions $R_1$, $R_2$, and $R_3$ have straight line shapes is illustrated. However, the shapes of the first, second, and third regions $R_1$, $R_2$, and $R_3$ are not limited thereto and may be desired shapes depending on the design of circuits or elements and the like.

(Substrate)

The substrate 2 is, for example, a substrate having transparency or opacity. As the material of the substrate 2, for example, an organic material such as a plastic material or an inorganic material such as glass may be used.

As the glass, for example, soda-lime glass, lead glass, hard glass, quartz glass, or liquid crystal glass (refer to "Handbook of Chemistry" Fundamentals, PI-537, by The Chemical Society of Japan) is used. As the plastic material, from the viewpoint of optical properties such as transparency, refractive index, and dispersion, and other various properties such as impact resistance, heat resistance, and durability, a (meth) acrylic resin such as polymethyl methacrylate, alkyl(meth) acrylate other than methyl methacrylate, and a copolymer of a vinyl monomer such as styrene; a polycarbonate-based resin such as polycarbonate and diethylene glycol bis allyl carbonate (CR-39); a thermosetting (meth)acrylic resin such as a homopolymer or copolymer of (brominated) bisphenol A-type di(meth)acrylate and a polymer and copolymer of a urethane-modified monomer of (brominated) bisphenol A mono(meth)acrylate; polyester particularly polyethylene terephthalate, polyethylene naphthalate, and unsaturated polyester, an acrylonitrile-styrene copolymer, polyvinyl chloride, polyurethane, an epoxy resin, polyarylate, polyethersulfone, polyether ketone, a cycloolefin polymer (trade name: ARTON, ZEONOR), a cycloolefin copolymer, or the like is preferable. In addition, an aramid-based resin may also be used in consideration of heat resistance.

In a case where the plastic material is used as the substrate 2, in order to further improve the surface energy, coating properties, slidability, flatness, and the like of the plastic surface, an undercoat layer may be provided by performing a surface treatment. Examples of the undercoat layer include an organoalkoxymetal compound, polyester, an acrylic-modified polyester resin, and polyurethane. Otherwise, in order to obtain the same effect as the undercoat layer, corona discharge, UV irradiation, or the like may be performed on the surface of the substrate 2.

In a case where the substrate 2 is a plastic film, for example, the substrate 2 may be obtained by a method of extending the above-described resin or diluting the resin with a solvent and forming and drying the result in a film shape, or the like. The thickness of the substrate 2 is, for example, about 25 μm to 500 μm.

The shape of the substrate 2 may employ, for example, a film shape, a plate shape, or a block shape but is not particularly limited to the shapes. Here, it is defined that the film shape includes a sheet shape.

(Structure)

The wavy surface Sw2 is, for example, an uneven surface having a number of structures $3_2$ arranged on the second region $R_2$. The wavy surface Sw3 is, for example, an uneven surface having a number of structures $3_3$ on the third region $R_3$. The structures $3_2$ and $3_3$ have, for example, convex shapes with respect to the surface of the substrate 2. The structures $3_2$ and $3_3$ are, for example, molded separately from the substrate 2 or molded integrally with the substrate 2. In a case where the structures $3_2$ and $3_3$ are molded separately from the substrate 2, as needed, a base layer may be provided between the structures $3_2$ and $3_3$ and the substrate 2. The base layer is a layer molded integrally with the structures $3_2$ and $3_3$ on the bottom surface sides of the structures $3_2$ and $3_3$ and is formed by curing the same energy ray-curable resin composition as the structures $3_2$ and $3_3$. The thickness of the base layer is not particularly limited and may be appropriately selected as needed.

The aspect ratio between the structures $3_2$ and $3_3$ preferably satisfies the following relationship.

$$0<(Hm2/Pm2)<(Hm3/Pm3)\leq 1.8$$

(where Hm2 is the average height of the structures $3_2$. Hm3 is the average height of the structures $3_3$, Pm2 is the average arrangement pitch of the structures $3_2$, and Pm3 is the average arrangement pitch of the structures $3_3$.)

When the ratio (Hm3/Pm3) is higher than 1.8, peeling failure occurs at the time of transferring the structures $3_3$ and the structures $3_3$ tend to be broken.

Here, the average arrangement pitch Pm2 and the average height Hm2 of the structures $3_2$ are obtained as follows. First, the cross-section of the conductive element 1 is cut to include a position where the height of the structure $3_2$ is maximized, and the cross-section is photographed by a transmission electron microscope (TEM). Next, the arrangement pitch P2 and the height H2 of the structure $3_2$ are obtained from the taken TEM photograph. This measurement is repeatedly performed on 10 points which are selected from the conductive element 1 at random, and the measured values are simply averaged (arithmetic average), thereby obtaining the average arrangement pitch Pm2 and the average height Hm2 of the structures $3_2$. Next, the aspect ratio (Hm2/Pm2) of the structures $3_2$ is obtained by using the average arrangement pitch Pm2 and the average height Hm2.

In addition, the average arrangement pitch Pm3, the average height Hm3, and the aspect ratio (Hm3/Pm3) of the structures $3_3$ are also obtained in the same manner as the average arrangement pitch Pm2, the average height Hm2, and the aspect ratio (Hm2/Pm2) of the structures $3_2$ described above.

The arrangement of the structures $3_2$ and $3_3$ may use, for example, a one-dimensional arrangement or a two-dimensional arrangement. Both the structures $3_2$ and $3_3$ may have a one-dimensional arrangement or a two-dimensional arrangement. However, the structures $3_2$ and $3_3$ are not limited thereto, and one of the structures $3_2$ and $3_3$ may have a one-dimensional arrangement and the other thereof may have a two-dimensional arrangement.

The arrangement of the structures $3_2$ and $3_3$ may use, for example, a regular or irregular arrangement, and depending on the method of producing a master copy, an appropriate arrangement is preferably selected from the above arrangements. Both the structures $3_2$ and $3_3$ may have a regular or irregular arrangement. However, the structures $3_2$ and $3_3$ are not limited thereto, and one of the structures $3_2$ and $3_3$ may have a regular arrangement and the other thereof may have an irregular arrangement.

The arrangement pitch P2 of the structures $3_2$ and the arrangement pitch P3 of the structures $3_3$ are preferably equal to or less than 100 μm, and more preferably in a range of equal to or greater than 100 nm and equal to or less than 100 μm. When the arrangement pitch is less than 100 nm, there is a tendency that the production of the structures $3_2$ and $3_3$ may become difficult. The arrangement pitches P2 and P3 are greater than 100 μm, there is a tendency that problems in height differences and coverage may occur during imprinting and film forming and thus defects may occur.

From the viewpoint of reducing light reflection on the surface of the conductive element, it is preferable that the arrangement pitches P2 and P3 be equal to or less than the wavelength band of light which is aimed at reducing reflection. The wavelength band of light which is aimed at reducing reflection is, for example, the wavelength band of ultraviolet light, the wavelength band of visible light, or the wavelength band of infrared light. Here, the wavelength band of ultraviolet light refers to a wavelength band of equal to or longer than 10 nm and equal to or shorter than 360 nm, the wavelength band of visible light refers to a wavelength band of equal to or longer than 360 nm and equal to or shorter than 830 nm, and the wavelength band of infrared light refers to a wavelength band of equal to or longer than 830 nm and equal to or shorter than 1 mm. Specifically, the arrangement pitches P2 and P3 are preferably equal to or greater than 100 nm and equal to or less than 350 nm, more preferably equal to or greater than 100 nm and equal to or less than 320 nm, and even more preferably equal to or greater than 110 nm and equal to or less than 280 nm. When the arrangement pitches P2 and P3 are less than 100 nm, there is a tendency that the production of the structures $3_2$ and $3_3$ may become difficult. On the other hand, when the arrangement pitches P2 and P3 are greater than 350 nm, there is a tendency for visible light to be diffracted.

Both the structures $3_2$ and $3_3$ may be arranged at arrangement pitches on the order of nanometers or on the order of micrometers. However, the structures $3_2$ and $3_3$ are not limited thereto, and one of the structures $3_2$ and $3_3$ may be arranged at arrangement pitches on the order of nanometers and the other thereof may be arranged at arrangement pitches on the order of micrometers.

Hereinafter, the second region $R_2$ in which a plurality of structures $3_2$ are one-dimensionally arranged or two-dimensionally arranged will be described in detail with reference to FIGS. 3A to 4B. In addition, the third region $R_3$ in which a plurality of structures $3_3$ are one-dimensionally arranged or two-dimensionally arranged is the same as the second region $R_2$ except that the aspect ratio of the structures $3_3$ is different from that of the structures $3_2$, and thus detailed description of the third region $R_3$ will be omitted.

FIG. 3A is an enlarged perspective view illustrating the second region in which the plurality of structures are two-dimensionally arranged. FIG. 3B is an enlarged plan view illustrating the second region in which the plurality of structures are two-dimensionally arranged. The plurality of structures $3_2$ are, for example, two-dimensionally arranged on a plurality of rows of tracks T in the second region $R_2$, thereby forming a two-dimensional wavy surface Sw2. As the shape of the track T, a straight line shape, an arc shape, or the like may be used, and the tracks T having such shapes may also meander (wobble). The plurality of structures $3_2$ arranged on the plurality of rows of tracks T may have, for example, a predetermined regular arrangement pattern. Examples of the regular arrangement pattern include lattice patterns such as a tetragonal lattice or a hexagonal lattice, and the lattice patterns may also be twisted. The height of the structures $3_2$ may be regularly or irregularly changed with respect to the surface of the substrate 2. Otherwise, the structures $3_2$ may be randomly arranged.

It is preferable that the structure $3_2$ have an inclined surface which is inclined with respect to the surface of the substrate 2. Examples of a specific shape of the structure $3_2$ include a conical shape, a columnar shape, a needle shape, a hemispherical shape, a semi-ellipsoidal shape, and a polygonal shape. However, the specific shape is not limited thereto and may employ other shapes. Examples of the conical shape include a conical shape having a sharp apex portion, a conical shape having a flat apex portion, and a conical shape in which the apex portion has a convexly or concavely curved surface. However, the conical shape is not limited to these shapes. Otherwise, the conical surface of the conical shape may be concavely or convexly bent. In a case where a roll master copy is produced using a roll master copy exposure apparatus (see FIG. 7) which will be described later, it is preferable that, as the shape of the structure $3_2$, an elliptical cone shape in which the apex portion has a convexly curved surface or a truncated elliptical cone shape having a flat apex portion be employed and the major axis direction of the elliptical shape forming the bottom surface thereof be aligned with the extension direction of the track T.

FIG. 4A is an enlarged perspective view illustrating the second region in which the plurality of structures are one-dimensionally arranged. FIG. 4B is an enlarged plan view illustrating the second region in which the plurality of structures are one-dimensionally arranged. The plurality of structures $3_2$ are, for example, one-dimensionally arranged on a plurality of rows of tracks T in the second region $R_2$ to follow the tracks T, thereby forming a one-dimensional wavy surface Sw2. As the shape of the track T, a straight line shape, an arc shape, or the like may be used, and the tracks T having such shapes may also meander (wobble).

The structure $3_2$ is, for example, a columnar body that extends in one direction, and the cross-sectional shape thereof may employ, for example, a triangular shape, a triangular shape in which the apex portion has a curvature R, a polygonal shape, a semicircular shape, a semi-ellipsoidal shape, or a parabola shape but is not limited to these shapes. Examples of a specific shape of the structure $3_2$ include a lenticular shape and a prism shape. However, the specific shape is not limited to these shapes. The height of the structures $3_2$ may be changed as being directed in the track direction. Otherwise, the structures $3_2$ may be intermittent in the track direction.

(First Layer and Second Layer)

As illustrated in FIG. 2A, the first layer $4_2$ includes, for example, a conductive layer 4a formed on the first region $R_1$, a first functional layer 4b formed on the conductive layer 4a, and a second functional layer 4c formed on the first functional layer 4b. An adhesion layer may be provided between the layers included in the first layer $4_1$ as needed.

As illustrated in FIG. 2B, the second layer $4_2$ includes, for example, the conductive layer 4a. In a case where the second layer $4_2$ includes two or more layers, an adhesion layer may be provided between the layers included in the second layer $4_2$ as needed.

It is preferable that the second layer $4_2$ be formed in the second region $R_2$ to follow the surface shape of the wavy surface Sw2 so as not to impede the antireflection effect by the wavy surface Sw2 and thus the surface shapes of the wavy surface Sw2 and the second layer $4_2$ be similar to each other. This is because excellent antireflection characteristics and/or transmission characteristics can be maintained by suppressing a change in refractive index profile caused by the formation of the second layer $4_2$. In the case where the third layer is present as a residual layer in the third region $R_3$, it is preferable that the third layer be formed in the third region $R_3$ to follow the surface shape of the wavy surface Sw3 so as not to impede the antireflection effect by the wavy surface Sw3 and thus the surface shapes of the wavy surface Sw3 and the third layer be similar to each other.

As the conductive layer 4a, for example, a metal layer, a transparent conductive layer, a metal oxide layer, or a transition metal compound layer may be used. However, the conductive layer 4a is not limited to these layers. As the material of the first functional layer 4b, a material which is different at least from the conductive layer 4a and the second functional layer 4c is preferable, and a material having a different dissolving rate from those of the conductive layer 4a and the second functional layer 4c in a removing process is more preferable. As the material of the second functional layer 4c, a material which is different at least from the conductive layer 4a and the first functional layer 4b is preferable, and a material having a different dissolving rate from those of the conductive layer 4a and the first functional layer 4b in the removing process is more preferable.

As the transparent conductive layer, for example, an inorganic transparent conductive layer may be used. The inorganic transparent conductive layer preferably contains a transparent oxide semiconductor as its main component. As the transparent oxide semiconductor, for example, a binary compound such as $SnO_2$, $InO_2$, $ZnO$, or $CdO$, a ternary compound which contains at least one element from among Sn, In, Zn, and Cd which are constituent elements of the binary compound, or a multi-element (composite) oxide may be used. Examples of a specific example of the transparent oxide semiconductor include indium tin oxide (ITO), zinc oxide (ZnO), aluminum-doped zinc oxide (AZO($Al_2O_3$—ZnO)), SZO, fluorine-doped tin oxide (FTO)), stannic oxide ($SnO_2$), gallium-doped zinc oxide (GZO), and indium zinc oxide (IZO($In_2O_3$—ZnO)). Particularly, from the viewpoint of enhancing reliability, reducing resistivity, and the like, indium tin oxide (ITO) is preferable. A material included in the inorganic transparent conductive layer preferably has a mixed state of amorphous and polycrystalline structures from the viewpoint of enhancing conductivity. As the material of the metal layer, for example, at least one type selected from the group consisting of Ag, Al, Au, Pt, Pd, Ni, Cr, Nb, W, Mo, Ti, Cu, and Nd may be used.

The first functional layer $4b$ preferably has a different solubility to a solution at least from that of the conductive layer $4a$. As the material of the first functional layer $4b$, a different material from that of the conductive layer $4a$ is preferably used. Specifically, a metal is preferably used as the material of the first functional layer $4b$, and as the metal, for example, at least one type selected from the group consisting of Ag, Al, Au, Pt, Pd, Ni, Cr, Nb, W, Mo, Ti, Cu, and Nd may be used.

As the material of the first functional layer $4b$, for example, a dielectric material or a transparent conductive material may be used. Specifically, at least one type selected from the group consisting of an oxide, a nitride, a sulfide, a carbide, a fluoride, and a transition metal compound is preferably used, and for example, at least one type selected from the group consisting of an oxide and a transition metal compound may be used. Examples of the oxide include an oxide containing one or more types of elements selected from the group consisting of In, Zn, Sn, Al, Si, Ge, Ti, Ga, Ta, Nb, Hf, Zr, Cr, Bi, and Mg. Examples of the nitride include a nitride containing one or more types of elements selected from the group consisting of In, Sn, Ge, Cr, Si, Al, Nb, Mo, Ti, W, Ta, and Zn. Examples of the sulfide include a Zn sulfide. Examples of the carbide include a carbide containing one or more types of elements selected from the group consisting of In, Sn, Ge, Cr, Si, Al, Ti, Zr, Ta, and W. Examples of the fluoride include a fluoride containing one or more types of elements selected from the group consisting of Si, Al, Mg, Ca, and La. As the transition metal compound, for example, a compound containing one or more types selected from the group consisting of Al, AlTi, AlCu, Cu, Ag, AgPdCu, Mo, Sn, Ti, W, Au, Pt, Pd, Ni, Nb, and Cr may be used. Examples of the compound containing two or more types of the above-mentioned materials include ZnS—$SiO_2$, $SiO_2$—$Cr_2O_3$—$ZrO_2$, $In_2O_3$—$CeO_2$, $In_2O_3$—$Ga_2O_3$, $Sn_2O_3$—$Ta_2O_5$, and $TiO_2$—$SiO_2$.

The first functional layer $4b$ preferably includes at least one type of a layer having a mixed state of amorphous and polycrystalline structures and a layer having a polycrystalline state.

The second functional layer $4c$ is a layer for protecting the conductive layer $4a$ and the first functional layer $4b$. The second functional layer $4c$ preferably has a different solubility to a solution at least from those of the conductive layer $4a$ and the first functional layer $4b$. As the material of the second functional layer $4c$, a different material from those of the conductive layer $4a$ and the first functional layer $4b$, or a different material from that of the first functional layer $4b$ is preferably used. Specifically, a metal material is preferably used as the material of the second functional layer $4c$, and as the metal material, for example, at least one type selected from the group consisting of Ag, Al, Au, Pt, Pd, Ni, Cr, Nb, W, Mo, Ti, Cu, and Nd may be used.

As the material of the second functional layer $4c$, for example, a dielectric material or a transparent conductive material may be used. Specifically, at least one type selected from the group consisting of an oxide, a nitride, a sulfide, a carbide, a fluoride, and a transition metal compound is preferably used, and for example, at least one type selected from the group consisting of an oxide and a transition metal compound may be used. Examples of the oxide include an oxide containing one or more types of elements selected from the group consisting of In, Zn, Sn, Al, Si, Ge, Ti, Ga, Ta, Nb, Hf, Zr, Cr, Bi, and Mg. Examples of the nitride include a nitride containing one or more types of elements selected from the group consisting of In, Sn, Ge, Cr, Si, Al, Nb, Mo, Ti, W, Ta, and Zn. Examples of the sulfide include a Zn sulfide. Examples of the carbide include a carbide containing one or more types of elements selected from the group consisting of In, Sn, Ge, Cr, Si, Al, Ti, Zr, Ta, and W. Examples of the fluoride include a fluoride containing one or more types of elements selected from the group consisting of Si, Al, Mg, Ca, and La. As the transition metal compound, for example, a compound containing one or more types selected from the group consisting of Al, AlTi, AlCu, Cu, Ag, AgPdCu, Mo, Sn, Ti, W, Au, Pt, Pd, Ni, Nb, and Cr may be used. Examples of the compound containing two or more types of the above-mentioned materials include ZnS—$SiO_2$, $SiO_2$—$Cr_2O_3$—$ZrO_2$, $In_2O_3$—$CeO_2$, $In_2O_3$—$Ga_2O_3$, $Sn_2O_3$—$Ta_2O_5$, and $TiO_2$—$SiO_2$.

The second functional layer $4c$ preferably includes at least one type of a layer having a mixed state of amorphous and polycrystalline structures and a layer having a polycrystalline state, but is not limited thereto.

The adhesion layer is a layer for enhancing the adhesion between the layers. As the adhesion layer, for example, a metal layer, an oxide layer, a transition metal compound layer, or the like may be used. However, the adhesion layer is not limited thereto.

It is preferable that the surface resistance of a laminated film 4 in the first region $R_1$ be equal to or less than 5000Ω/□. When the surface resistance is higher than 5000Ω/□, the resistance excessively increases and thus the laminated film 4 tends not to be used as an electrode.

[Configuration of Roll Master Copy]

FIG. 5A is a perspective view illustrating a configuration example of a roll master copy for producing the substrate. FIG. 5B is an enlarged perspective view illustrating a part of the roll master copy illustrated in FIG. 5A. A roll master copy 11 is a master copy for producing a conductive element or a wiring element. More specifically, the roll master copy 11 is a master copy for molding the flat surface Sp1 and the wavy surfaces Sw2 and Sw3 on the above-described substrate surface. The roll master copy 11 has, for example, a columnar shape or a cylindrical shape, and the first, second, and third regions $R_1$, $R_2$, and $R_3$ are set on the columnar surface or the cylindrical surface. The material of the roll master copy 11 may use, for example, glass but is not particularly limited to this material. The shapes and the arrangement order of the first region $R_1$, the second region $R_2$, and the third region $R_3$ illustrated in FIGS. 5A and 5B are examples and are not limited thereto. The shapes and the arrangement order may be appropriately selected depending on a desired shape of the conductive pattern portion.

FIG. 6A is an enlarged cross-sectional view illustrating a part of the roll master copy. FIG. 6B is an enlarged perspective view illustrating a part of a second region. FIG. 6C is an enlarged plan view illustrating a part of the second region. In addition, a third region $R_3$ is the same as a second region $R_2$ except that the ratio (Am/λm) (Am is the average width of vibrations of a wavy surface and λm is the average wavelength of a wavy surface) of a wavy surface Sw3 of the third region $R_3$ is higher than that of a wavy surface Sw2 of the second region, and thus illustration thereof will be omitted.

A first region $R_1$, the second region $R_2$, and the third region $R_3$ of the roll master copy 11 respectively correspond to the first region $R_1$, the second region $R_2$, and the third region $R_3$ of the substrate 2. That is, a flat surface Sp1 formed on the first region $R_1$ of the roll master copy 11 is for forming the flat surface Sp1 on the first region $R_1$ of the substrate 2. The wavy surface Sw2 formed on the second region $R_2$ of the roll master copy 11 is for forming the wavy surface Sw2 on the second region $R_2$ of the substrate 2. The wavy surface Sw3 formed on the third region $R_3$ of the roll master copy 11 is for forming the wavy surface Sw3 on the third region $R_3$ of the substrate 2. Specifically, the wavy surfaces Sw2 and Sw3 of the roll master copy 11 respectively have inverted shapes of the uneven shapes of the wavy surfaces Sw2 and Sw3 of the substrate 2 described above. That is, a structure $12_2$ and a structure $12_3$ of the roll master copy 11 respectively have inverted shapes of the uneven shapes of the structure $3_2$ and the structure $3_3$ of the surface of the substrate 2 described above.

[Configuration of Exposure Apparatus]

FIG. 7 is a schematic view illustrating a configuration example of a roll master copy exposure apparatus. Hereinafter, the configuration of the roll master copy exposure apparatus will be described with reference to FIG. 7. The roll master copy exposure apparatus can be configured to basically have, for example, an optical disk recording apparatus.

A laser light source 21 is a light source for exposing a resist formed as a film on the surface of the roll master copy 11 as a recording medium and oscillating a recording laser light 14 having a wavelength of λ=266 nm, for example. The laser light 14 emitted from the laser light source 21 rectilinearly propagates as a parallel beam and enters an electro-optical modulator (EOM) 22. The laser light 14 transmitted by the electro-optical modulator 22 is reflected by a mirror 23 and is led to a modulation optical system 25.

The mirror 23 is configured by a polarizing beam splitter, and has a function of reflecting one polarization component and transmitting the other polarization component. The polarization component transmitted by the mirror 23 is sensed by a photodiode 24, and the electro-optical modulator 22 is controlled on the basis of the sensed light signal to perform phase modulation of the laser light 14.

In the modulation optical system 25, the laser light 14 is condensed on an acousto-optic modulator (AOM) 27 made of glass ($SiO_2$) or the like by a condenser lens 26. The laser light 14 is subjected to intensity modulation by the acousto-optic modulator 27 so as to diverge and is subsequently converted into a parallel beam by a lens 28. The laser light 14 emitted from the modulation optical system 25 is reflected by a mirror 31 and is led onto a moving optical table 32 horizontally and in parallel.

The moving optical table 32 includes a beam expander 33 and an objective lens 34. The laser light 14 led to the moving optical table 32 is shaped into a desired beam shape by the beam expander 33 and is subsequently caused to irradiate the resist layer on the roll master copy 11 via the objective lens 34. The roll master copy 11 is placed on a turntable 36 connected to a spindle motor 35. Then, while the roll master copy 11 is rotated, the laser light 14 is moved in the height direction of the roll master copy 11 and the laser light 14 is caused to intermittently irradiate the resist layer, thereby performing an exposure process of the resist layer. A formed latent image has a substantially elliptical shape having a major axis in the circumferential direction. The movement of the laser light 14 is performed by movement of the moving optical table 32 in the arrow R direction.

The exposure apparatus includes, for example, a control mechanism 37 for forming a latent image corresponding to a predetermined one-dimensional pattern or a two-dimensional pattern on the resist layer. The control mechanism 37 includes a formatter 29 and a driver 30. The formatter 29 includes a polarity reversing portion, and the polarity reversing portion controls an irradiation timing of the laser light 14 for the resist layer. The driver 30 receives an output from the polarity reversing portion and controls the acousto-optic modulator 27.

In the roll master copy exposure apparatus, a polarity reversal formatter signal and a rotation controller of a recording device are synchronized to generate a signal and intensity modulation is performed by the acousto-optic modulator 27 for each track so that the two-dimensional patterns are linked spatially. The predetermined two-dimensional pattern such as a tetragonal lattice or a hexagonal lattice pattern can be recorded by performing patterning at an appropriate number of revolutions with a constant angular velocity (CAV), an appropriate modulation frequency, and an appropriate transmission pitch.

[Method of Manufacturing Conductive Element]

Hereinafter, an example of a method of manufacturing the conductive element 1 according to the first embodiment of the present technology will be described with reference to FIGS. 8A to 10C. In addition, it is preferable that a part or the entirety of processes after a transfer process in this manufacturing method be performed by roll-to-roll processing in consideration of productivity.

(Resist Formation Process)

First, as illustrated in FIG. 8A, a roll master copy 11 having a columnar shape or a cylindrical shape is prepared. The roll master copy 11 is, for example, a glass master copy. Subsequently, as illustrated in FIG. 8B, a resist layer 13 is formed on the surface of the roll master copy 11. As the material of the resist layer 13, for example, any of an organic resist and an inorganic resist may be used. As the organic resist, for example, a novolac resist or a chemically amplified resist may be used. Furthermore, as the inorganic resist, for example, a metal compound may be used.

(Exposing Process)

Next, as illustrated in FIG. 8C, by using the above-described roll master copy exposure apparatus, the resist layer 13 is irradiated with the laser light (exposure beam) 14 while the roll master copy 11 is rotated. At this time, the laser light 14 is irradiated while the laser light 14 is moved in the height direction (a direction parallel to the center axis of the roll master copy 11 having the columnar shape or the cylindrical shape) of the roll master copy 11. Here, a latent image is formed on the second and third regions $R_2$ and $R_3$ to serve as exposure portions while a latent image is not formed on the first region $R_1$ to serve as non-exposure portions. A latent image 15 according to the path of the laser light 14 is formed, for example, at a pitch equal to or shorter than the wavelength of visible light.

For example, the latent image 15 is arranged to form a plurality of rows of tracks on the roll master copy surface and forms the predetermined one-dimensional pattern or two-dimensional pattern. The latent image 15 has, for example, an elongated rectangular shape that extends in the extension direction of the track or an elliptical shape in which the major axis direction is in the extension direction of the track.

(Developing Process)

Next, for example, a developing liquid is dropped onto the resist layer 13 while the roll master copy 11 is rotated such that the resist layer 13 is subjected to a developing treatment as illustrated in FIG. 9A. As illustrated, in a case where the resist layer 13 is formed from a positive type resist, the exposure portions exposed by the laser light 14 have an increased dissolution rate with respect to the developing liquid compared to that of the non-exposure portions. Therefore, a pattern corresponding to the latent image (the exposure portions) 15 is formed on the resist layer 13. Accordingly, a plurality of openings are formed on the resist layer 13 of the second and third regions $R_2$ and $R_3$ while openings are not formed on the resist layer 13 of the first region $R_1$ and the entirety of the first region $R_1$ is maintained in a state of being covered with the resist layer 13. That is, a mask having the opening pattern only in the second and third regions $R_2$ and $R_3$ is formed on the roll master copy surface. As the opening pattern, any of a one-dimensional pattern and a two-dimensional pattern may be used, and a combination thereof may also be used.

(Etching Process)

Next, the surface of the roll master copy 11 is subjected to a roll etching treatment using the pattern (resist pattern) of the resist layer 13 formed on the roll master copy 11 as a mask. Accordingly, as illustrated in FIG. 9B, the second and third regions $R_2$ and $R_3$ on the roll master copy surface are etched via the openings, thereby forming concave structures $12_2$ and $12_3$. The structures $12_2$ and $12_3$ have, for example, a columnar shape that extends in the extension direction of the track, or an elliptical cone shape or a truncated elliptical cone shape in which the major axis direction is in the extension direction of the track. On the other hand, since the entirety of the first region $R_1$ is covered with the resist layer 13, the first region $R_1$ in the roll master copy surface is not etched and the flat plate-like roll master copy surface is maintained. As the etching method, for example, dry etching may be performed. In this manner, the roll master copy 11 is obtained.

(Transfer Process)

Next, for example, as illustrated in FIG. 9C, the roll master copy 11 and the substrate 2 such as a film to which a transfer material 16 is applied are brought into close contact with each other, the transfer material 16 is irradiated with energy rays such as ultraviolet rays to be cured, and thereafter the substrate 2 integrated with the cured transfer material 16 is peeled off. Accordingly, as illustrated in FIG. 10A, the substrate 2 which has the first region $R_1$ having the flat surface Sp1 formed therein, the second region $R_2$ having the wavy surface Sw2 formed therein, and the third region $R_3$ having the wavy surface Sw3 formed therein is obtained.

As the transfer material 16, for example, an energy ray-curable resin composition may be used. The energy ray-curable resin composition is a resin composition which can be cured by being irradiated with energy rays. The energy rays represent energy rays such as electron rays, ultraviolet rays, infrared rays, laser beams, visible rays, ionizing radiation (X-rays, α-rays, β-rays, γ-rays, and the like), microwaves, or high-frequency waves, which trigger radical, cationic, and anionic polymerizations. The energy ray-curable resin composition may be mixed with another resin to be used as needed and may also be mixed with another curable resin such as a thermosetting resin to be used. The energy ray-curable resin composition may also be an organic-inorganic hybrid material. Otherwise, two or more types of energy ray-curable resin compositions may be mixed to be used. As the energy ray-curable resin composition, an ultraviolet ray-curable resin which is cured by ultraviolet rays is preferably used.

An ultraviolet ray-curable material is made of, for example, a monofunctional monomer, a difunctional monomer, a polyfunctional monomer, or the like, and specifically, includes a single type or a mixture of a plurality of types of the following materials.

Examples of the monofunctional monomer include carboxylic acids (acrylic acid), hydroxyl groups (2-hydroxyethyl acrylate, 2-hydroxypropyl acrylate, and 4-hydroxybutyl acrylate), alkyl groups, alicyclic groups (isobutyl acrylate, t-butyl acrylate, isooctyl acrylate, lauryl acrylate, stearyl acrylate, isobornyl acrylate, and cyclohexyl acrylate), and other functional monomers (2-methoxyethyl acrylate, methoxy ethylene glycol acrylate, 2-ethoxyethyl acrylate, tetrahydrofurfuryl acrylate, benzyl acrylate, ethyl carbitol acrylate, phenoxyethyl acrylate, N,N-dimethylaminoethyl acrylate, N,N-dimethylaminopropyl acrylamide, N,N-dimethylacrylamide, acryloyl morpholine, N-isopropylacrylamide, N,N-diethylacrylamide, N-vinylpyrrolidone, 2-(perfluorooctyl) ethyl acrylate, 3-perfluorohexyl-2-hydroxypropyl acrylate, 3-perfluorooctyl-2-hydroxypropyl acrylate, 2-(perfluorodecyl)ethyl acrylate, 2-(perfluoro-3-methylbutyl)ethyl acrylate, 2,4,6-tribromophenol acrylate, 2,4,6-tribromophenol methacrylate, 2-(2,4,6-tribromophenoxy)ethyl acrylate, and 2-ethylhexyl acrylate).

Examples of the difunctional monomer include tri(propylene glycol)diacrylate, trimethylolpropane diallyl ether, and urethane acrylate.

Examples of the polyfunctional monomer include trimethylolpropane triacrylate, dipentaerythritol penta and hexaacrylate, ditrimethylolpropane tetraacrylate.

Examples of an initiator include 2,2-dimethoxy-1,2-diphenylethane-1-one, 1-hydroxy-cyclohexyl phenyl ketone, and 2-hydroxyl-2-methyl-1-phenylpropane-1-one.

As a filler, for example, any of inorganic fine particles and organic fine particles may be used. Examples of the inorganic fine particles include metal oxide fine particles such as $SiO_2$, $TiO_2$, $ZrO_2$, $SnO_2$, and $Al_2O_3$.

Examples of a functional additive include a leveling agent, a surface adjusting agent, and an anti-foaming agent. Examples of the material of the substrate 2 include a methyl methacrylate (co)polymer, polycarbonate, a styrene (co) polymer, a methyl methacrylate-styrene copolymer, cellulose diacetate, cellulose triacetate, cellulose acetate butyrate, polyester, a polyamide resin, a polyimide resin, polyamide imide, polyether sulfone, polysulfone, polypropylene, polymethylpentene, a cyclic olefin polymer, a cyclic olefin copolymer, polyethylene, polystyrene, polyethylene terephthalate, polyethylene naphthalate, a fluororesin, a phenolic resin, a methacrylic resin, nylon, polyacetal, a phenolic resin, an epoxy resin, a melamine resin, polyvinyl chloride, polyvinyl acetal, polyether ketone, and polyurethane. Other materials may be appropriately selected according to the application, and for example, a glass material, a metal material, and a metal compound material, (for example, ceramic, a magnetic body, and a semiconductor) may also be used. Examples of the glass material include soda-lime glass, lead glass, hard glass, quartz glass, and liquid crystal glass.

A method of molding the substrate 2 is not particularly limited, and for example, injection molding, extrusion, or casting may be used. As needed, a surface treatment such as a corona treatment may be performed on the substrate surface.

(Laminated Film Forming Process)

Next, as illustrated in FIG. 10B, the laminated film 4 is formed by laminating two or more layers in the first, second, and third regions $R_1$, $R_2$, and $R_3$ of the substrate surface. Specifically, for example, a conductive layer, a first functional layer, and a second functional layer are laminated in the first, second, and third regions $R_1$, $R_2$, and $R_3$ of the substrate surface in this order, thereby forming the laminated film 4. As a method of forming the laminated film 4, for example, as well as a CVD method (Chemical Vapor Deposition: a technique of precipitating thin films from a gas phase using a chemical reaction) such as a thermal CVD, a plasma CVD, or an optical CVD, a PVD method (Physical Vapor Deposition: a technique of forming thin films by the condensation of a material that is physically vaporized in vacuum, onto a substrate) such as vacuum deposition, plasma-assisted vapor deposition, sputtering, or ion plating may be used. In addition, the laminated film 4 may be formed while heating the substrate 2.

(Annealing Process)

Next, as needed, an annealing treatment is performed on the laminated film 4. Accordingly, the laminated film 4 or a layer such as the inorganic transparent conductive layer included in the laminated film 4 has, for example, a mixed state of amorphous and polycrystalline structures.

(Laminated Film Removing Process)

Next, as illustrated in FIG. 10C, an etching treatment is performed on the substrate surface having the laminated film 4 formed therein. Accordingly, while the laminated film 4 is removed from the third region $R_3$, the laminated film 4 remains in the first region $R_1$ as the first layer $4_1$, and a partial layer of the laminated film 4 remains in the second region $R_2$ as the second layer $4_2$. Specifically, for example, while the conductive layer and the first and second functional layers are removed from the third region $R_3$, the conductive layer and the first and second functional layers remain in the first region $R_1$ as the first layer $4_1$, and the conductive layer remains in the second region $R_2$ as the second layer $4_2$. Therefore, while the first layer $4_1$ formed in the first region $R_1$ and the second layer $4_2$ formed in the second region $R_2$ function as the conductive pattern portions, the third region $R_3$ functions as an insulating region between the conductive pattern portions. As the removing process, dry etching or wet etching may be used, or a combination of the two may also be used. As the dry etching, plasma etching or reactive ion etching (RIE) may be used. As the wet etching, for example, one or more types of sulfuric acid, hydrochloride, nitric acid, and ferric chloride may be used. In addition, oxalic acid, a mixed acid of phosphoric acid, acetic acid, and nitric acid, or an aqueous solution of ceric ammonium nitrate may be used as an etchant.

Here, removal means (1) to completely remove the laminated film 4 from the third region $R_3$, (2) to form the laminated film 4 in a discontinuous state (for example, an island-shaped state) to a degree at which the third region $R_3$ does not exhibit conductivity, or (3) to thin the laminated film 4 to have a thickness at which the third region $R_3$ does not exhibit conductivity.

Specifically, it is preferable that, by using the difference in state and the like between the laminated films 4 formed on the flat surface Sp1 and the wavy surfaces Sw2 and Sw3, the laminated film 4 formed on the wavy surface Sw3 be substantially removed, while the laminated films 4 formed on the flat surface Sp1 and the wavy surface Sw2 remain to be continuously connected. Accordingly, the conductive pattern portions can be selectively formed on the flat surface Sp1 and the wavy surface Sw2 among the flat surface Sp1 and the wavy surfaces Sw2 and Sw3.

Otherwise, it is preferable that, by using the difference in state and the like between the laminated films 4 formed on the flat surface Sp1 and the wavy surfaces Sw2 and Sw3, the laminated film 4 formed on the wavy surface Sw3 be removed to be discontinuous in island shapes, while the laminated films 4 formed on the flat surface Sp1 and the wavy surface Sw2 remain to be continuously connected. Accordingly, the conductive pattern portions can be selectively formed on the flat surface Sp1 and the wavy surface Sw2 among the flat surface Sp1 and the wavy surfaces Sw2 and Sw3.

Otherwise, it is preferable that, by using the difference in state and the like between the laminated films 4 formed on the flat surface Sp1 and the wavy surfaces Sw2 and Sw3, the laminated film 4 formed on the wavy surface Sw3 be removed to have a thickness that is much smaller than the thicknesses of the laminated films 4 formed on the flat surface Sp1 and the wavy surface Sw2. Accordingly, the conductive pattern portions can be selectively formed on the flat surface Sp1 and the wavy surface Sw2 among the flat surface Sp1 and the wavy surfaces Sw2 and Sw3.

(Cleaning Process)

Next, as needed, the substrate surface subjected to the removing treatment is cleaned.

Accordingly, an intended conductive element 1 is obtained.

In the first embodiment, the laminated film 4 is formed by laminating two or more layers on the substrate surface having the flat surface Sp1 and the wavy surfaces Sw2 and Sw3. In addition, by using the difference in state and the like between the laminated films formed on the flat surface Sp1 and the wavy surfaces Sw2 and Sw3, the laminated film 4 formed on the wavy surface Sw3 among the wavy surfaces of the flat surface Sp1 and the wavy surfaces Sw2 and Sw3 is removed, while the laminated film 4 formed on the flat surface Sp1 remains as the first layer $4_1$ and a partial layer of the laminated film 4 formed on the wavy surface Sw2 remains as the second layer $4_2$, thereby forming the conductive pattern portions. Therefore, a conductive element which is precise and has a high throughput can be realized.

2. Second Embodiment

Configuration of Conductive Element

Figure 11:
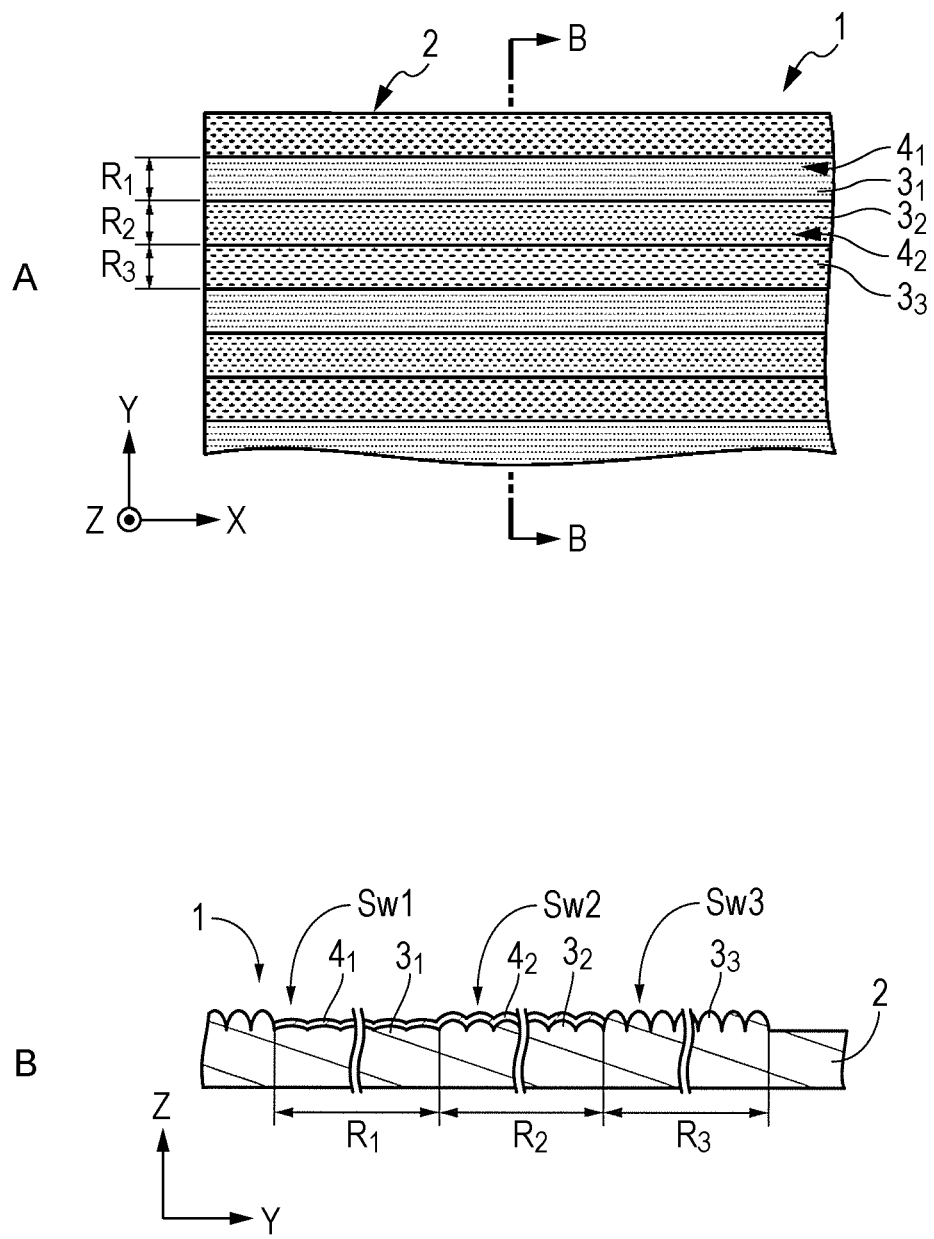
FIG. 11A is a plan view illustrating a configuration example of a conductive element according to a second embodiment of the present technology.
FIG. 11B is a cross-sectional view taken along the line B-B illustrated in FIG. 11A.
Figure 12:
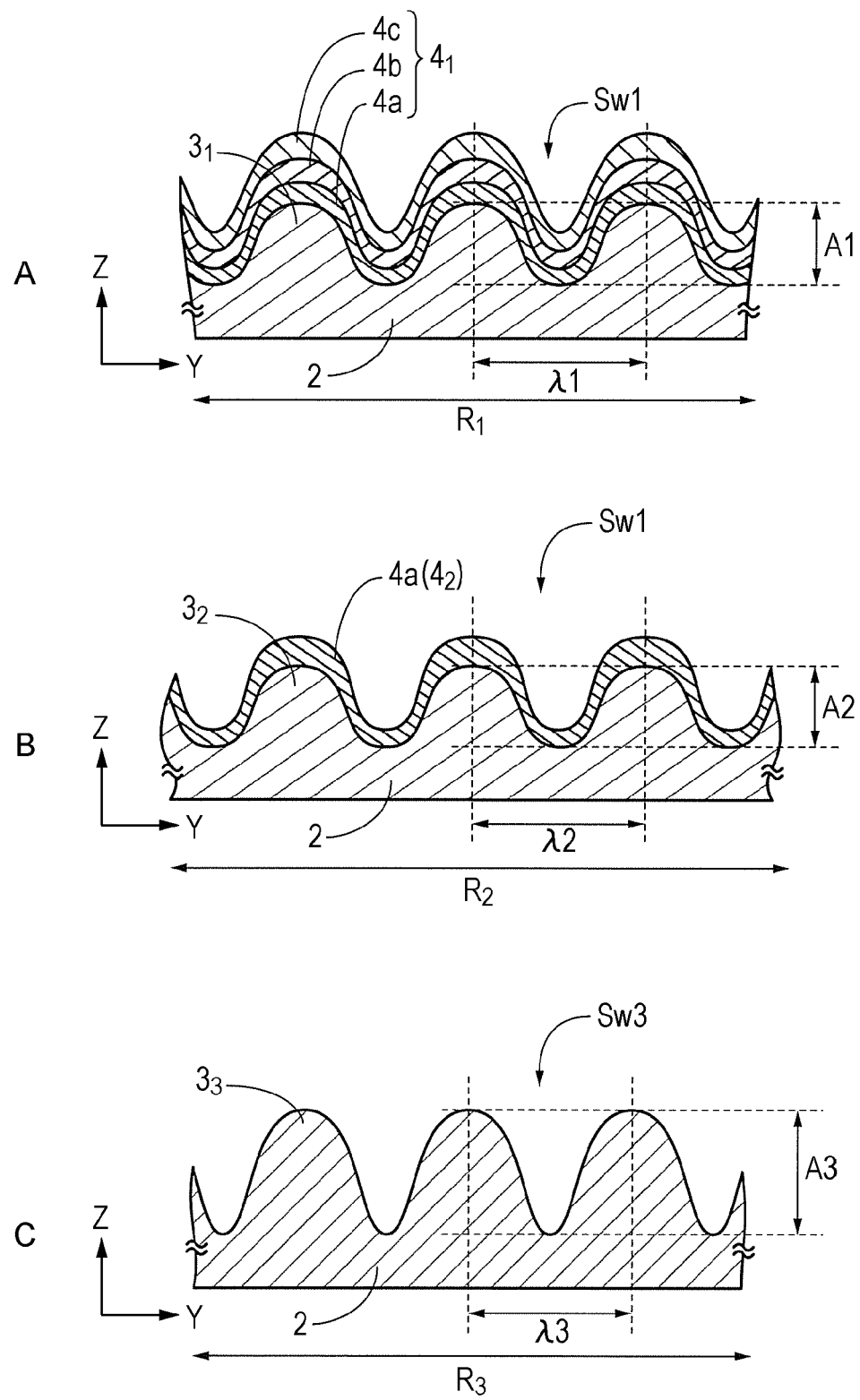
FIG. 12A is an enlarged cross-sectional view illustrating a part of a first region illustrated in FIG. 11B.
FIG. 12B is an enlarged cross-sectional view illustrating a part of a second region illustrated in FIG. 11B.
FIG. 12C is an enlarged cross-sectional view illustrating a part of a third region illustrated in FIG. 11B.

FIG. 11A is a plan view illustrating a configuration example of a conductive element according to a second embodiment of the present technology. FIG. 11B is a cross-sectional view taken along the line B-B illustrated in FIG. 11A. FIG. 12A is an enlarged cross-sectional view illustrating a part of a first region illustrated in FIG. 11B. FIG. 12B is an enlarged cross-sectional view illustrating a part of a second region illustrated in FIG. 11B. FIG. 12C is an enlarged cross-sectional view illustrating a part of a third region illustrated in FIG. 11B. A conductive element 1 according to the second embodiment is different from that of the first embodiment in that the first region has a wavy surface Sw1. On the surface of the substrate 2, for example, a shape layer having the wavy surface Sw1, a wavy surface Sw2, and a wavy surface Sw3 is provided. The shape layer includes a structure $3_1$, a structure $3_2$, and a structure 3, which will be described later.

(First Region)

On the substrate surface of a first region $R_1$, for example, the wavy surface Sw1 is formed, and on the wavy surface Sw1, a first layer $4_1$ is continuously formed. The wavy surface Sw1 is the same as the wavy surface Sw2 except that the ratio (Am/λm) (λm is the average wavelength of a wavy surface and Am is the average width of vibrations of a wavy surface) of the wavy surface Sw1 is less than that of the wavy surface Sw2. Specifically, the wavy surfaces Sw1, Sw2, and Sw3 preferably satisfy the following relationship.

$$0 < (Am1/\lambda m1) < (Am2/\lambda m2) < (Am3/\lambda m3) \leq 1.8$$

(where Am1 is the average width of vibrations of the wavy surface Sw1, Am2 is the average width of vibrations of the wavy surface Sw2, Am3 is the average width of vibrations of the wavy surface Sw3, λm1 is the average wavelength of the wavy surface Sw1, λm2 is the average wavelength of the wavy surface Sw2, and λm3 is the average wavelength of the wavy surface Sw3.)

When the ratio (Am3/λm3) is higher than 1.8, peeling failure occurs at the time of transferring the wavy surface Sw3 and the wavy surface Sw tends to be broken.

Here, the average wavelength λm1, the average width Am1 of vibrations, and the ratio (Am1/λm1) of the wavy surface Sw1 are measured in the same manner as those of the wavy surfaces Sw2 and Sw3 in the first embodiment.

The shapes of the cross-sections of the wavy surfaces Sw1, Sw2, and Sw3 which are cut in one direction to include the positions where the widths of vibrations of the wavy surfaces Sw1, Sw2, and Sw3 are maximized are, for example, triangular waveform shapes, sine waveform shapes, waveform shapes in which a quadratic curve or a portion of a quadratic curve is repeated, or shapes which approximate the mentioned shapes. The quadratic curve may be a circle, an ellipse, a parabola, or the like.

The wavelength λd of the wavy surface Sw1, the wavelength λ2 of the wavy surface Sw2, and the wavelength λ3 and of the wavy surface Sw3 are preferably equal to or shorter than 100 μm, and more preferably in a range of equal to or longer than 100 nm and equal to or shorter than 100 μm. When the wavelengths λ1, λ2, and λ3 are shorter than 100 nm, there is a tendency that the production of the wavelength λd and the wavy surfaces Sw2 and Sw3 may become difficult. On the other hand, when the wavelengths λ1, λ2, and λ3 are longer than 100 μm, there is a tendency that problems in height differences and coverage may occur during imprinting and film forming and thus defects may occur.

From the viewpoint of reducing light reflection on the surface of the conductive element, it is preferable that the wavelengths λ1, λ2, and λ3 be equal to or shorter than the wavelength band of light which is aimed at reducing reflection. The wavelength band of light which is aimed at reducing reflection is, for example, the wavelength band of ultraviolet light, the wavelength band of visible light, or the wavelength band of infrared light.

The shapes, wavelengths, and widths of vibrations of the wavy surfaces Sw1, Sw2, and Sw3 may be separately selected. Specifically, for example, the wavy surfaces Sw1, Sw2, and Sw3 may separately employ a one-dimensional or two-dimensional wavy surface. Moreover, the wavelengths, and widths of vibrations of the wavy surfaces Sw1, Sw2, and Sw3 may separately employ wavelengths, and widths of vibrations on the order of nanometers or on the order of micrometers.

(Structure)

The wavy surface Sw1 is, for example, an uneven surface having a number of structures $3_1$ arranged on the first region $R_1$. The structures $3_1$ is the same as the structures $3_2$ except that the ratio (Hm/Pm) (Hm is the average arrangement pitch of a structure and Pm is the average height of a structure) of the structure $3_1$ is less than that of the structure $3_2$. Specifically, the structures $3_1$, $3_2$ and $3_3$ preferably satisfy the following relationship.

$$0 < (Hm1/Pm1) < (Hm2/Pm2) < (Hm3/Pm3) \le 1.8$$

(where Hm1 is the average height of the structures $3_1$, Hm2 is the average height of the structures $3_2$, Hm3 is the average height of the structures $3_3$, Pm1 is the average arrangement pitch of the structures $3_1$, Pm2 is the average arrangement pitch of the structures $3_2$, and Pm3 is the average arrangement pitch of the structures $3_3$.)

When the ratio (Hm3/Pm3) is higher than 1.8, peeling failure occurs at the time of transferring the structures $3_3$ and the structures $3_3$ tend to be broken.

Here, the average arrangement pitch Pm1, the average height Hm1, and the ratio (Hm1/Pm1) of the structures $3_1$ are measured in the same manner as those of the structures $3_2$ and $3_3$ in the first embodiment.

(First Layer)

It is preferable that the first layer $4_1$ be formed in the first region $R_1$ to follow the surface shape of the wavy surface Sw1 so as not to impede the antireflection effect by the structures $3_1$ and thus the surface shapes of the wavy surface Sw1 and the first layer $4_1$ be similar to each other. This is because excellent antireflection characteristics and/or transmission characteristics can be maintained by suppressing a change in refractive index profile caused by the formation of the first layer $4_1$.

[Configuration of Roll Master Copy]

FIG. 13A is an enlarged perspective view illustrating a part of a roll master copy for producing the substrate 2. FIG. 13B is an enlarged cross-sectional view illustrating a part of the roll master copy illustrated in FIG. 13A. A roll master copy 11 according to the second embodiment is different from that of the first embodiment in that the wavy surface Sw1 is included in the first region $R_1$.

The wavy surface Sw1 of the roll master copy 11 is formed by, for example, arranging concave structures $12_1$ at a pitch equal to or less than the wavelength of visible light. The wavy surface Sw1 of the roll master copy 11 has an inverted shape of the uneven shape of the wavy surface Sw1 of the substrate 2.

[Method of Manufacturing Conductive Element]

A method of manufacturing the conductive element according to the second embodiment is different from that of the first embodiment in that conductive pattern portions are formed by changing the removing rates of the laminated films 4 formed in the first, second, and third regions $R_1$, $R_2$, and $R_3$ using the differences between the wavy surfaces Sw1, Sw2, and Sw3 (for example, the difference in the ratio (Am/λm)).

In a laminated film removing process in the second embodiment, the laminated film 4 is removed from the third region $R_3$ by performing a removing treatment on the substrate surface having the laminated film 4 formed thereon while the laminated films 4 remain in the first and second regions $R_1$ and $R_2$. Accordingly, the conductive pattern portions can be selectively formed on the wavy surfaces Sw1 and Sw2 among the wavy surfaces Sw1, Sw2, and Sw3.

Specifically, it is preferable that, by using the difference in state and the like between the laminated films 4 formed on the wavy surfaces Sw1, Sw2, and Sw3, the laminated film 4 formed on the wavy surface Sw3 be substantially removed, while the laminated films 4 formed on the wavy surfaces Sw1 and Sw2 remain to be continuously connected. Accordingly, the conductive pattern portions can be selectively formed on the wavy surfaces Sw1 and Sw2 among the wavy surfaces Sw1, Sw2, and Sw3.

Otherwise, it is preferable that, by using the difference in state and the like between the laminated films 4 formed on the wavy surfaces Sw1, Sw2, and Sw3, the laminated film 4 formed on the wavy surface Sw3 be removed to be discontinuous in island shapes, while the laminated films 4 formed on the wavy surfaces Sw1 and Sw2 remain to be continuously connected. Accordingly, the conductive pattern portions can be selectively formed on the wavy surfaces Sw1 and Sw2 among the wavy surfaces Sw1, Sw2, and Sw3.

Otherwise, it is preferable that, by using the difference in state and the like between the laminated films 4 formed on the wavy surfaces Sw1, Sw2, and Sw3, the laminated film 4 formed on the wavy surface Sw3 be removed to have a thickness that is much smaller than the thicknesses of the laminated films 4 formed on the wavy surfaces Sw1 and Sw2. Accordingly, the conductive pattern portions can be selectively formed on the wavy surfaces Sw1 and Sw2 among the wavy surfaces Sw1, Sw2, and Sw3.

In the second embodiment, since the wavy surfaces Sw1, Sw2, and Sw3 are respectively formed on the entire regions of the first, second, and third regions $R_1$, $R_2$, and $R_3$, the antireflection characteristics of the conductive element 1 can be enhanced. In this configuration, it is preferable that the first and second layers $4_2$ and $4_2$ which function as the conductive pattern portions have shapes that respectively follow the wavy surfaces Sw1 and Sw2. Accordingly, degradation in the effects of excellent antireflection characteristics and/or transmission characteristics can be suppressed.

The wavy surfaces Sw1, Sw2, and Sw3 subjected to modulation (for example, amplitude modulation and/or frequency modulation) are formed on the substrate surface, and the laminated films 4 are formed on the substrate surface, thereby changing the states of the laminated films 4 according to the difference in modulation between the wavy surfaces Sw1, Sw2, and Sw3 formed on the substrate surface. Therefore, the solubility of the laminated film 4 to a removing solution can be changed according to the difference in modulation between the wavy surfaces Sw1, Sw2, and Sw3 of the substrate 2. That is, desired conductive pattern portions can be formed on the substrate surface by using the difference in modulation between the wavy surfaces Sw1, Sw2, and Sw3 of the substrate 2.

In a case where the wavy surfaces Sw1, Sw2, and Sw3 of the substrate surface are respectively formed by nanostructures $3_1$, $3_2$, and $3_3$, visibility and optical characteristics can be enhanced. Without the deterioration of optical characteristics, desired electrical resistance can be realized.

3. Third Embodiment

Configuration of Conductive Element

Figure 14:
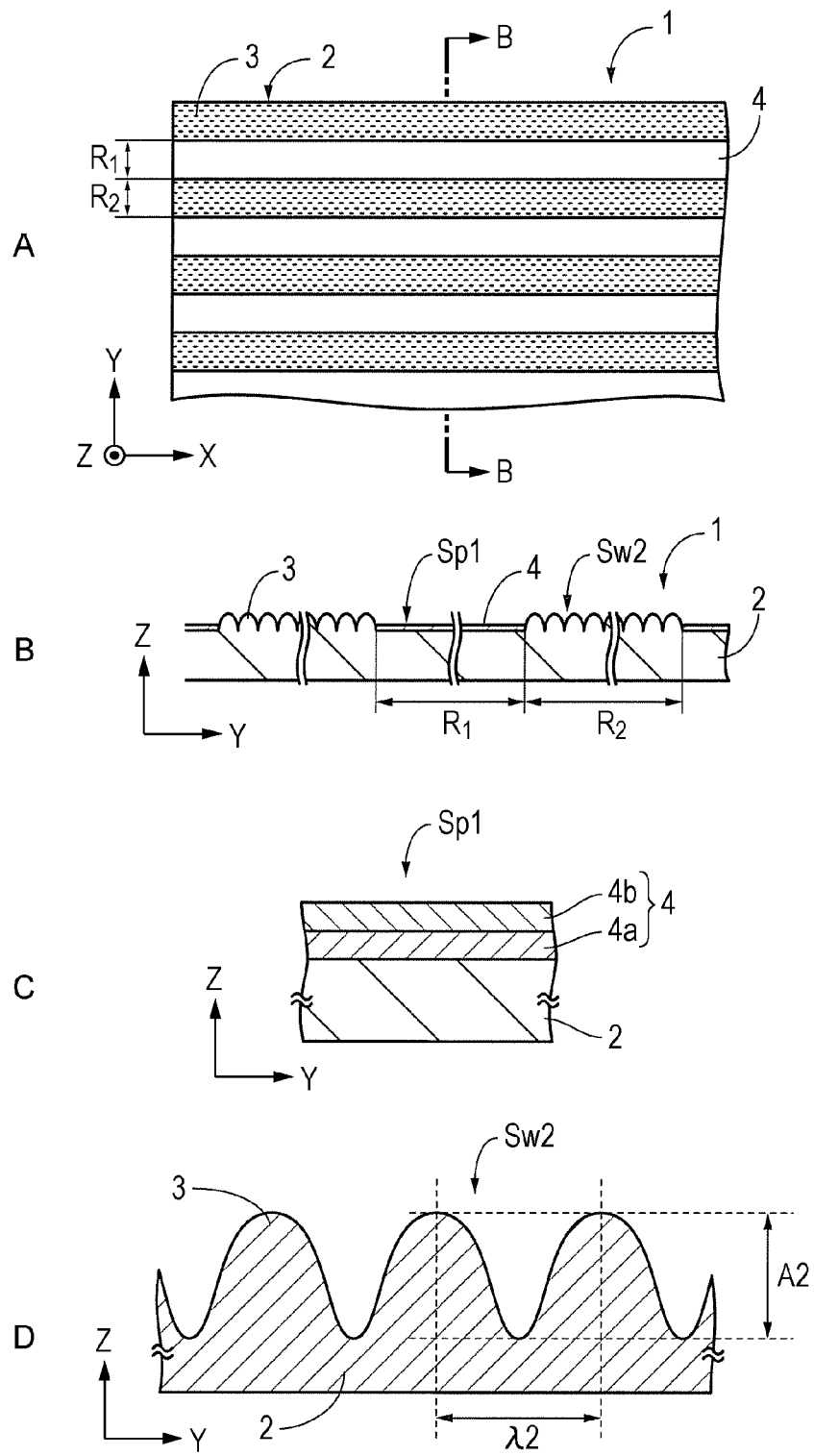
FIG. 14A is a plan view illustrating a configuration example of a conductive element according to a third embodiment of the present technology.
FIG. 14B is a cross-sectional view taken along the line B-B illustrated in FIG. 14A.
FIG. 14C is an enlarged cross-sectional view illustrating a part of a first region illustrated in FIG. 14B.
FIG. 14D is an enlarged cross-sectional view illustrating a part of a second region illustrated in FIG. 14B.

FIG. 14A is a plan view illustrating a configuration example of a conductive element according to a third embodiment of the present technology. FIG. 14B is a cross-sectional view taken along the line B-B illustrated in FIG. 14A. FIG. 14C is an enlarged cross-sectional view illustrating a part of a first region illustrated in FIG. 14B. FIG. 14D is an enlarged cross-sectional view illustrating a part of a second region illustrated in FIG. 14B. Hereinafter, two directions which are orthogonal to each other on a plane of the principal surface of a conductive element 1 are respectively referred to as an X-axis direction and a Y-axis direction, and a direction perpendicular to the principal surface is referred to as a Z-axis direction.

The conductive element 1 according to the third embodiment includes a substrate 2 having a first region $R_1$ and a second region $R_2$ which are alternately formed, and a laminated film 4 formed in the first region $R_1$ among the first and second regions $R_1$ and $R_2$. The laminated film 4 is continuously formed in the first region $R_1$ to form a conductive pattern portion. The conductive pattern portion is, for example, a wiring pattern portion or an electrode pattern portion. The laminated film 4 is a laminated film in which two or more layers are laminated and preferably includes at least a conductive layer 4a.

The conductive element 1 is, for example, a printed-circuit board or an image display element. Examples of the printed-circuit board include a rigid board, a flexible board, and a rigid flexible board. Examples of the image display element include a liquid crystal display element, and an electroluminescence (EL) element (for example, an organic EL element or an inorganic EL element).

(First Region and Second Region)

On the substrate surface of the first region $R_1$, for example, a flat surface Sp1 is formed, and on the flat surface Sp1, the laminated film 4 is continuously formed. On the other hand, on the substrate surface of the second region $R_2$, for example, a wavy surface Sw2 is formed, and on the wavy surface Sw2, the laminated film 4 is not formed. Therefore, the second region $R_2$ functions as an insulating region for insulation between the laminated films 4 formed in the adjacent first regions $R_1$. On the other hand, the laminated film 4 which is continuously formed on the first region $R_1$ has conductivity in an extension direction of the first region $R_1$ and functions as the conductive pattern portion. On the surface of the substrate 2, for example, a shape layer having the flat surface Sp1 and the wavy surface Sw2 is provided. The shape layer includes a structure 3, which will be described later.

The flat surface Sp1 and the wavy surface Sw2 preferably satisfy the following relationship.

$$(Am1/\lambda m1)=0, 0<(Am2/\lambda m2) \leq 1.8$$

(where Am1 is the average width of vibrations of the flat surface Sp1, Am2 is the average width of vibrations of the wavy surface Sw2, λm1 is the average wavelength of the flat surface Sp1, and λm2 is the average wavelength of the wavy surface Sw2.)

In addition, since the flat surface Sp1 can be regarded as a wavy surface having an average width Am1 of vibrations of "0", as described above, the average width Am1 of vibrations, the average wavelength λm1, and the ratio (Am1/λm1) of the flat surface Sp1 can be defined.

When the ratio (Am2/λm2) is higher than 1.8, peeling failure occurs at the time of transferring the wavy surface Sw2 and the wavy surface Sw2 tends to be broken.

Here, the ratio (Am2/λm2) of the wavy surface Sw2 is obtained as follows. First, the cross-section of the conductive element 1 is cut to include a position where the width of vibration of the wavy surface Sw2 is maximized, and the cross-section is photographed by a transmission electron microscope (TEM). Next, the wavelength λ2 and the width A2 of vibration of the wavy surface Sw2 are obtained from the taken TEM photograph. This measurement is repeatedly performed on 10 points which are selected from the conductive element 1 at random, and the measured values are simply averaged (arithmetic average), thereby obtaining the average wavelength λm2 and the average width Am2 of vibrations of the wavy surface Sw2. Next, the ratio (Am2/λm2) of the wavy surface Sw2 is obtained by using the average wavelength λm2 and the average width Am2 of vibrations.

The wavy surface Sw2 is, for example, a one-dimensional or two-dimensional wavy surface having a wavelength that is equal to or shorter than the wavelength of visible light, and specifically, is an uneven surface having a number of structures 3 that are one-dimensionally or two-dimensionally arranged at an arrangement pitch equal to or shorter than the wavelength of visible light.

The shape of the cross-section of the wavy surface Sw2 which is cut in one direction to include a position where the width of vibrations of the wavy surface Sw2 is maximized is, for example, a triangular waveform shape, a sine waveform shape, a waveform shape in which a quadratic curve or a portion of a quadratic curve is repeated, or a shape which approximates the mentioned shapes. The quadratic curve may be a circle, an ellipse, a parabola, or the like.

The average wavelength λm2 of the wavy surface Sw2 is preferably in a range of equal to or longer than 100 nm. When the average wavelength λm2 is shorter than 100 nm, there is a tendency that the production of the wavy surface Sw2 may become difficult.

In addition, the average wavelength λm2 of the wavy surface Sw2 is preferably in a range of equal to or shorter than 100 μm. When the average wavelength λm2 is longer than 100 μm, there is a tendency that problems in height differences and coverage may occur during imprinting and film forming and thus defects may occur.

It is preferable that the laminated film 4 or a part thereof be completely absent in the second region $R_2$ as a residual film. However, the laminated film 4 may be present as a residual film as long as the second region $R_2$ functions as an insulating region. In the case where the laminated film 4 is present as a residual film in the second region $R_2$, the laminated film 4 formed in the first region $R_1$ and the residual film formed in the second region $R_2$ preferably satisfy the following relationship.

$$S1 > S2$$

(where S1 is the area of the laminated film, and S2 is the area of the residual film.)

In a case where the relationship is satisfied, it is preferable that the laminated film 4 be continuously formed in the first region $R_1$ while the residual film be discontinuously formed in the second region $R_2$ in island shapes or the like.

Moreover, in the case where the residual film is present in the second region $R_2$, the laminated film 4 formed in the first region $R_1$ and the residual film formed in the second region $R_2$ preferably satisfy the following relationship.

$$d1 > d2$$

(where d1 is the thickness of the laminated film, and d2 is the thickness of the residual film.)

In a case where the relationship is satisfied, it is preferable that the thickness of the residual film be less than the thickness of the laminated film 4 so as not to substantially exhibit conductivity and the second region $R_2$ function as the insulating region.

In addition, as described above, since the residual film does not function as the conductive pattern portion, illustration of the residual film is omitted in FIGS. 14B and 14D. In FIG. 14A, an example in which the laminated film 4 continuously formed in the first region $R_1$, that is, the conductive pattern portion has a straight line shape is illustrated. However, the shape of the conductive pattern portion is not limited thereto and may be a desired shape depending on the design of circuits or elements and the like.

Hereinafter, the substrate 2, the structure 3, and the laminated film 4 included in the conductive element 1 will be sequentially described.
(Substrate)
The substrate 2 is the same as that of the first embodiment described above.
(Structure)
The wavy surface Sw2 is, for example, an uneven surface having a number of structures 3 arranged on the second region $R_2$. The structures 3 have, for example, convex shapes with respect to the surface of the substrate 2. The structures 3 are, for example, molded separately from the substrate 2 or molded integrally with the substrate 2. In a case where the structures 3 are molded separately from the substrate 2, as needed, a base layer may be provided between the structures 3 and the substrate 2. The base layer is a layer molded integrally with the structures 3 on the bottom surface side of the structures 3 and is formed by curing the same energy ray-curable resin composition as the structures 3. The thickness of the base layer is not particularly limited and may be appropriately selected as needed.

The aspect ratio (Hm/Pm) of the structures 3 preferably satisfies the following relationship.

$$0 < (Hm/Pm) \leq 1.8$$

(where Hm is the average height of the structures 3, and Pm is the average arrangement pitch of the structures 3.)

When the ratio (Hm/Pm) is higher than 1.8, peeling failure occurs at the time of transferring the structures 3 and the structures 3 tend to be broken.
(Laminated Film)

The laminated film 4 includes, for example, the conductive layer 4a formed on the first region $R_1$ and a functional layer 4b formed on the conductive layer 4a. It is preferable that the laminated film 4 be made of materials having different removing rates, specifically, laminated films having different removing rates. As the conductive layer 4a, for example, a metal layer, a transparent conductive layer, a metal oxide layer, or a transition metal compound layer may be used. However, the conductive layer 4a is not limited thereto. As the material of the functional layer 4b, a material which is different at least from the conductive layer 4a is preferable, and a material having a different dissolving rate in a removing process is more preferable.

As the transparent conductive layer, for example, an inorganic transparent conductive layer may be used. The inorganic transparent conductive layer preferably contains a transparent oxide semiconductor as its main component. As the transparent oxide semiconductor, for example, a binary compound such as $SnO_2$, $InO_2$, ZnO, or CdO, a ternary compound which contains at least one element from among Sn, In, Zn, and Cd which are constituent elements of the binary compound, or a multi-element (composite) oxide may be used. Examples of a specific example of the transparent oxide semiconductor include indium tin oxide (ITO), zinc oxide (ZnO), aluminum-doped zinc oxide (AZO($Al_2O_3$—ZnO)), SZO, fluorine-doped tin oxide (FTO), stannic oxide ($SnO_2$), gallium-doped zinc oxide (GZO), and indium zinc oxide (IZO($In_2O_3$—ZnO)). Particularly, from the viewpoint of enhancing reliability, reducing resistivity, and the like, indium tin oxide (ITO) is preferable. A material included in the inorganic transparent conductive layer preferably has a mixed state of amorphous and polycrystalline structures from the viewpoint of enhancing conductivity.

As the material of the metal layer, for example, at least one type selected from the group consisting of Ag, Al, Au, Pt, Pd, Ni, Cr, Nb, W, Mo, Ti, and Cu may be used.

As the functional layer 4b, a functional layer having a different solubility or an etching rate to an etchant at least from the conductive layer 4a is preferable, and for example, a state in which the functional layer 4b forms a polycrystal with a metal oxide layer such as $SiO_2$, a transition metal compound, or a film having a different crystalline state to enhance resistance to the etchant is also preferable. The functional layer 4b preferably includes at least one type of a layer in a mixed state of amorphous and polycrystalline structures and a layer in a polycrystalline structure. In addition, as the functional layer 4b, a metal can also be used as long as it has a different dissolving rate from the conductive layer 4a, and a material containing at least one type selected from the group consisting of Ag, Al, Au, Pt, Pd, Ni, Cr, Nb, W, Mo, Ti, and Cu as long as it is different from the conductive layer 4a.

It is preferable that the surface resistance of the laminated film 4 in the first region $R_1$ be equal to or less than $5000\Omega/\square$. When the surface resistance is higher than $5000\Omega/\square$, the resistance excessively increases and thus the laminated film 4 tends not to be used as an electrode.

[Configuration of Roll Master Copy]

Figure 15:
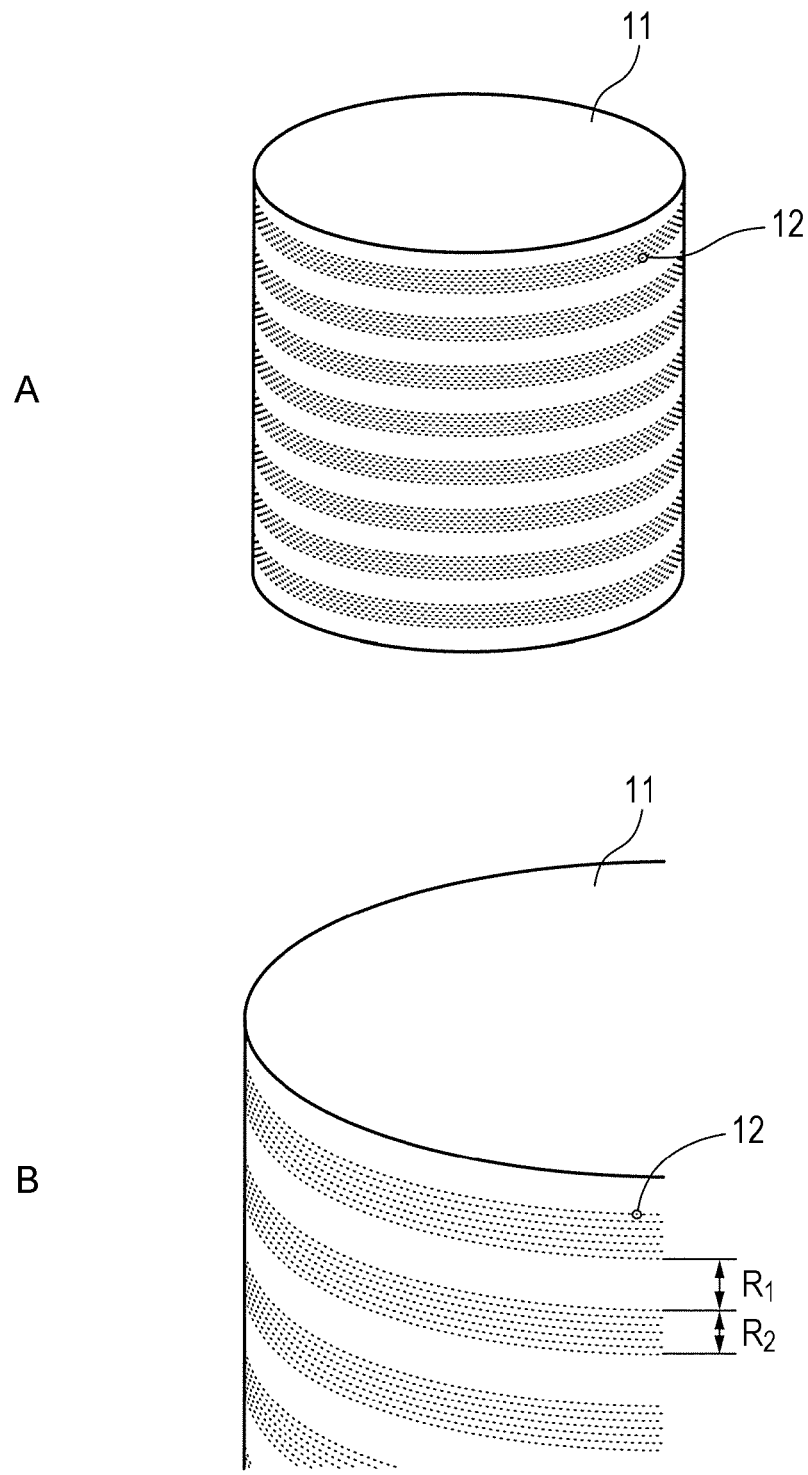
FIG. 15A is a perspective view illustrating a configuration example of a roll master copy for producing the substrate.
FIG. 15B is an enlarged perspective view illustrating a part of the roll master copy illustrated in FIG. 15A.

FIG. 15A is a perspective view illustrating a configuration example of a roll master copy for producing the substrate. FIG. 15B is an enlarged perspective view illustrating a part of the roll master copy illustrated in FIG. 15A. A roll master copy 11 is a master copy for molding the structures 3 on the above-described substrate surface. The roll master copy 11 has, for example, a columnar shape or a cylindrical shape, and a number of the first and second regions $R_1$ and $R_2$ are alternately set on the columnar surface or the cylindrical surface. In FIGS. 15A and 15B, a case where the first and second regions $R_1$ and $R_2$ are formed in a ring shape along the circumferential direction is illustrated. However, the shapes of the first and second regions $R_1$ and $R_2$ are not limited to this example and may be appropriately selected according to the desired shape of the conductive pattern portion, that is, the shape of the laminated film 4 formed in the second region. The material of the roll master copy 11 may use, for example, glass but is not particularly limited to this material.

FIG. 16A is an enlarged cross-sectional view illustrating a part of the roll master copy. FIG. 16B is an enlarged perspective view illustrating a part of a second region. FIG. 16C is an enlarged plan view illustrating a part of the second region. In the second region $R_2$ of the roll master copy 11, for example, a number of structures 12 which are concave portions are arranged at a pitch equal to or shorter than the wavelength of visible light while the first region $R_1$ has no structures 12 which are concave portions but is formed in a flat surface shape.

The first and second regions $R_1$ and $R_2$ of the roll master copy 11 respectively correspond to the first and second regions $R_1$ and $R_2$ of the substrate 2. That is, a flat surface Sp1 formed on the first region $R_1$ of the roll master copy 11 is for forming the flat surface Sp1 on the first region $R_1$ of the substrate 2. A wavy surface Sw2 formed on the second region $R_2$ of the roll master copy 11 is for forming the wavy surface Sw2 on the second region $R_2$ of the substrate 2. Specifically, the wavy surface Sw2 of the roll master copy 11 has an inverted shape of the uneven shape of the wavy surface Sw2 of the surface of the substrate 2 described above. That is, the structure 12 of the roll master copy 11 has an inverted shape of the uneven shape of the structure 3 of the surface of the substrate 2 described above.

[Method of Manufacturing Conductive Element]

Figure 17:
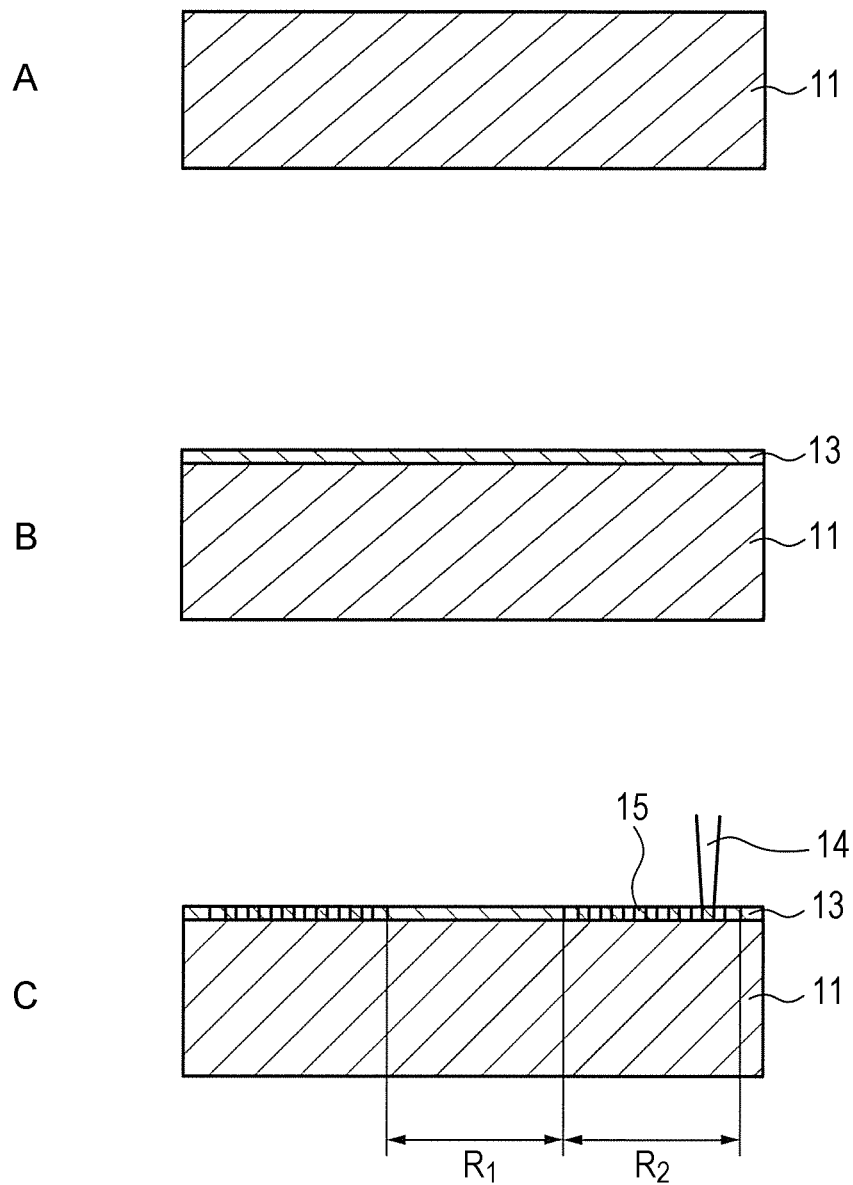
FIGS. 17A to 17C are process diagrams illustrating an example of a method of manufacturing the conductive element according to the third embodiment of the present technology.

Hereinafter, an example of a method of manufacturing the conductive element 1 according to the third embodiment of the present technology will be described with reference to FIGS. 17 to 19.

(Resist Formation Process)

First, as illustrated in FIG. 17A, a roll master copy 11 having a columnar shape or a cylindrical shape is prepared. The roll master copy 11 is, for example, a glass master copy. Subsequently, as illustrated in FIG. 17B, a resist layer 13 is formed on the surface of the roll master copy 11. As the material of the resist layer 13, for example, any of an organic resist and an inorganic resist may be used. As the organic resist, for example, a novolac resist or a chemically amplified resist may be used. Furthermore, as the inorganic resist, for example, a metal compound containing one type or two or more types may be used.

(Exposing Process)

Next, as illustrated in FIG. 17C, by using the above-described roll master copy exposure apparatus, the resist layer 13 is irradiated with the laser light (exposure beam) 14 while the roll master copy 11 is rotated. At this time, the laser light 14 is irradiated while the laser light 14 is moved in the height direction (a direction parallel to the center axis of the roll master copy 11 having the columnar shape or the cylindrical shape) of the roll master copy 11. Here, a latent image is formed only on the second region $R_2$ corresponding to the insulating region between wiring patterns to serve as an exposure portion while the first region $R_1$ corresponding to the conductive pattern portion is not exposed to serve as a non-exposure portion. A latent image 15 according to the path of the laser light 14 is formed, for example, at a pitch equal to or shorter than the wavelength of visible light.

For example, the latent image 15 is arranged to form a plurality of rows of tracks on the roll master copy surface and forms a two-dimensional pattern such as a tetragonal lattice pattern or a hexagonal lattice pattern. The latent image 15 has, for example, an elliptical shape in which the major axis direction is in the extension direction of the track.

(Developing Process)

Next, for example, a developing liquid is dropped onto the resist layer 13 while the roll master copy 11 is rotated such that the resist layer 13 is subjected to a developing treatment as illustrated in FIG. 18A. As illustrated, in a case where the resist layer 13 is formed from a positive type resist, the exposure portion exposed by the laser light 14 has an increased dissolution rate with respect to the developing liquid compared to that of the non-exposure portion. Therefore, a pattern corresponding to the latent image (the exposure portion) 15 is formed on the resist layer 13. Accordingly, openings having the predetermined two-dimensional pattern such as a tetragonal lattice pattern or a hexagonal lattice pattern are formed on the resist layer 13 of the second region $R_2$ while openings are not formed on the resist layer 13 of the first region $R_1$ and the entirety of the first region $R_1$ is maintained in a state of being covered with the resist layer 13. That is, a mask having the opening pattern only in the second region $R_2$ is formed on the roll master copy surface.

(Etching Process)

Next, the surface of the roll master copy 11 is subjected to a roll etching treatment using the pattern (resist pattern) of the resist layer 13 formed on the roll master copy 11 as a mask. Accordingly, the second region $R_2$ on the roll master copy surface is etched via the openings such that, as illustrated in FIG. 18B, structures (concave portions) 12 having elliptical cone shapes or truncated elliptical cone shapes in which the major axis direction is in the extension direction of the track are formed on the second region $R_2$. On the other hand, since the entirety of the first region $R_1$ is covered with the resist layer 13, the first region $R_1$ in the roll master copy surface is not etched and the flat plate-like roll master copy surface is maintained. As the etching method, for example, dry etching may be performed.

(Transfer Process)

Next, for example, as illustrated in FIG. 18C, the roll master copy 11 and the substrate 2 such as a film to which a transfer material 16 is applied are brought into close contact with each other, the transfer material 16 is irradiated with energy rays such as ultraviolet rays to be cured, and thereafter the substrate 2 integrated with the cured transfer material 16 is peeled off. Accordingly, as illustrated in FIG. 19A, the substrate 2 which has the first region $R_1$ having the flat surface Sp1 formed therein and the second region $R_2$ having the wavy surface Sw2 formed therein is obtained.

(Laminated Film Forming Process)

Next, as illustrated in FIG. 19B, the laminated film 4 is formed by laminating two or more layers in the first and second regions $R_1$ and $R_2$ of the substrate surface. Specifically, for example, the conductive layer 4a and the functional layer 4b are laminated in the first and second regions $R_1$ and $R_2$ of the substrate surface in this order, thereby forming the laminated film 4. As a method of forming the laminated film 4, for example, as well as a CVD method (Chemical Vapor Deposition: a technique of precipitating thin films from a gas phase using a chemical reaction) such as a thermal CVD, a plasma CVD, or an optical CVD, a PVD method (Physical Vapor Deposition: a technique of forming thin films by the condensation of a material that is physically vaporized in vacuum, onto a substrate) such as vacuum deposition, plasma-assisted vapor deposition, sputtering, or ion plating may be used. In addition, the laminated film 4 may be formed while heating the substrate 2.

(Annealing Process)

Next, as needed, an annealing treatment is performed on the laminated film 4. Accordingly, the laminated film 4 or the inorganic transparent conductive layer included in the laminated film 4 has, for example, a mixed state of amorphous and polycrystalline structures.

(Laminated Film Removing Process)

Next, as illustrated in FIG. 19C, an etching treatment is performed on the substrate surface having the laminated film 4 formed therein. Accordingly, while the laminated film 4 is removed from the second region $R_2$, the laminated film 4 remains in the first region $R_1$. Specifically, for example, while the conductive layer 4a and the functional layer 4b are removed from the second region $R_2$, the conductive layer 4a and the functional layer 4b remain in the first region $R_1$. Therefore, while the laminated film 4 formed in the first region $R_1$ functions as the conductive pattern portion, the second region $R_2$ functions as an insulating region between the conductive pattern portions. As the etching process, wet etching or dry etching may be used, or a combination of the two may also be used. As an etchant for the wet etching, for example, one or more types of sulfuric acid, hydrochloride, nitric acid, and ferric chloride may be used. Otherwise, oxalic acid, a mixed acid of phosphoric acid, acetic acid, and nitric acid, or an aqueous solution of ceric ammonium nitrate may be used as the etchant. As the dry etching, plasma etching or reactive ion etching (RIE) may be used.

Here, removal means (1) to completely remove the laminated film 4 from the second region $R_2$, (2) to form the laminated film 4 in a discontinuous state (for example, an island-shaped state) to a degree at which the second region $R_2$ does not exhibit conductivity, or (3) to thin the laminated film 4 to have a thickness at which the second region $R_2$ does not exhibit conductivity.

Specifically, it is preferable that, by using the difference in film quality, phase state, and the like between the laminated films 4 formed on the flat surface Sp1 and the wavy surface Sw2, the laminated film 4 formed on the wavy surface Sw2 be substantially removed, while the laminated film 4 formed on the flat surface Sp1 remain to be continuously connected. Accordingly, the conductive pattern portions can be selectively formed on the flat surface Sp1 among the flat surface Sp1 and the wavy surface Sw2.

Otherwise, it is preferable that, by using the difference in film quality, phase state, and the like between the laminated films 4 formed on the flat surface Sp1 and the wavy surface Sw2, the laminated film 4 formed on the wavy surface Sw2 be removed to be discontinuous in island shapes, while the laminated film 4 formed on the flat surface Sp1 remain to be continuously connected. Accordingly, the conductive pattern portions can be selectively formed on the flat surface Sp1 among the flat surface Sp1 and the wavy surface Sw2.

Otherwise, it is preferable that, by using the difference in film quality, phase state, and the like between the laminated films 4 formed on the flat surface Sp1 and the wavy surface Sw2, the laminated film 4 formed on the wavy surface Sw2 be thinned to have a thickness that is much smaller than the thickness of the laminated film 4 formed on the flat surface Sp1. Accordingly, the conductive pattern portions can be selectively formed on the flat surface Sp1 among the flat surface Sp1 and the wavy surface Sw2.

(Cleaning Process)

Next, as needed, the substrate surface subjected to the etching treatment is cleaned.

Accordingly, an intended conductive element 1 is obtained.

In the third embodiment, the laminated film 4 is formed by laminating two or more layers on the substrate surface having the flat surface Sp1 and the wavy surface Sw2. In addition, by using the difference in state and the like between the laminated films 4 formed on the flat surface Sp1 and the wavy surface Sw2, the laminated film 4 formed on the wavy surface Sw2 among the wavy surfaces of the flat surface Sp1 and the wavy surface Sw2 is removed, while the laminated film 4 formed on the flat surface Sp1 remains, thereby forming the conductive pattern portions. Therefore, a conductive element 1 which is precise and has a high throughput can be realized.

4. Fourth Embodiment

Configuration of Conductive Element

Figure 20:
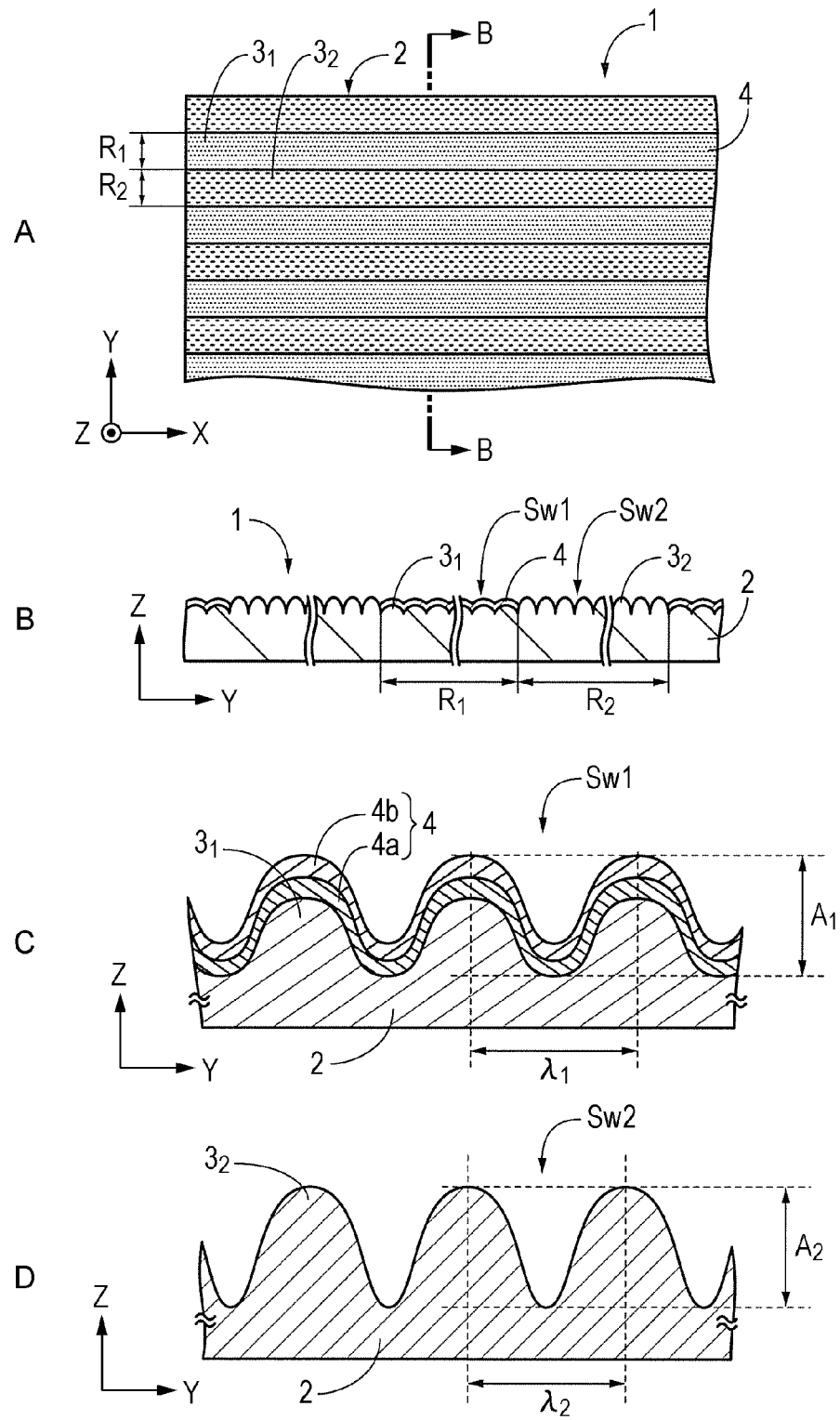
FIG. 20A is a plan view illustrating a configuration example of a conductive element according to a fourth embodiment of the present technology.
FIG. 20B is a cross-sectional view taken along the line B-B illustrated in FIG. 20A.
FIG. 20C is an enlarged cross-sectional view illustrating a part of a first region illustrated in FIG. 20B.
FIG. 20D is an enlarged cross-sectional view illustrating a part of a second region illustrated in FIG. 20B.

FIG. 20A is a plan view illustrating a configuration example of a conductive element according to a fourth embodiment of the present technology. FIG. 20B is a cross-sectional view taken along the line B-B illustrated in FIG. 20A. FIG. 20C is an enlarged cross-sectional view illustrating a part of a first region illustrated in FIG. 20B. FIG. 20D is an enlarged cross-sectional view illustrating a part of a second region illustrated in FIG. 20B. A conductive element 1 according to the fourth embodiment is different from that of the third embodiment in that a wiring pattern and the like are formed by changing the etching rates of laminated films 4 formed in first and second regions $R_1$ and $R_2$ using the difference between a first wavy surface Sw1 formed in the first region $R_1$ and a second wavy surface Sw2 formed in the second region $R_2$ (for example, the difference in the average width of vibrations).

(First Region and Second Region)

On the substrate surface of the first region $R_1$, a first wavy surface Sw1 is formed, and on the first wavy surface Sw1, the laminated film 4 is continuously formed. On the other hand, on the substrate surface of the second region $R_2$, for example, a second wavy surface Sw2 is formed, and on the second wavy surface Sw2, the laminated film 4 is not formed. The first and second wavy surfaces Sw1 and Sw2 are, for example, wavy surfaces having wavelengths that are equal to or shorter than the wavelength of visible light. Therefore, the second region $R_2$ functions as an insulating region for insulation between the laminated films 4 formed in the adjacent first regions $R_1$. On the other hand, the laminated film 4 which is continuously formed on the first region $R_1$ has conductivity in an extension direction of the first region $R_1$ and functions as a conductive pattern portion. On the surface of the substrate 2, for example, a shape layer having the first and second wavy surfaces Sw1 and Sw2 is provided. The shape layer includes structures $3_1$ and $3_2$, which will be described later.

The average wavelength λm1 of the wavy surface Sw1 and the average wavelength λm2 of the wavy surface Sw2 are preferably in a range of equal to or shorter than 100 µm. When the average wavelengths λm1 and λm2 are longer than 100 µm, there is a tendency that problems in height differences and coverage may occur during imprinting and film forming and thus defects may occur.

It is preferable that the laminated film 4 be formed in the first region $R_1$ to follow the surface shape of the first structures $3_1$ so as not to impede the antireflection effect by the first structures $3_1$ and thus the surface shapes of the first structures $3_1$ and the laminated film 4 are similar to each other. This is because excellent antireflection characteristics and/or transmission characteristics can be maintained by suppressing a change in refractive index profile caused by the formation of the laminated film 4. A material included in the laminated film 4 preferably has a mixed state of amorphous and polycrystalline structures. This is because even in a case where the height of the first structure $3_1$ is low, the laminated film 4 can be formed into a thickness by which the antireflection effect by the first structures $3_1$ is not impeded. That is, this is because the laminated film 4 can be maintained in a shape that follows the shape of the first structures $3_1$.

It is preferable that the ratio (Am2/λm2) of the average width Am2 of vibrations to the average wavelength λm2 of the second wavy surface Sw2 be higher than the ratio (Am1/λm1) of the average width Am1 of vibrations to the average wavelength λm1 of the first wavy surface Sw1. This is because both optical characteristics and electrical selectivity can be achieved for the above reason. Specifically, the ratio (Am1/λm1) and the ratio (Am2/λm2) preferably satisfy the following relationship.

$$0<(Am1/\lambda m1)<(Am2/\lambda m2)\leq 1.8$$

(where Am1 is the average width of vibrations of the wavy surface Sw1, Am2 is the average width of vibrations of the wavy surface Sw2, λm1 is the average wavelength of the wavy surface Sw1, and λm2 is the average wavelength of the wavy surface Sw2.)

When the ratio (Am2/λm2) is higher than 1.8, peeling failure occurs at the time of transferring the wavy surface Sw2 and the wavy surface Sw2 tends to be broken.

Here, the ratio (Am1/λm1) of the wavy surface Sw1 is measured in the same manner as that of the wavy surface Sw2 in the third embodiment.

The shapes, wavelengths, and widths of vibrations of the wavy surfaces Sw1 and Sw2 may be separately selected. Specifically, for example, the wavy surfaces Sw1 and Sw2 may separately employ a one-dimensional or two-dimensional wavy surface. Moreover, the wavelengths, and widths of vibrations of the wavy surfaces Sw1 and Sw2 may separately employ wavelengths, and widths of vibrations on the order of nanometers or on the order of micrometers.

It is preferable that a part of the laminated film 4 be completely absent in the second region $R_2$ as a residual film. However, the part of the laminated film 4 may be present as a residual film as long as the second region $R_2$ functions as an insulating region. In this case, it is preferable that the area of the laminated film 4 formed in the first region $R_1$ be larger than the area of the laminated film 4 or the part thereof formed in the second region $R_2$. Specifically, it is preferable that the laminated film 4 be continuously formed in the first region $R_1$ while the laminated film 4 or the part thereof be discontinuously formed in the second region $R_2$ in island shapes or the like. Moreover, the thickness of the laminated film 4 or the part thereof formed in the second region $R_2$ may be smaller than the thickness of the laminated film 4 formed in the first region $R_1$ so as not to substantially exhibit conductivity and the second region $R_2$ may function as the insulating region.

(Structure)

The first wavy surface Sw1 is, for example, an uneven surface having a number of first structures $3_1$ formed at an arrangement pitch equal to or shorter than the wavelength of visible light. The second wavy surface Sw2 is, for example, an uneven surface having a number of first structures $3_1$ formed at an arrangement pitch equal to or shorter than the wavelength of visible light. It is preferable that the average aspect ratio (Hm1/Pm1) of the first structures $3_2$ be higher than the average aspect ratio (Hm2/Pm2) of the second structures $3_2$. Specifically, the first and second structures $3_1$ and $3_2$ preferably satisfy the following relationship.

$$0<(Hm1/Pm1)<(Hm2/Pm2)\leq 1.8$$

(where Hm1 is the average height of the first structures $3_1$, Hm2 is the average height of the second structures $3_2$, Pm1 is the average arrangement pitch of the first structures $3_1$, and Pm2 is the average arrangement pitch of the second structures $3_2$.)

When the ratio (Hm2/Pm2) is higher than 1.8, peeling failure occurs at the time of transferring the second structures $3_2$ and the second structures $3_2$ tend to be broken.

The aspect ratio (Hm1/Pm1) of the first structures $3_1$ and the aspect ratio (Hm2/Pm2) of the second structures $3_2$ are measured in the same manner as the aspect ratio (Hm/Pm) of the structures 3 in the third embodiment.

The first and second structures $3_1$ and $3_2$ may be the same as the structures 3 in the third embodiment except for the above features. In addition, the arrangement patterns, shapes, and the like of the first and second structures $3_1$ and $3_2$ may not be necessarily the same and the two types of the structures may employ different arrangement patterns, shapes, and the like.

[Configuration of Roll Master Copy]

FIG. 21A is an enlarged perspective view illustrating a part of a roll master copy for producing the substrate 2. FIG. 21B is an enlarged cross-sectional view illustrating a part of the roll master copy illustrated in FIG. 21A. A roll master copy 11 according to the fourth embodiment is different from that of the third embodiment in that, in the roll master copy 11, a first wavy surface Sw1 and a second wavy surface Sw2 are respectively provided in a first region $R_1$ and a second region $R_2$.

The first wavy surface Sw1 of the roll master copy 11 is formed by, for example, arranging concave first structures $12_2$ at a pitch equal to or less than the wavelength of visible light. The second wavy surface Sw2 of the roll master copy 11 is formed by, for example, arranging concave second structures $12_2$ at a pitch equal to or less than the wavelength of visible light. The first and second wavy surfaces Sw1 and Sw2 of the roll master copy 11 respectively have inverted shapes of the uneven shapes of the first and second wavy surfaces Sw1 and Sw2 of the substrate 2.

The first and second regions $R_1$ and $R_2$ of the roll master copy 11 respectively correspond to the first and second regions $R_1$ and $R_2$ of the substrate 2. That is, the concave structures $12_2$ formed on the first region $R_1$ of the roll master copy 11 is for forming the convex structures $3_1$ formed on the first region $R_1$ of the substrate 2. The concave structures $12_2$ formed on the second region $R_2$ of the roll master copy 11 is for forming the convex structures $3_2$ formed on the second region $R_2$ of the substrate 2. The aspect ratio of the second structures $12_2$ is preferably higher than the aspect ratio of the first structures $12_1$.

[Method of Manufacturing Conductive Element]

In an etching process in the fourth embodiment, an etching treatment is performed on the substrate surface having the laminated film 4 formed therein, and thus the laminated film 4 is removed from the second region $R_2$ while the laminated film 4 remains in the first region $R_1$. Specifically, it is preferable that, by using the difference in film quality, phase state, and the like between the laminated films 4 formed on the first wavy surface Sw1 and the second wavy surface Sw2, the laminated film 4 formed on the second wavy surface Sw2 be substantially removed, while the laminated film 4 formed on the first wavy surface Sw1 remain to be continuously connected. Accordingly, conductive pattern portions can be selectively formed on the first wavy surface Sw1 among the first wavy surface Sw1 and the second wavy surface Sw2.

Otherwise, it is preferable that, by using the difference in film quality, phase state, and the like between the laminated films 4 formed on the first wavy surface Sw1 and the second wavy surface Sw2, the laminated film 4 formed on the second wavy surface Sw2 be removed to be discontinuous in island shapes, while the laminated film 4 formed on the first wavy surface Sw1 remain to be continuously connected. Accordingly, conductive pattern portions can be selectively formed on the first wavy surface Sw1 among the first wavy surface Sw1 and the second wavy surface Sw2.

Otherwise, it is preferable that, by using the difference in film quality, phase state, and the like between the laminated films 4 formed on the first wavy surface Sw1 and the second wavy surface Sw2, the laminated film 4 formed on the second wavy surface Sw2 be thinned to have a thickness that is much smaller than the thickness of the laminated film 4 formed on the first wavy surface Sw1. Accordingly, conductive pattern portions can be selectively formed on the first wavy surface Sw1 among the first wavy surface Sw1 and the second wavy surface Sw2.

In the fourth embodiment, since the structures $3_2$ and $3_2$ are respectively formed on the first and second regions $R_1$ and $R_2$, the antireflection characteristics of the conductive element 1 can be enhanced. In this configuration, it is preferable that the laminated film 4 of the first region $R_1$ which functions as the conductive pattern portion has a shape that follows the shapes of the structures $3_1$ formed in the first region $R_1$. Accordingly, degradation in the effects of excellent antireflection characteristics and/or transmission characteristics can be suppressed.

The wavy surfaces subjected to modulation (for example, amplitude modulation and/or frequency modulation) are formed on the substrate surface, and the laminated films 4 are formed on the substrate surface, thereby changing the states of the laminated films 4 according to the difference in modulation between the wavy surfaces of the substrate 2. Therefore, the solubility of the laminated film 4 to an etchant can be changed according to the difference in modulation between the wavy surfaces of the substrate 2. That is, desired conductive pattern portions can be formed on the substrate surface by using the difference in modulation between the wavy surfaces of the substrate 2.

In a case where the wavy surfaces of the substrate surface are formed by nanostructures, visibility and optical characteristics can be enhanced. Without the deterioration of optical characteristics, desired electrical resistance can be realized.

In an existing information input device (for example, a digital resistive touch panel or a capacitive touch panel) in which wiring made of a conductive layer is formed on the substrate surface, the conductive layer and the base material have different reflectances, and thus the wiring is visible and display quality tends to deteriorate. Contrary to this, in an information input device according to the embodiment of the present technology, low reflection and high transmittance are realized regardless of the absence or presence of the laminated film 4, and thus wiring can be suppressed from being visible.

5. Fifth Embodiment

Configuration of Conductive Optical Element

FIG. 22A is a plan view illustrating a configuration example of a conductive element according to a fifth embodiment of the present technology. FIG. 22B is a cross-sectional view illustrating the configuration example of the conductive element according to the fifth embodiment of the present technology. FIG. 22C is a cross-sectional view illustrating the layer configuration of a first region of the conductive element according to the fifth embodiment of the present technology. Hereinafter, two directions which are orthogonal to each other on a plane of the circuit formation surface of the conductive element 1 are respectively referred to as an X-axis direction and a Y-axis direction, and a direction perpendicular to the circuit formation surface is referred to as a Z-axis direction.

The conductive element 1 according to the fifth embodiment includes a substrate 2 having a first region $R_1$ and a second region $R_2$ which are alternately formed, and a conductive layer 4m which is continuously formed to form a wiring pattern portion (conductive pattern portion) in the first region $R_1$ among the first and second regions $R_1$ and $R_2$. The conductive layer 4m is, for example, a single-layered film having conductivity. Here, a case where the wiring pattern portion is formed in the first region $R_1$ as an example of the conductive pattern portion is described. However, the conductive pattern portion is not limited to the wiring pattern portion and may have various patterns having conductivity, for example, may be formed as an electrode pattern portion.

From the viewpoint of reducing surface resistance, as illustrated in FIG. 22C, it is preferable that a metal layer 5 formed to be adjacent to the conductive layer 4m be further formed on the substrate surface of the first region $R_1$. The conductive element 1 is, for example, a printed-circuit board, an image display element, or an input element. Examples of the printed-circuit board include a rigid board, a flexible board, and a rigid flexible board. Examples of the image display element include a liquid crystal display element, and an electroluminescence (EL) element (for example, an organic EL element or an inorganic EL element).

(First Region $R_1$ and Second Region $R_2$)

On the substrate surface of the second region $R_2$, for example, a wavy surface Sw2 having a wavelength that is equal to or shorter than the wavelength of visible light is formed, and on the wavy surface Sw2, the conductive layer 4m is not formed or the conductive layer 4m is discontinuously formed. The wavy surface Sw2 is, for example, an uneven surface having a number of structures 3 formed at an arrangement pitch equal to or shorter than the wavelength of visible light. On the other hand, on the substrate surface of the first region $R_1$, for example, a flat surface Sp1 is formed, and on the flat surface Sp1, the conductive layer 4m is continuously formed. Therefore, the second region $R_2$ functions as an insulating region for insulation between the conductive layers 4m formed in the adjacent first regions $R_1$. On the other hand, the conductive layer 4m which is continuously formed on the first region $R_1$ has conductivity in an extension direction of the first region $R_1$ and functions as the wiring pattern portion (conductive pattern portion).

The flat surface Sp1 and the wavy surface Sw2 preferably satisfy the following relationship.

$$(Am1/\lambda m1)=0, 0<(Am2/\lambda m2)\leq 1.8$$

(where Am1 is the average width of vibrations of the flat surface Sp1, Am2 is the average width of vibrations of the wavy surface Sw2, λm1 is the average wavelength of the flat surface Sp1, and λm2 is the average wavelength of the wavy surface Sw2.)

In addition, since the flat surface Sp1 can be regarded as a wavy surface having an average width Am1 of vibrations of "0", as described above, the average width Am1 of vibrations, the average wavelength λm1, and the ratio (Am1/λm1) of the flat surface Sp1 can be defined.

When the ratio (Am2/λm2) is higher than 1.8, peeling failure occurs at the time of transferring the wavy surface Sw2 and the wavy surface Sw2 tends to be broken.

The wavy surface Sw2 is, for example, a one-dimensional or two-dimensional wavy surface having a wavelength that is equal to or shorter than the wavelength of visible light, and specifically, is an uneven surface having a number of structures 3 that are one-dimensionally or two-dimensionally arranged at an arrangement pitch equal to or shorter than the wavelength of visible light.

The average wavelength λm2 of the wavy surface Sw2 is preferably in a range of equal to or longer than 100 nm. When the average wavelength λm2 is shorter than 100 nm, there is a tendency that the production of the wavy surface Sw2 may become difficult.

In addition, the average wavelength λm2 of the wavy surface Sw2 is preferably in a range of equal to or shorter than 100 μm. When the average wavelength λm2 is longer than 100 μm, there is a tendency that problems in height differences and coverage may occur during imprinting and film forming and thus defects may occur.

It is preferable that the conductive layer 4m be completely absent in the second region $R_2$. However, the conductive layer 4m may be present as long as the second region $R_2$ functions as an insulating region. In this case, it is preferable that the area of the conductive layer 4m formed in the first region $R_1$ be larger than the area of the conductive layer 4m formed in the second region $R_2$. Specifically, it is preferable that the conductive layer 4m be continuously formed in the first region $R_1$ while the conductive layer 4m be discontinuously formed in the second region $R_2$ in island shapes or the like. Moreover, the thickness of the conductive layer 4m formed in the second region $R_2$ may be smaller than the thickness of the conductive layer 4m formed in the first region $R_1$ so as not to substantially exhibit conductivity and the second region $R_2$ may function as the insulating region.

More specifically, it is preferable that the conductive layer 4m or a part thereof be completely absent in the second region $R_2$ as a residual film. However, the conductive layer 4m may be present as a residual film as long as the second region $R_2$ functions as an insulating region. In the case where the conductive layer 4m is present as a residual film in the second region $R_2$, the conductive layer 4m formed in the first region $R_1$ and the residual film formed in the second region $R_2$ preferably satisfy the following relationship.

$$S1>S2$$

(where S1 is the area of the conductive layer, and S2 is the area of the residual film.)

In a case where the relationship is satisfied, it is preferable that the conductive layer 4m be continuously formed in the first region $R_1$ while the residual film be discontinuously formed in the second region $R_2$ in island shapes or the like.

Moreover, in the case where the residual film is present in the second region $R_2$, the conductive layer 4m formed in the first region $R_1$ and the residual film formed in the second region $R_2$ preferably satisfy the following relationship.

$$d1>d2$$

(where d1 is the thickness of the conductive layer, and d2 is the thickness of the residual film.)

In a case where the relationship is satisfied, it is preferable that the thickness of the residual film be less than the thickness of the conductive layer 4m so as not to substantially exhibit conductivity and the second region $R_2$ function as the insulating region.

In FIG. 22A, an example in which the conductive layer 4m continuously formed in the first region $R_1$, that is, wiring has a straight line shape is illustrated. However, the shape of the wiring is not limited thereto and may be a desired shape depending on the circuit design and the like. Moreover, in a case where the conductive layer 4m is discontinuously formed in the second region $R_2$, the conductive layer 4m does not function as the wiring. Therefore, illustration of the conductive layer 4m is omitted. That is, illustration of the residual film is omitted.

The shape of the cross-section of the wavy surface Sw2 which is cut in one direction to include a position where the width of vibrations of the wavy surface Sw2 is maximized is, for example, a triangular waveform shape, a sine waveform shape, a waveform shape in which a quadratic curve or a portion of a quadratic curve is repeated, or a shape which approximates the mentioned shapes. The quadratic curve may be a circle, an ellipse, a parabola, or the like.

It is preferable that the ratio (Am2/λm2) of the average width Am2 of vibrations to the average wavelength λm2 of the wavy surface Sw2 be equal to or less than 1.8. When the ratio (Am2/λm2) is higher than 1.8, peeling failure occurs at the time of transferring structures and the structures tend to be broken.

Here, the average wavelength λm2 and the average width Am2 of vibrations of the wavy surface Sw2 are obtained as follows. First, the conductive element 1 is cut in one direction to include a position where the width of vibration of the wavy surface Sw2 of the conductive layer 4m is maximized, and the cut surface is photographed by a transmission electron microscope (TEM). Next, the wavelength λ2 and the width A2 of vibration of the wavy surface Sw2 are obtained from the taken TEM photograph. This measurement is repeatedly performed on 10 points which are selected from the conductive element 1 at random, and the measured values are simply averaged (arithmetic average), thereby obtaining the average wavelength λm2 and the average width Am2 of vibrations of the wavy surface Sw2. Next, the ratio (Am2/λm2) of the wavy surface Sw2 is obtained by using the average wavelength λm2 and the average width Am2 of vibrations.

Hereinafter, the substrate 2, the structure 3, the conductive layer 4m, and the metal layer 5 included in the conductive element 1 will be sequentially described.

(Substrate)

The substrate 2 is the same as that of the first embodiment described above.

(Structure)

On the surface of the substrate 2 in the second region $R_2$, for example, a number of structures 3 as convex portions are arranged. Accordingly, the wavy surface Sw2 is formed on the surface of the substrate 2 in the second region $R_2$. The structures 3 are, for example, molded separately from the substrate 2 or molded integrally with the substrate 2. In a case where the structures 3 are molded separately from the substrate 2, as needed, a base layer may be provided between the structures 3 and the substrate 2. The base layer is a layer molded integrally with the structures 3 on the bottom surface side of the structures 3 and is formed by curing the same energy ray-curable resin composition as the structures 3. The thickness of the base layer is not particularly limited and may be appropriately selected as needed.

The aspect ratio (Hm/Pm) of the structures 3 preferably satisfies the following relationship.

$$0<(Hm/Pm)\leq 1.8$$

(where Hm is the average height of the structures 3, and Pm is the average arrangement pitch of the structures 3.)

When the ratio (Hm/Pm) is higher than 1.8, peeling failure occurs at the time of transferring the structures 3 and the structures 3 tend to be broken.

(Conductive Layer)

The conductive layer 4m is, for example, a transparent conductive layer. The transparent conductive layer is, for example, an inorganic transparent conductive film. The conductive layer 4m is, for example, a single-layered film.

The inorganic transparent conductive film preferably contains a transparent oxide semiconductor as its main component. As the transparent oxide semiconductor, for example, a binary compound such as $SnO_2$, $InO_2$, ZnO, or CdO, a ternary compound which contains at least one element from among Sn, In, Zn, and Cd which are constituent elements of the binary compound, or a multi-element (composite) oxide may be used. Examples of a specific example of the transparent oxide semiconductor include indium tin oxide (ITO), zinc oxide (ZnO), aluminum-doped zinc oxide (AZO($Al_2O_3$—ZnO)), SZO, fluorine-doped tin oxide (FTO), stannic oxide ($SnO_2$), gallium-doped zinc oxide (GZO), and indium zinc oxide (IZO($In_2O_3$—ZnO)). Particularly, from the viewpoint of enhancing reliability, reducing resistivity, and the like, indium tin oxide (ITO) is preferable. A material included in the inorganic transparent conductive film preferably has a mixed state of amorphous and polycrystalline structures from the viewpoint of enhancing conductivity.

As a material included in the conductive layer 4m, a metal film may be included. As the material of the metal film, for example, at least one type selected from the group consisting of Ag, Al, Au, Pt, Pd, Ni, Cr, Nb, W, Mo, Ti, and Cu may be used. Furthermore, the conductive layer 4m may contain at least one type selected from the group consisting of a conductive polymer, metal nanoparticles, and carbon nanotubes, as its main component.

It is preferable that the surface resistance of the conductive layer 4m in the first region $R_1$ be equal to or less than 5000Ω/□. When the surface resistance is higher than 5000Ω/□, the resistance excessively increases and thus the conductive layer 4m tends not to be used as an electrode.

6. Sixth Embodiment

Configuration of Conductive Element

FIG. 23A is a plan view illustrating a configuration example of a conductive element according to a sixth embodiment of the present technology. FIG. 23B is a cross-sectional view illustrating the configuration example of the conductive element according to the sixth embodiment of the present technology. FIG. 23C is a cross-sectional view illustrating the layer configuration of a first region of the conductive element according to the sixth embodiment of the present technology. The conductive element 1 according to the sixth embodiment is different from that of the fifth embodiment in that a wiring pattern portion and the like are formed by changing the etching rates of conductive layers 4m formed in first and second regions $R_1$ and $R_2$ using the difference between a first wavy surface Sw1 formed in the first region $R_1$ and a second wavy surface Sw2 formed in the second region $R_2$ (for example, the difference in the average width of vibrations).

(First Region and Second Region)

On the substrate surface of the second region $R_2$, for example, a second wavy surface Sw2 having a wavelength that is equal to or shorter than the wavelength of visible light is formed, and on the second wavy surface Sw2, the conductive layer 4m is not formed or the conductive layer 4m is discontinuously formed. The thickness of the conductive layer 4m formed in the second region $R_2$ may be smaller than the thickness of the conductive layer 4m formed in the first region $R_1$ so as not to substantially exhibit conductivity and the second region $R_2$ may function as the insulating region. On the substrate surface of the first region $R_1$, for example, the first wavy surface Sw1 having a wavelength that is equal to or shorter than the wavelength of visible light is formed, and on the second wavy surface Sw1, the conductive layer 4m is continuously formed. Therefore, the second region $R_2$ functions as an insulating region for insulation between the conductive layer 4m formed in the adjacent first regions $R_1$. On the other hand, the conductive layer 4m which is continuously formed on the first region $R_1$ has conductivity in an extension direction of the first region $R_1$ and functions as the wiring pattern portion (conductive pattern portion).

The first wavy surface Sw1 is, for example, an uneven surface having a number of first structures $3_1$ formed at an arrangement pitch equal to or shorter than the wavelength of visible light. The second wavy surface Sw2 is, for example, an uneven surface having a number of second structures $3_2$ formed at an arrangement pitch equal to or shorter than the wavelength of visible light. In addition, from the viewpoint of reducing surface resistance, as illustrated in FIG. 23C, it is preferable that a metal layer 5 be further formed on the substrate surface.

It is preferable that the conductive layer 4m be formed in the first region $R_1$ to follow the surface shapes of the first structures $3_1$ so as not to impede the antireflection effect by the first structures $3_1$ and thus the surface shapes of the first structures $3_1$ and the conductive layer 4m be similar to each other. This is because excellent antireflection characteristics and/or transmission characteristics can be maintained by suppressing a change in refractive index profile caused by the formation of the conductive layer 4m. A material included in the conductive layer 4m preferably has a mixed state of amorphous and polycrystalline structures. This is because even in a case where the height of the first structure $3_1$ is low, the conductive layer 4m can be formed into a thickness by which the antireflection effect by the first structures $3_1$ is not impeded. That is, this is because even in a case where the height of the first structure $3_2$ is low, the conductive layer 4m can be maintained in a shape that follows the shape of the first structures $3_1$.

It is preferable that the ratio (Am2/λm2) of the average width Am2 of vibrations to the average wavelength λm2 of the second wavy surface Sw2 be higher than the ratio (Am1/λm1) of the average width Am1 of vibrations to the average wavelength λm1 of the first wavy surface Sw1. This is because both optical characteristics and electrical selectivity can be achieved for the above reason. It is preferable that the ratio (Am2/λm2) of the average width Am2 of vibrations to the average wavelength λm2 of the second wavy surface Sw2 be equal to or less than 1.8. When the ratio (Am2/λm2) is higher than 1.8, peeling failure occurs at the time of transferring second structures $3_2$ and the second structures $3_2$ tend to be broken. It is preferable that the average width Am2 of vibrations of the second wavy surface be higher than the average width Am1 of vibrations of the first wavy surface.

In addition, the average wavelength λm1 of the first wavy surface Sw1 and the average wavelength λm2 of the wavy surface Sw2 are preferably equal to or longer than 100 nm. When the average wavelengths λm1 and λm2 are shorter than 100 nm, there is a tendency that the production of the wavy surface Sw2 may become difficult. The average wavelength λm1 of the first wavy surface Sw1 and the average wavelength λm2 of the wavy surface Sw2 are preferably in a range of equal to or shorter than 100 μm. When the average wavelengths λm1 and λm2 are longer than 100 μm, there is a tendency that problems in height differences and coverage may occur during imprinting and film forming and thus defects may occur.

The average aspect ratio of the second structures $3_2$ is preferably higher than the average aspect ratio of the first structures $3_1$. It is preferable that the average arrangement pitch Pm1, the average height Hm1, and the average aspect ratio (Hm1/Pm1) of the first structures $3_1$ be respectively the same as the average wavelength λm1, the average width Am1 of vibrations, and the ratio (Am1/λm1) of the first wavy surface Sw1. It is preferable that the average arrangement pitch Pm2, the average height Hm2, and the average aspect ratio (Hm2/Pm2) of the second structures $3_2$ be respectively the same as the average wavelength λm2, the average width Am2 of vibrations, and the ratio (Am2/λm2) of the second wavy surface Sw2.

Specifically, it is preferable that the ratio (Am2/λm2) of the average width Am2 of vibrations to the average wavelength λm2 of the second wavy surface Sw2 be higher than the ratio (Am1/λm1) of the average width Am1 of vibrations to the average wavelength λm1 of the first wavy surface Sw1. This is because both optical characteristics and electrical selectivity can be achieved for the above reason.

Specifically, the ratio (Am1/λm1) and the ratio (Am2/λm2) preferably satisfy the following relationship.

$$0<(Am1/\lambda m1)<(Am2/\lambda m2)\leq 1.8$$

(where Am1 is the average width of vibrations of the wavy surface Sw1, Am2 is the average width of vibrations of the wavy surface Sw2, λm1 is the average wavelength of the wavy surface Sw1, and λm2 is the average wavelength of the wavy surface Sw2.)

When the ratio (Am2/λm2) is higher than 1.8, peeling failure occurs at the time of transferring the wavy surface Sw2 and the wavy surface Sw2 tends to be broken.

Here, the ratio (Am1/λm1) of the wavy surface Sw1 is measured in the same manner as that of the wavy surface Sw2 in the first embodiment.

The shapes, wavelengths, and widths of vibrations of the wavy surfaces Sw1 and Sw2 may be separately selected. Specifically, for example, the wavy surfaces Sw1 and Sw2 may separately employ a one-dimensional or two-dimensional wavy surface. Moreover, the wavelengths, and widths of vibrations of the wavy surfaces Sw1 and Sw2 may separately employ wavelengths, and widths of vibrations on the order of nanometers or on the order of micrometers.

It is preferable that a part of the conductive layer 4m be completely absent in the second region $R_2$ as a residual film. However, the part of the conductive layer 4m may be present as a residual film as long as the second region $R_2$ functions as an insulating region. In this case, it is preferable that the area of the conductive layer 4m formed in the first region $R_1$ be larger than the area of the conductive layer 4m or the part thereof formed in the second region $R_2$. Specifically, it is preferable that the conductive layer 4m be continuously formed in the first region $R_1$ while the conductive layer 4m or the part thereof be discontinuously formed in the second region $R_2$ in island shapes or the like. Moreover, the thickness of the conductive layer 4m or the part thereof formed in the second region $R_2$ may be smaller than the thickness of the conductive layer 4m formed in the first region $R_1$ so as not to substantially exhibit conductivity and the second region $R_2$ may function as the insulating region.

(Structure)

The first structures $3_2$ formed in the first region $R_1$ form, for example, like the second structures $3_2$ formed in the second region $R_2$, a regular lattice pattern such as a hexagonal lattice pattern, a quasi-hexagonal lattice pattern, a tetragonal lattice pattern, or a quasi-tetragonal lattice pattern. In addition, as described later, the first structures $3_1$ may be arranged at random. In addition, the arrangement patterns of the first and second structures $3_1$ and $3_2$ in the first and second regions $R_1$ and $R_2$ may not be necessarily the same and the structures in the two regions may employ different arrangement patterns.

The first wavy surface Sw1 is, for example, an uneven surface having a number of first structures $3_1$ formed at an arrangement pitch equal to or shorter than the wavelength of visible light. The second wavy surface Sw2 is, for example, an uneven surface having a number of second structures $3_2$ formed at an arrangement pitch equal to or shorter than the wavelength of visible light. It is preferable that the average aspect ratio (Hm2/Pm2) of the second structures $3_2$ be higher than the average aspect ratio (Hm1/Pm1) of the first structures $3_1$. Specifically, the first and second structures $3_1$ and $3_2$ preferably satisfy the following relationship.

$$0<(Hm1/Pm1)<(Hm2/Pm2)\leq 1.8$$

(where Hm1 is the average height of the first structures $3_1$, Hm2 is the average height of the second structures $3_2$, Pm1 is the average arrangement pitch of the first structures $3_1$, and Pm2 is the average arrangement pitch of the second structures $3_2$.)

When the ratio (Hm2/Pm2) is higher than 1.8, peeling failure occurs at the time of transferring the second structures $3_2$ and the second structures $3_2$ tend to be broken.

Here, the aspect ratio (Hm1/Pm1) of the first structures $3_2$ and the aspect ratio (Hm2/Pm2) of the second structures $3_2$ are measured in the same manner as the aspect ratio (Hm/Pm) of the structures 3 in the first embodiment.

The first and second structures $3_1$ and $3_2$ may be the same as the structures 3 in the fifth embodiment except for the above features. In addition, the arrangement patterns, shapes, and the like of the first and second structures $3_1$ and $3_2$ may not be necessarily the same and the two types of the structures may employ different arrangement patterns, shapes, and the like.

7. Seventh Embodiment

Configuration of Conductive Element

Figure 24:
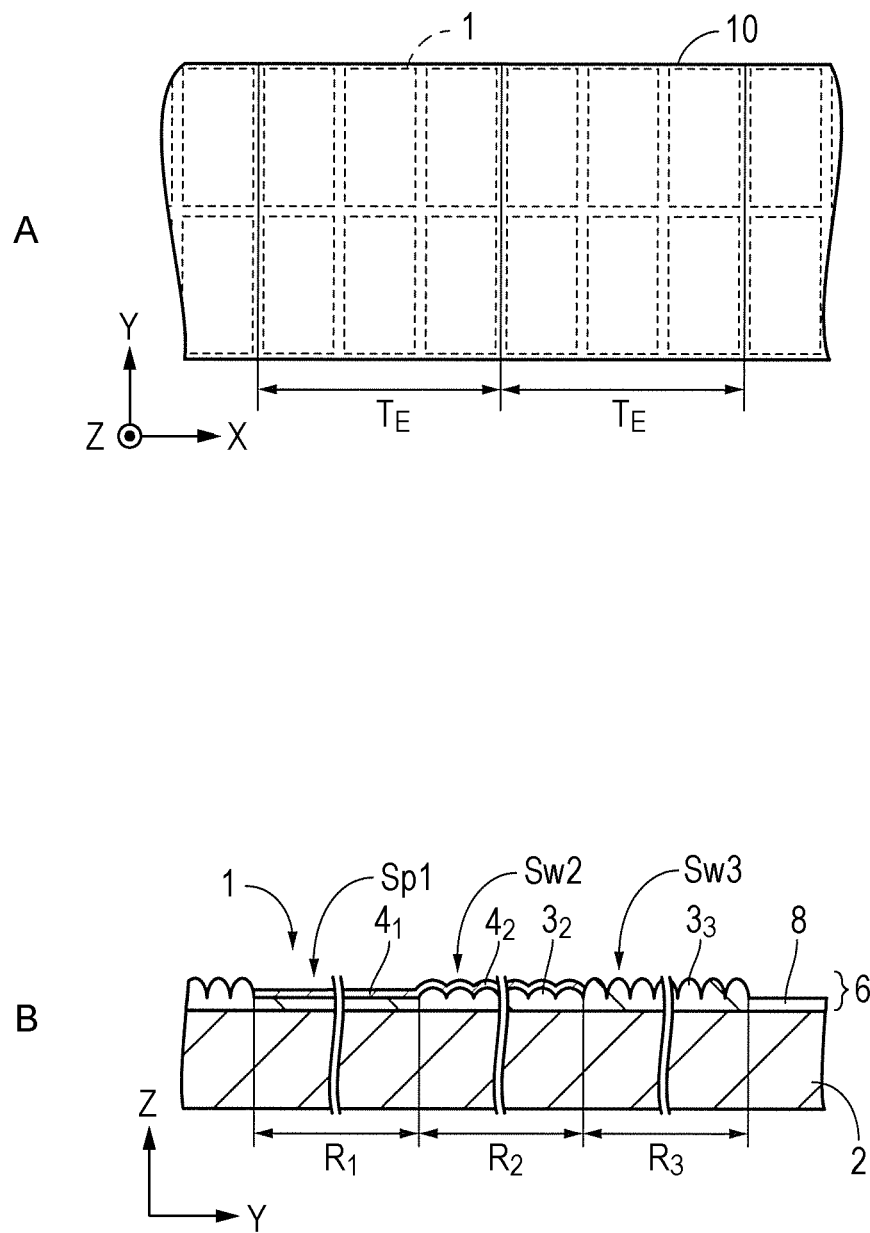
FIG. 24A is a plan view illustrating a configuration example of a conductive element according to a seventh embodiment of the present technology.
FIG. 24B is an enlarged cross-sectional view illustrating a part of the conductive element illustrated in FIG. 24A.

FIG. 24A is a plan view illustrating a configuration example of a conductive element according to a seventh embodiment of the present technology. FIG. 24B is an enlarged cross-sectional view illustrating a part of the conductive element illustrated in FIG. 24A. As illustrated in FIG. 24B, a conductive element 10 includes a substrate 2, a shape layer 6 having a flat surface Sp1, a wavy surface Sw2, and a wavy surface Sw3 provided on the surface of the substrate 2, a first layer $4_1$ provided on the flat surface Sp1, and a second layer $4_2$ provided on the wavy surface Sw2.

Hereinafter, a first surface where the shape layer 6 is formed is appropriately referred to as a front surface, and a second surface on the opposite side thereto is appropriately referred to as a rear surface.

A conductive element 10 has a band-like shape and is wound into a roll shape so as to be used as a master copy. The conductive element 10 preferably has flexibility. This is because, since the band-like conductive element is rolled into a roll shape to be used as a master copy, transportability and handleability are enhanced for this reason. The band-like conductive element 10 has a plurality of conductive elements 1 that are repeatedly provided, and by punching a predetermined partitions of the band-like conductive element 10, the plurality of conductive elements 1 are obtained. The conductive element 1 is, for example, a wiring element such as a printed-circuit board and is appropriately used in various types of electronic devices.

As illustrated in FIG. 24A, the conductive element 10 has, for example, one or more cycles of a transfer region (unit region) $T_E$. Here, one cycle of the transfer region $T_E$ is a region transferred by making one revolution of a roll master copy described later. That is, the length of the one cycle of the transfer region $T_E$ corresponds to the length of the circumferential surface of the roll master copy. It is preferable that, in the boundary portion between the adjacent two transfer regions $T_E$, inconsistency between the uneven shapes of the shape layer 6 be absent and the two transfer regions $T_E$ be seamlessly connected. This is because the conductive element 10 having excellent characteristics and appearance is obtained for the above reason. Here, inconsistency means that physical configurations such as uneven shapes by structures $3_2$ and structures $3_3$ are discontinuous. Examples of a specific example of inconsistency include the disorder of cycles of a predetermined uneven pattern included in the transfer region $T_E$, and overlaps, gaps, and non-transfer portions between adjacent unit regions.

(Substrate)

The material of the substrate 2 is not particularly limited and may be appropriately selected. For example, a plastic material, a glass material, a metal material, and a metal compound material, (for example, ceramic, a magnetic body, and a semiconductor) may also be used. Examples of the plastic material include triacetyl cellulose, polyvinyl alcohol, a cyclic olefin polymer, a cyclic olefin copolymer, polycarbonate, polyethylene, polypropylene, polyvinyl chloride, polystyrene, polyethylene terephthalate, a methacrylic resin, nylon, polyacetal, a fluororesin, a phenolic resin, polyurethane, an epoxy resin, a polyimide resin, a polyamide resin, a melamine resin, polyether ether ketone, polysulfone, polyether sulfone, polyphenylene sulfide, polyarylate, polyetherimide, polyamidimide, and a methyl methacrylate (co)polymer. Examples of the glass material include soda-lime glass, lead glass, hard glass, quartz glass, and liquid crystal glass. Examples of the metal material and the metal compound material include silicon, silicon oxide, sapphire, calcium fluoride, magnesium fluoride, barium fluoride, lithium fluoride, zinc selenide, and potassium bromide.

The shape of the substrate 2 may employ, for example, a sheet shape, a plate shape, or a block shape but is not particularly limited to the shapes. Here, it is defined that the sheet shape includes a film shape. It is preferable that the substrate 2 have a band-like shape as a whole and the transfer regions $T_E$ as unit regions be continuously formed in the longitudinal direction of the substrate 2. As the shapes of the front surface and the rear surface of the substrate 2, for example, any of a flat surface and a curved surface may be used. Both the front surface and the rear surface may be flat surfaces or curved surfaces, or one of the front surface and the rear surface may be a flat surface and the other thereof may be a curved surface.

The substrate 2 has impenetrability to energy rays for curing an energy ray-curable resin composition for forming the shape layer 6. In the specification, the energy rays represent energy rays for curing the energy ray-curable resin composition for forming the shape layer 6. On the surface of the substrate 2, for example, a decorative layer or a functional layer may be formed by printing, coating, vacuum film formation, or the like.

The substrate 2 has a single-layered structure or a laminated structure. Here, the laminated structure is a laminated structure in which two or more layers are laminated, and at least one layer in the laminated structure is a non-transmissive layer having impenetrability to the energy rays. Examples of a method of forming the laminated structure include a method of directly bonding layers by fusing, a surface treatment, or the like, a method of bonding layers via a bonding layer such as an adhesive layer or a sticking layer. However, the method is not particularly limited. The bonding layer may contain a material such as a pigment that absorbs the energy rays. In addition, in a case where the substrate 2 has the laminated structure, a non-transmissive layer which has impenetrability to energy rays and a transmissive layer which has penetrability to energy rays may be combined. Moreover, in a case where the substrate 2 includes two or more non-transmissive layers, the layers may have different absorbing properties.

As the material of the transmissive layer, for example, a transparent organic film such as an acrylic resin coating material, a transparent metal film, an inorganic film, a metal compound film, or a laminated body thereof may be used. However, the material is not particularly limited. As the material of the non-transmissive layer, for example, an organic film such as an acrylic resin coating material containing a pigment, a metal film, a metal compound film, or a laminated body thereof may be used. However, the material is not particularly limited. As the pigment, for example, a material having a light-absorbing property such as carbon black.

FIGS. 25A to 25E are cross-sectional views respectively illustrating first to fifth examples of the substrate.

(First Example)

Figure 25:
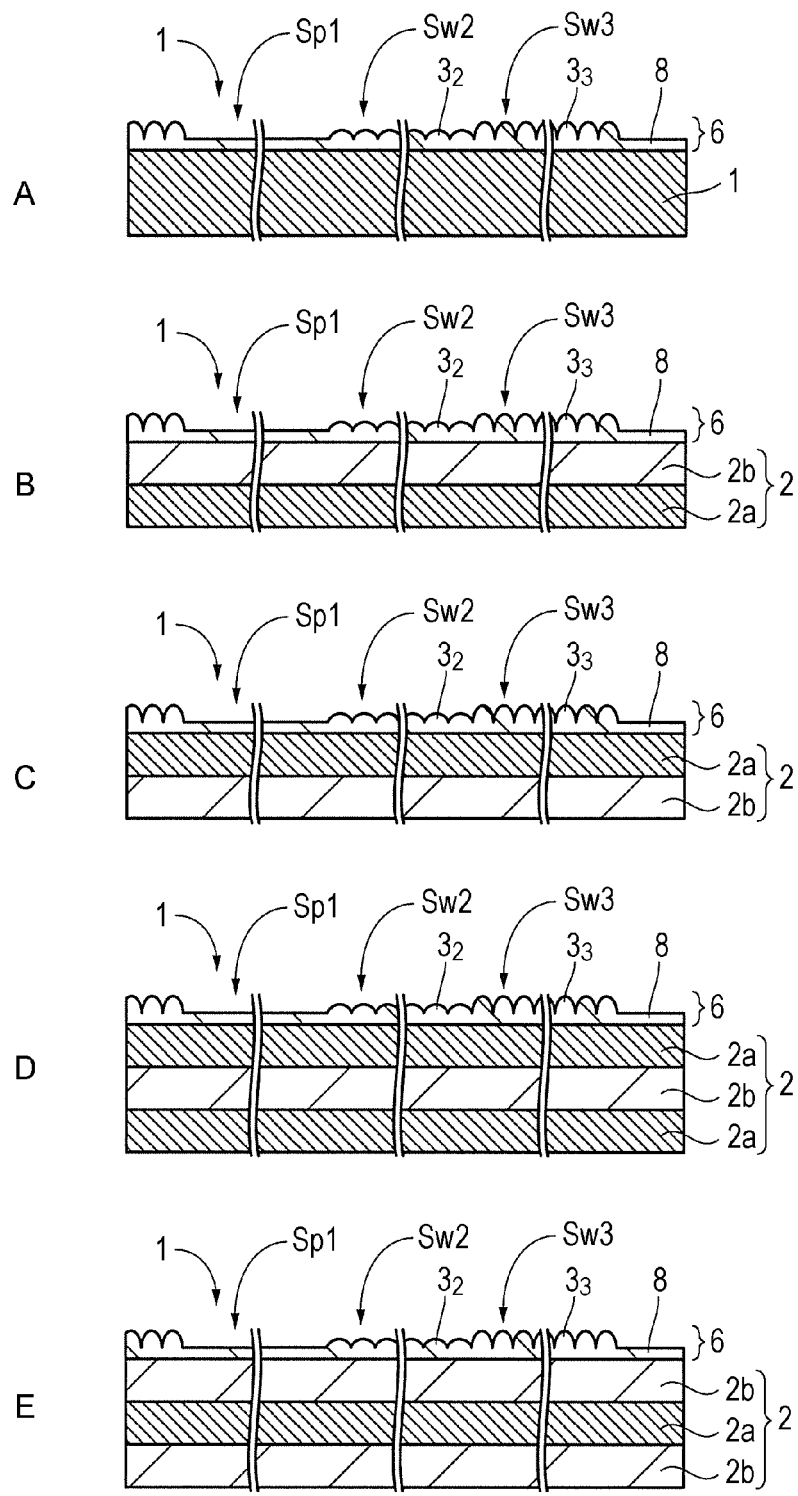
FIGS. 25A to 25E are cross-sectional views respectively illustrating first to fifth examples of the substrate provided in the conductive element according to the seventh embodiment of the present technology.

As illustrated in FIG. 25A, the substrate 2 has a single-layered structure, and the entire substrate is a non-transmissive layer having impenetrability to the energy rays.

(Second Example)

As illustrated in FIG. 25B, the substrate 2 has a double-layered structure, and includes a non-transmissive layer 2a having impenetrability to the energy rays and a transmissive layer 2b having penetrability to the energy rays. The non-transmissive layer 2a is disposed on the rear surface side, and the transmissive layer 2b is disposed on the front surface side.

(Third Example)

As illustrated in FIG. 25C, the substrate 2 has a double-layered structure, and includes a non-transmissive layer 2a having impenetrability to the energy rays and a transmissive layer 2b having penetrability to the energy rays. The non-transmissive layer 2a is disposed on the front surface side, and the transmissive layer 2b is disposed on the rear surface side.

(Fourth Example)

As illustrated in FIG. 25D, the substrate 2 has a three-layered structure, and includes a transmissive layer 2b having penetrability to the energy rays and non-transmissive layers 2a, 2a which are formed on both principal surfaces of the transmissive layer 2b and have impenetrability to the energy rays. One non-transmissive layer 2a is disposed on the rear surface side, and the other non-transmissive layer 2a is disposed on the front surface side.

(Fifth Example)

As illustrated in FIG. 25E, the substrate 2 has a three-layered structure, and includes a non-transmissive layer 2a having impenetrability to the energy rays and transmissive layers 2b, 2b which are formed on both principal surfaces of the non-transmissive layer 2a and have penetrability to the energy rays. One transmissive layer 2b is disposed on the rear surface side, and the other transmissive layer 2b is disposed on the front surface side.

(Shape Layer)

The shape layer 6 has a surface where are transfer regions $T_E$ having a predetermined uneven pattern are continuously formed. The shape layer 6 is, for example, a layer in which a plurality of structures $3_2$ and structures $3_3$ are two-dimensionally arranged, and as needed, may include a base layer 8 between the structures $3_2$ and $3_3$ and the substrate 2. The base layer 8 is a layer molded integrally with the structures $3_2$ and $3_3$ on the bottom surface side of the structures $3_2$ and $3_3$ and is formed by curing the same energy ray-curable resin composition as the structures $3_2$ and $3_3$. The thickness of the base layer 8 is not particularly limited and may be appropriately selected as needed. The plurality of structures $3_2$ and structures $3_3$ are arranged, for example, to form a plurality of rows of tracks T on the surface of the substrate 2. The plurality of structures $3_2$ and structures $3_3$ arranged to form the plurality of rows of tracks T may form, for example, a predetermined regular arrangement pattern such as a tetragonal lattice pattern or a hexagonal lattice pattern. The heights of the structures $3_2$ and $3_3$ may regularly or irregularly change on the surface of the substrate 2.

It is preferable that an undercoat layer be provided between the substrate 2 and the shape layer 6 in order to improve an adhesion layer therebetween. As the undercoat layer, for example, an acrylic-based surface treatment agent or a silane coupling agent may be used.

The shape layer 6 is formed by curing the energy ray-curable resin composition. It is preferable that the shape layer 6 be formed by a curing reaction such as polymerization performed on the energy ray-curable resin composition applied onto the substrate 2 in a direction from the opposite side to the substrate 2. This is because a substrate having impenetrability to the energy rays can be used as the substrate 2 for the above reason. It is preferable that the transfer regions $T_E$ are connected without causing inconsistency in the curing degree of the energy ray-curable resin composition. The inconsistency in the curing degree of the energy ray-curable resin composition is, for example, a difference in degree of polymerization.

The energy ray-curable resin composition is a resin composition which can be cured by being irradiated with energy rays. The energy rays represent energy rays such as electron rays, ultraviolet rays, infrared rays, laser beams, visible rays, ionizing radiation (X-rays, α-rays, β-rays, γ-rays, and the like), microwaves, or high-frequency waves, which trigger radical, cationic, and anionic polymerizations. The energy ray-curable resin composition may be mixed with another resin to be used as needed and may also be mixed with another curable resin such as a thermosetting resin to be used. The energy ray-curable resin composition may also be an organic-inorganic hybrid material. Otherwise, two or more types of energy ray-curable resin compositions may be mixed to be used. As the energy ray-curable resin composition, an ultraviolet ray-curable resin which is cured by ultraviolet rays is preferably used. As the ultraviolet ray-curable resin, for example, an acrylate-based, methacrylate-based, or epoxy-based ultraviolet ray-curable resin may be used.

In addition, as the material of the shape layer 6, in addition to the above-described energy ray-curable resin composition, a material which can obtain an inorganic film after being baked, for example, perhydropolysilazane having heat resistance, a silicon-based resin material, or the like may be used.

Furthermore, the energy ray-curable resin composition may contain a filler, a functional additive, a solvent, an inorganic material, a pigment, an antistatic agent, a sensitizing dye, or the like as needed. As the filler, for example, any of inorganic fine particles and organic fine particles may be used. Examples of the inorganic fine particles include metal oxide fine particles such as $SiO_2$, $TiO_2$, $ZrO_2$, $SnO_2$, and $Al_2O_3$. Examples of the functional additive include a leveling agent, a surface adjusting agent, an absorbent, and an anti-foaming agent.

[Configuration of Transfer Apparatus]

Figure 26:
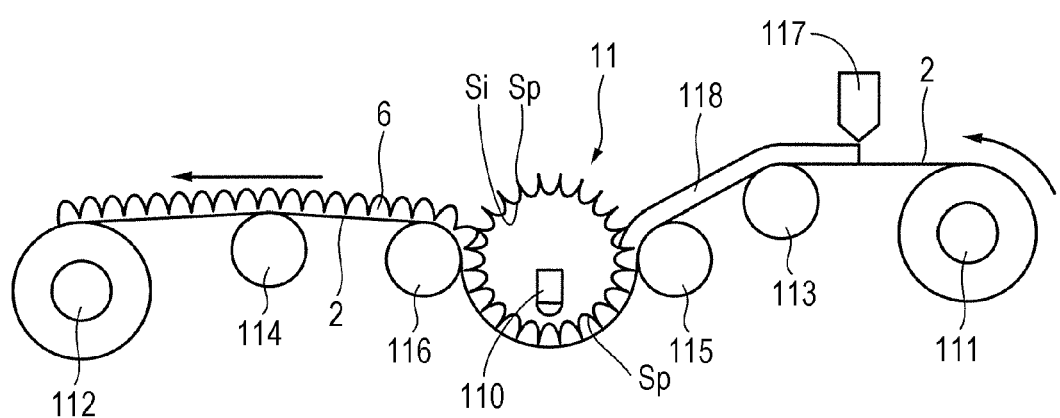
FIG. 26 is a schematic view illustrating an example of the configuration of a transfer apparatus according to the seventh embodiment of the present technology.

FIG. 26 is a schematic view illustrating an example of the configuration of a transfer apparatus according to the seventh embodiment of the present technology. The transfer apparatus includes a roll master copy 11, a substrate supply roll 111, a winding roll 112, guide rolls 113 and 114, a nip roll 115, a peeling roll 116, an applying device 117, and an energy ray source 110.

The substrate supply roll 111 is disposed so that the substrate 2 having a sheet shape or the like is wound around the substrate supply roll 111 in a roll shape and the substrate 2 is continuously fed via the guide roll 113. The winding roll 112 is disposed so that the substrate 2 having the shape layer 6 to which an even shape is transferred by the transfer apparatus is wound around the winding roll 112. The guide rolls 113 and 114 are disposed on the transport path in the transfer apparatus so as to transport the band-like substrate 2. The nip roll 115 is disposed so that the substrate 2 which is fed from the substrate supply roll 111 and to which the energy ray-curable resin composition is applied is nipped between the nip roll 115 and the roll master copy 11. The roll master copy 11 has a transfer surface for forming the shape layer 6 and includes a single or a plurality of energy ray sources 110 therein. Details of the roll master copy 11 will be described later. The peeling roll 116 is disposed to peel off the shape layer 6 obtained by curing the energy ray-curable resin composition 118 from the transfer surface of the roll master copy 11.

The materials of the substrate supply roll 111, the winding roll 112, the guide rolls 113 and 114, the nip roll 115, and the peeling roll 116 are not particularly limited, and metal such as stainless, rubber, silicone, or the like may be appropriately selected according to the desired roll characteristics for use. As the applying device 117, for example, a device having an applying unit such as a coater may be used. As the coater, for example, in consideration of the properties of the energy ray-curable resin composition to be applied, a coater such as a gravure coater, a wire bar, or a die coater may be appropriately used.

[Configuration of Roll Master Copy]

The roll master copy 11 is, for example, a master copy having a cylindrical shape, and includes a transfer surface Sp formed on the front surface and a rear surface Si which is the inner circumferential surface formed on the inside on the opposite side to the front surface. In the roll master copy 11, for example, a columnar hollow portion is formed by the rear surface Si, and a single or a plurality of energy ray sources 110 may be included in the hollow portion. On the transfer surface Sp, for example, a plurality of concave or convex structures are formed, and by transferring the shapes of the structures to the energy ray-curable resin composition applied onto the substrate 2, the shape layer 6 is formed on the surface of the substrate 2. That is, on the transfer surface Sp, a pattern having an inverted shape of the uneven shape of the shape layer 6 of the substrate 2 is formed.

The roll master copy 11 is configured to have penetrability to energy rays emitted by the energy ray source 110 so that the energy rays which are emitted by the energy ray source 110 and are incident onto the rear surface Si to pass through the transfer surface Sp. An energy ray-curable resin composition 118 applied onto the substrate 2 is cured by the energy rays that pass through the transfer surface Sp. The material of the roll master copy 11 is not particularly limited as long as the material has penetrability to energy rays. As the material having penetrability to ultraviolet rays, glass, quartz, a transparent resin, an organic-inorganic hybrid material, or the like is preferably used. Examples of the transparent resin include polymethyl methacrylate (PMMA) and polycarbonate (PC). Examples of the organic-inorganic hybrid material include polydimethylsiloxane (PDMS). On at least one of the transfer surface Sp and the rear surface Si of the roll master copy 11, a metal film having transparency, a metal compound film, or an organic film may be formed.

The single or the plurality of energy ray sources 110 are supported in the hollow portion of the roll master copy 11 so as to emit the energy rays toward the energy ray-curable resin composition 118 applied on the substrate 2. In a case where the roll master copy 11 includes the plurality of energy ray sources 110, the energy ray sources 110 be preferably arranged to form one row or two or more rows. The energy ray source may be an energy ray source which emits energy rays such as electron rays, ultraviolet rays, infrared rays, laser beams, visible rays, ionizing radiation (X-rays, α-rays, β-rays, γ-rays, and the like), microwaves, or high-frequency waves, and is not particularly limited. As the form of the energy ray source, for example, a point light source or a linear light source may be used. However, the form is not particularly limited thereto, and a combination of the point light source and the linear light source may also be used. In a case where the point light source is used as the energy ray source, a plurality of point light sources are preferably arranged in a straight line shape to form a linear light source. The linear light source is preferably arranged in parallel to the rotating shaft of the roll master copy 11. Examples of the energy ray source that emits ultraviolet rays include a low-pressure mercury lamp, a high-pressure mercury lamp, a short arc discharge lamp, an ultraviolet ray-emitting diode, a semiconductor laser, a fluorescent light, an organic electroluminescence device, an inorganic electroluminescence device, a light-emitting diode, and an optical fiber. However, the energy ray source is not particularly limited thereto. Furthermore, a slit may further be provided in the roll master copy 11 so that the energy rays emitted by the energy ray source 110 irradiate the energy ray-curable resin composition 118 via the slit. At this time, the energy ray-curable resin composition 118 may be cured by heat generated by absorbing the energy rays.

In the seventh embodiment, configurations other than the above-described configurations are the same as those of the first embodiment.

[Method of Manufacturing Conductive Element]

FIGS. 27A to 27E are process diagrams illustrating an example of a method of manufacturing the conductive element according to the seventh embodiment of the present technology.

Figure 27:
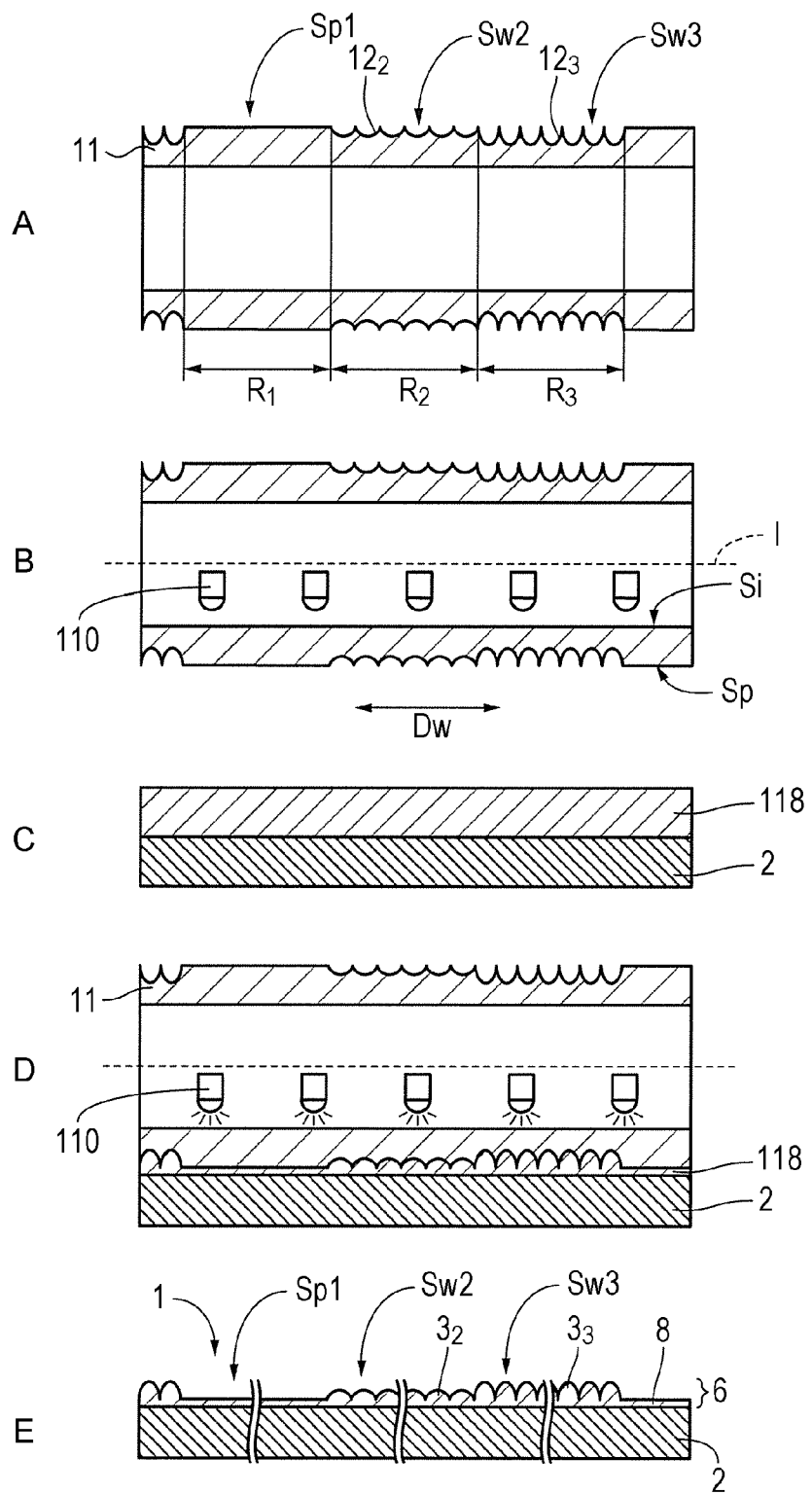
FIGS. 27A to 27E are process diagrams illustrating an example of a method of manufacturing the conductive element according to the seventh embodiment of the present technology.

First, processes from the "resist forming process" to the "etching process" are performed in the same manner as those of the first embodiment described above, thereby producing the roll master copy 11 illustrated in FIG. 27A.

(Ray Source Arranging Process)

Next, as illustrated in FIG. 27B, the single or the plurality of energy ray sources 110 are arranged in the accommodation space (hollow portion) in the roll master copy 11. It is preferable that the energy ray sources 110 be arranged in parallel to a width direction Dw of the roll master copy 11 or the axial direction of the rotating shaft 1.

(Undercoat Layer Forming Process)

Next, as needed, on the surface of the substrate 2 to which the energy ray-curable resin composition 118 is applied, a surface treatment such as a corona treatment, a plasma treatment, a flame treatment, a UV treatment, an ozone treatment, or a blast treatment is performed. Next, a surface treatment agent is applied to the surface of the substrate 2 and is dried and/or cured as needed, thereby forming the undercoat layer on the surface of the substrate 2. As the surface treatment agent, for example, a treatment solution obtained by diluting an acrylic-based surface treatment agent or the like with butyl acetate, or a silane coupling agent may be used.

(Transferring Process)

Next, as illustrated in FIG. 27C, the energy ray-curable resin composition 118 is applied or printed on the substrate 2 which is long or on the roll master copy 11. An application method is not particularly limited, and for example, on the substrate or the master copy, potting, a spin coating method, a gravure coating method, a die coating method, a bar coating method, or the like may be used. As a printing method, for example, a relief printing method, an offset printing method, a gravure printing method, an intaligo printing method, a rubber plate printing method, or a screen printing method may be used. Next, as needed, a heating treatment such as solvent removal or pre-baking may be performed.

Next, as illustrated in FIG. 27D, the transfer surface Sp is brought into close contact with the energy ray-curable resin composition 118 while rotating the roll master copy 11, and the energy rays emitted by the energy ray source 110 in the roll master copy 11 are allowed to irradiate the energy ray-curable resin composition 118 from the side of the transfer surface Sp of the roll master copy 11. Accordingly, the energy ray-curable resin composition 118 is cured, thereby forming the shape layer 6. Specifically, the curing reaction of the energy ray-curable resin composition 118 sequentially proceeds toward the surface side of the substrate 2 from the transfer surface Sp side of the roll master copy 11, and the entirety of the applied or printed energy ray-curable resin composition 118 is cured, thereby forming the shape layer 6. Absence or presence of the base layer 8, or the thickness of the base layer 8 may be selected by, for example, adjusting the pressure of the roll master copy 11 against the surface of the substrate 2. Next, the shape layer 6 formed on the substrate 2 is peeled off from the transfer surface Sp of the roll master copy 11. Accordingly, as illustrated in FIG. 27E, the shape layer 6 is formed on the surface of the substrate 2. In the transferring process, in the above-described manner, the uneven shape is transferred while the longitudinal direction of the band-like substrate 2 serves as the rotation direction of the roll master copy 11. Thereafter, a treatment such as post-curing may also be performed.

Here, the transferring process which uses the transfer apparatus illustrated in FIG. 26 will be described in detail.

First, the long substrate 2 is fed from the substrate supply roll 111, and the fed substrate 2 passes below the applying device 117. Next, the energy ray-curable resin composition 118 is applied by the applying device 117 onto the substrate 2 which passes below the applying device 117. Next, the substrate 2 to which the energy ray-curable resin composition 118 is applied is transported to the roll master copy 11 via the guide roll 113.

Next, the transported substrate 2 is nipped between the roll master copy 11 and the nip roll 115 so as not to allow bubbles to infiltrate between the substrate 2 and the energy ray-curable resin composition 118. Thereafter, the substrate 2 is transported along the transfer surface Sp of the roll master copy 11 while the energy ray-curable resin composition 118 is brought into close contact with the transfer surface Sp of the roll master copy 11, and the energy rays emitted by the single or the plurality of energy ray sources 110 are allowed to irradiate the energy ray-curable resin composition 118 via the transfer surface Sp of the roll master copy 11. Accordingly, the energy ray-curable resin composition 118 is cured, thereby forming the shape layer 6. Next, the shape layer 6 is peeled off from the transfer surface Sp of the roll master copy 11 by the peeling roll 116, thereby obtaining the long substrate 2 which has the shape layer 6 formed therein. Next, the obtained substrate 2 is transported toward the winding roll 112 via the guide roll 114, and the long substrate 2 is wound around the winding roll 112. Accordingly, a master copy around which the long substrate 2 is wound is obtained.

Next, processes from the "laminated film forming process" to the "cleaning process" are performed in the same manner as those of the first embodiment described above, thereby obtaining the band-like conductive element 10 illustrated in FIG. 24A. Next, as needed, by punching the band-like conductive element 10 into predetermined shapes, the conductive elements 1 are obtained.

Here, the substrate 2 may not be wound in the "transferring process" and processes from the "laminated film forming process" to the "cleaning process" may also be subjected to roll-to-roll to be continuously performed.

In addition, the conductive elements 1 according to the second to fifth embodiments which are described above and according to tenth to eleventh embodiments which will be described below may employ the configuration of the substrate 2 in the seventh embodiment. When the configuration is employed, as a method of manufacturing the conductive element, the method of manufacturing a conductive element in the seventh embodiment is preferably used.

8. Eighth Embodiment

Figure 28:
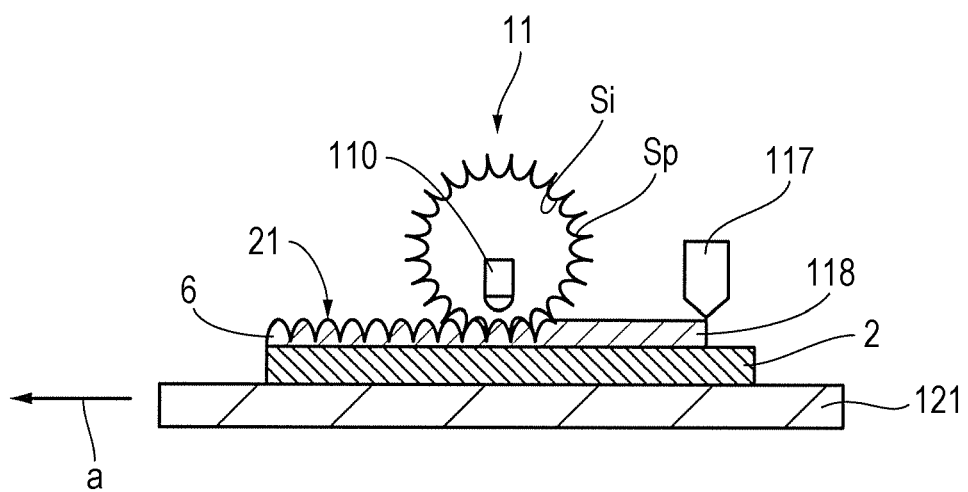
FIG. 28 is a schematic view illustrating an example of the configuration of a transfer apparatus according to an eighth embodiment of the present technology.

FIG. 28 is a schematic view illustrating an example of the configuration of a transfer apparatus according to an eighth embodiment of the present technology. The transfer apparatus includes a roll master copy 11, an applying device 117, and a transporting stage 121. In the eighth embodiment, like elements as those of the seventh embodiment are denoted by like reference numerals, and description thereof will be omitted. The transporting stage 121 is configured to transport a substrate 2 placed on the transporting stage 121 in the direction of the arrow a.

Next, an example of the operation of the transfer apparatus having the above configuration will be described.

First, an energy ray-curable resin composition 118 is applied by the applying device 117 onto the substrate 2 which passes below the applying device 117. Next, the substrate 2 to which the energy ray-curable resin composition 118 is applied is transported to the roll master copy 11. Next, the energy ray-curable resin composition 118 is transported while being brought into close contact with a transfer surface Sp of the roll master copy 11, and energy rays emitted by a single or a plurality of energy ray sources 110 provided in the roll master copy 11 are allowed to irradiate the energy ray-curable resin composition 118 via the transfer surface Sp of the roll master copy 11. Accordingly, the energy ray-curable resin composition 118 is cured, thereby forming the shape layer 6. Next, by transporting the transporting stage in the direction of the arrow a, the shape layer 6 is peeled off from the transfer surface Sp of the roll master copy 11. Accordingly, the substrate 2 which has the shape layer 6 formed therein and is long is obtained. Next, as needed, the desired substrate 2 is obtained in the above-described manner.

9. Ninth Embodiment

Figure 29:
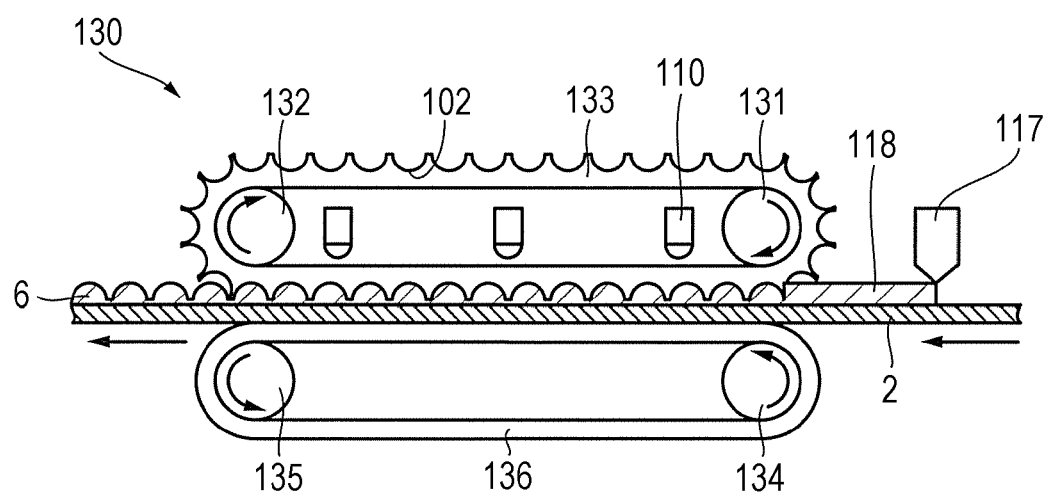
FIG. 29 is a schematic view illustrating an example of the configuration of a transfer apparatus according to a ninth embodiment of the present technology.

FIG. 29 is a schematic view illustrating an example of the configuration of a transfer apparatus according to a ninth embodiment of the present technology. The transfer apparatus includes rolls 131, 132, 134, and 135, an embossing belt 133 which is a belt master copy, a flat belt 136, a single or a plurality of energy ray sources 110, and an applying device 117. In the ninth embodiment, like elements as those of the seventh embodiment are denoted by like reference numerals, and description thereof will be omitted.

The embossing belt 133 is an example of a belt master copy, has an annular shape, and has a plurality of structures that are, for example, two-dimensionally arranged on the outer circumferential surface. The embossing belt 133 has penetrability to energy rays. The flat belt 136 has an annular shape and the outer circumferential surface thereof is a flat surface. A gap of about the thickness of a substrate 2 is formed between the embossing belt 133 and the flat belt 136 so that the substrate 2 to which an energy ray-curable resin composition 118 is applied can travel between the belts.

The rolls 131 and 132 are disposed to be separated from each other, and the inner circumferential surface of the embossing belt 133 is supported by the rolls 131 and 132 so that the embossing belt 133 is held in an elongated oval shape. By rotating the rolls 131 and 132 disposed on the inside of the embossing belt 133, the embossing belt 133 rotates.

The roll 134 and the roll 135 are disposed to respectively oppose the roll 131 and the roll 132. The inner circumferential surface of the flat belt 136 is supported by the rolls 134 and 135 so that the flat belt 136 is held in an elongated oval shape. By rotating the rolls 134 and 135 disposed on the inside of the flat belt 136, the flat belt 136 rotates.

On the inside of the embossing belt 133, the single or the plurality of energy ray sources 110 are disposed. The single or the plurality of energy ray sources 110 are held to emit energy rays toward the substrate 2 that travels between the embossing belt 133 and the flat belt 136. It is preferable that the energy ray source 110 such as a linear light source be disposed in parallel to the width direction of the embossing belt 133. The position of the disposed energy ray source 110 is not particularly limited as long as it is disposed in a space formed by the inner circumferential surface of the embossing belt 133. For example, the energy ray source 110 may be disposed in the inner portion of at least one of the roll 131 and the roll 132. In this case, it is preferable that the roll 131 and the roll 132 be formed of a material having penetrability to the energy rays.

Next, an example of the operation of the transfer apparatus having the above configuration will be described.

First, the energy ray-curable resin composition 118 is applied by the applying device 117 onto the substrate 2 which passes below the applying device 117. Next, the substrate 2 to which the energy ray-curable resin composition 118 is applied is transported into a gap between the rotating embossing belt 133 and the flat belt 136 from the side of the rolls 131 and 134. Accordingly, the transfer surface of the embossing belt 133 comes into close contact with the energy ray-curable resin composition 118. Next, while maintaining the close contact state, the energy rays emitted by the energy ray source 110 is allowed to irradiate the energy ray-curable resin composition 118 via the embossing belt 133. Accordingly, the energy ray-curable resin composition 118 is cured, thereby forming a shape layer 6 on the substrate 2. Next, the embossing belt 133 is peeled off from the shape layer 6. Accordingly, a desired substrate 2 is obtained.

10. Tenth Embodiment

FIG. 30A is a cross-sectional view illustrating a configuration example of a conductive element according to a tenth embodiment of the present technology. The conductive element 1 according to the tenth embodiment is different from that of the first embodiment in that a flat surface Sp1, a wavy surface Sw2, and a wavy surface Sw3 are formed on each of both principal surfaces of a substrate 2 and a conductive pattern portion is formed on each of both surfaces of the substrate. In FIG. 30A, the positions, areas, shapes, and arrangement order of the flat surfaces Sp1 and the wavy surfaces Sw2 and Sw3 are the same on both principal surfaces of the substrate. However, the positions, areas, shapes, and arrangement order of the flat surfaces Sp1 and the wavy surfaces Sw2 and Sw3 on both principal surfaces of the substrate are not limited to the above example and may be set to desired positions, areas, shapes, and arrangement order depending on the design of circuits and elements.

In addition, as illustrated in FIG. 30B, a through-hole is formed in the flat surface Sp1 of the substrate 2, and a conductive material 7 such as a conductive ink is buried into the through-hole so that the conductive pattern portions such as circuits formed on both surfaces of the substrate 2 are electrically connected to each other. The through-hole is not limited to the flat surface Sp1 and may also be provided in the wavy surface Sw2. In a case where the flat surface Sp1 and the wavy surface Sw2 are provided to oppose each other on both principal surfaces of the substrate 2, the flat surface Sp1 and the wavy surface Sw2 are penetrated by the through-hole so that the conductive pattern portions formed on both surfaces of the substrate 2 are electrically connected to each other.

The substrate 2 having the above-described configuration may be produced, for example, as follows. First, while the band-like substrate 2 is transported, the energy ray-curable resin composition is applied to both surfaces thereof. Next, the transfer surface of a rotating master copy (for example, a roll master copy or a belt master copy) disposed on both surfaces of the substrate 2 is brought into close contact with the energy ray-curable resin composition, and energy rays from an energy ray source in the rotating master copy are allowed to irradiate the energy ray-curable resin composition. Accordingly, the energy ray-curable resin composition is cured, thereby forming a shape layer 6 on both surfaces of the substrate 2. In addition, two rotating master copies may be disposed to oppose each other with the substrate 2 interposed therebetween so that the shapes thereof are transferred onto the energy ray-curable resin composition while the substrate 2 is nipped between the two master copies.

In the tenth embodiment, since the conductive pattern portions are formed on both surfaces of the substrate 2, a larger number of circuits than those in the first embodiment may be mounted in the conductive element 1.

11. Eleventh Embodiment

Figure 31:
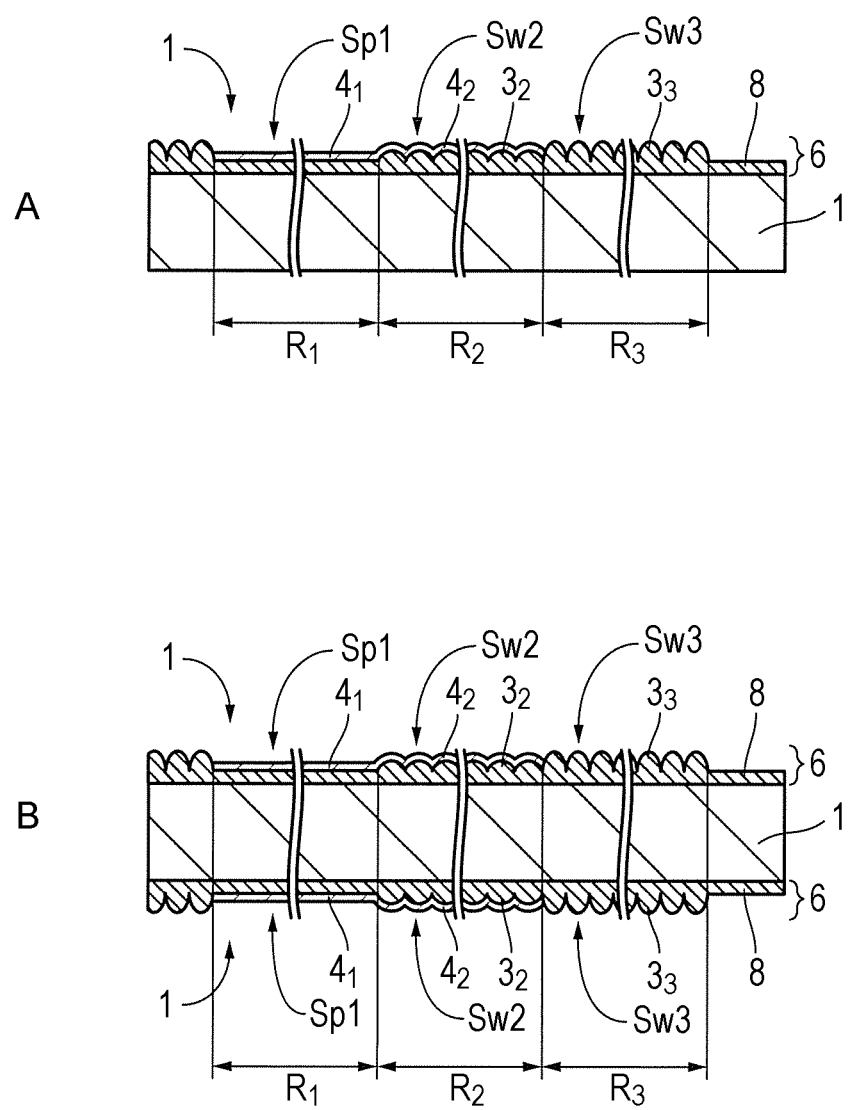
FIGS. 31A and 31B are cross-sectional views respectively illustrating a first example and a second example of a substrate provided in a conductive element according to an eleventh embodiment of the present technology.

FIG. 31A is a cross-sectional view illustrating a first example of a substrate provided in a conductive element according to an eleventh embodiment of the present technology. FIG. 31B is a cross-sectional view illustrating a second example of the substrate provided in the conductive element according to the eleventh embodiment of the present technology. A conductive element 1 according to the eleventh embodiment is different from the conductive element 1 according to the first or tenth embodiment in that a shape layer 6 has impenetrability to energy rays. Structures 3 having such impenetrability can be formed by, for example, adding an energy ray-curable resin composition to a material such as a pigment that absorbs the energy rays.

The eleventh embodiment is the same as the first or tenth embodiment except for the above features.

12. Twelfth Embodiment

Figure 33:
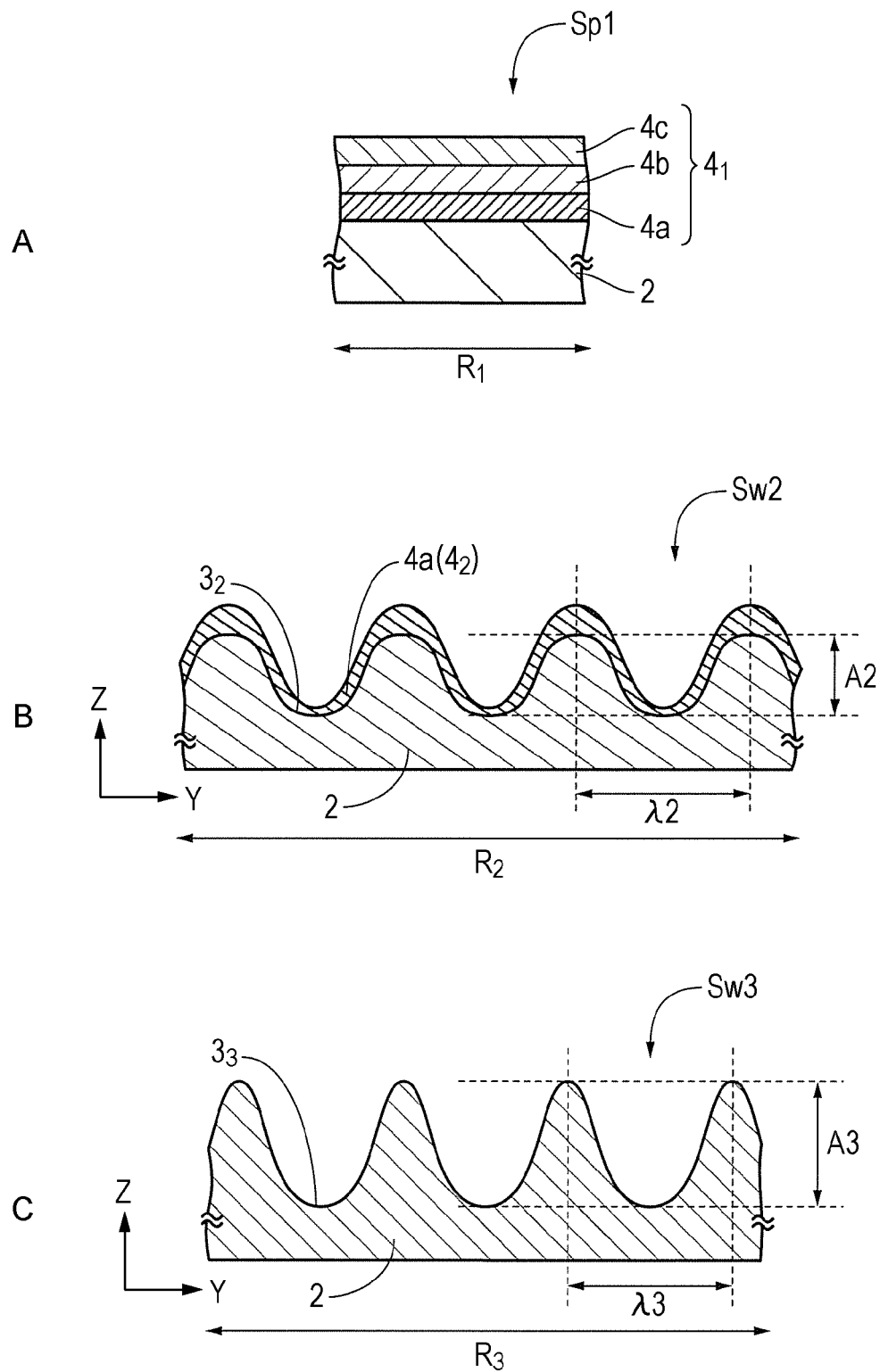
FIG. 33A is an enlarged cross-sectional view illustrating a part of a first region illustrated in FIG. 32B.
FIG. 33B is an enlarged cross-sectional view illustrating a part of a second region illustrated in FIG. 32B.
FIG. 33C is an enlarged cross-sectional view illustrating a part of a third region illustrated in FIG. 32B.

FIG. 32A is a plan view illustrating a configuration example of a conductive element according to a twelfth embodiment of the present technology. FIG. 32B is a cross-sectional view taken along the line B-B illustrated in FIG. 32A. FIG. 33A is an enlarged cross-sectional view illustrating a part of a first region illustrated in FIG. 32B. FIG. 33B is an enlarged cross-sectional view illustrating a part of a second region illustrated in FIG. 32B. FIG. 33C is an enlarged cross-sectional view illustrating a part of a third region illustrated in FIG. 32B. A conductive element 1 according to the twelfth embodiment is different from that of the first embodiment in that structures $3_1$ and structures $3_2$ are concave with respect to the surface of a substrate 2. In addition, among the structures $3_2$ and the structures $3_3$, one thereof may be concave while the other thereof are convex. In a second region $R_2$ and a third region $R_3$, the structures $3_1$ and $3_2$ which have concave and convex shapes may be mixed.

The twelfth embodiment is the same as the first embodiment except for the above features.

In the twelfth embodiment, the shapes of the convex structures $3_2$ and $3_3$ in the first embodiment are inverted into concave shapes, and thus the same effect as that of the first embodiment can be obtained.

EXAMPLES

Hereinafter, the present technology will be described in detail according to Examples, but the present technology is not limited only to the Examples.

In the following Examples, Comparative Examples, and Reference Examples, the surface resistance of a conductive sheet was measured by a four-terminal resistance measuring device. In addition, the diameter of a probe tip needle was R100 μm, and the pitch of the needle was 1 mm.

Example 1

Transfer Process

Figure 34:
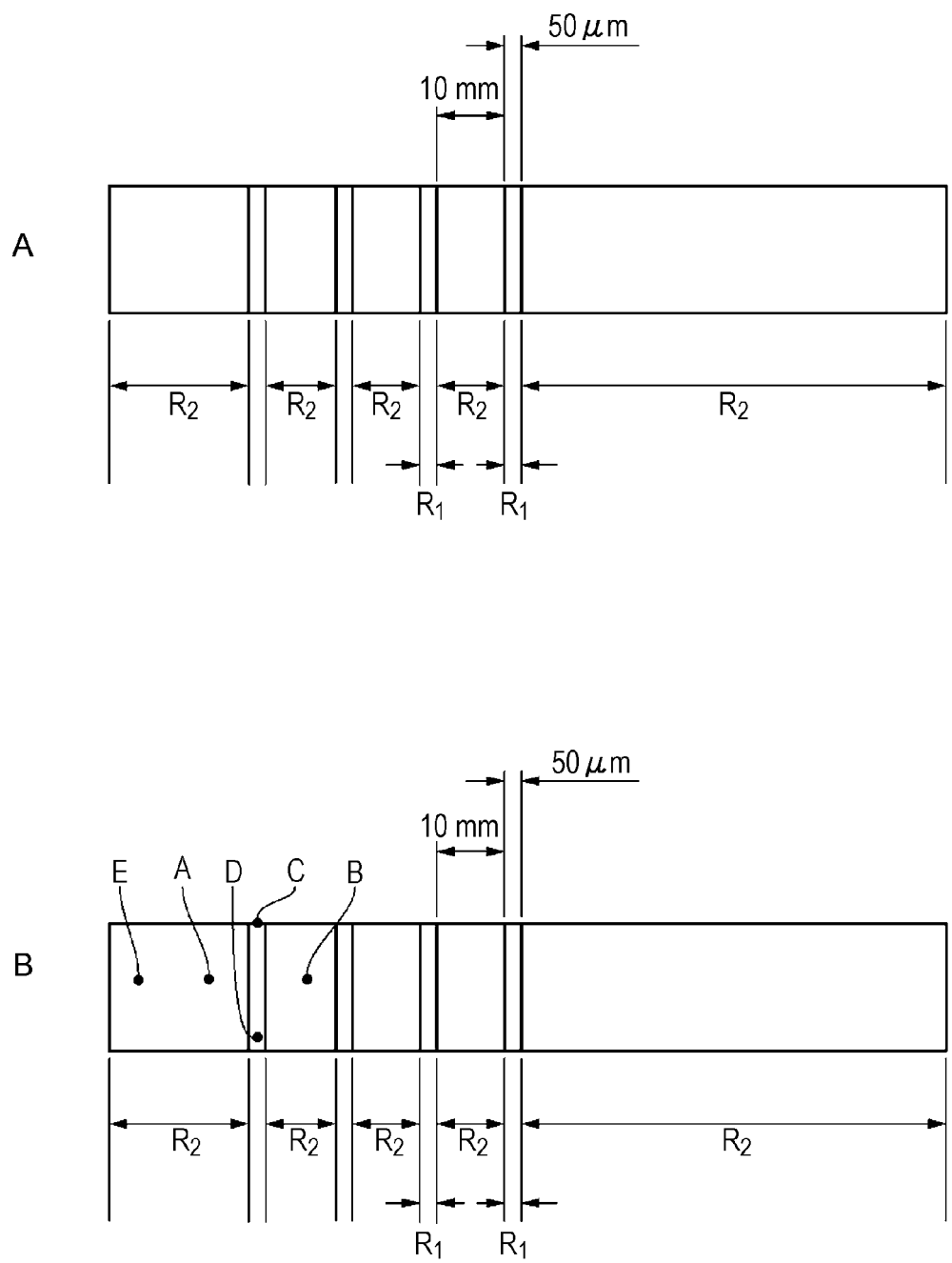
FIG. 34A is a schematic view illustrating a molding surface of a roll master copy used for producing a transparent conductive sheet according to Example 1.
FIG. 34B is a schematic view illustrating conduction/non-conduction evaluation points of the transparent conductive sheet according to Example 1.

First, as illustrated in FIG. 34A, a roll master copy in which a flat surface region (first region) $R_1$ and a nanostructure forming region (second region) $R_2$ were formed in a stripe pattern on a molding surface was prepared. Next, a plurality of UV light sources were arranged in a hollow portion of the roll master copy.

Next, a surface treatment solution was prepared by diluting a silane coupling agent with butyl acetate. Next, the surface of a sheet made of polyimide was treated by the prepared surface treatment solution, thereby forming an undercoat layer.

Next, an ultraviolet ray-curable resin was applied onto the surface of the sheet provided with the undercoat layer. Next, while the roll master copy was rotated, the transfer surface thereof was brought into close contact with the sheet to which the ultraviolet ray-curable resin was applied, and the ultraviolet ray-curable resin was irradiated by ultraviolet rays at a power of 100 mJ/cm$^2$ from the side of the transfer surface of the roll master copy so as to be cured and peeled off. Accordingly, an optical sheet in which a number of convex nanostructures were formed in the nanostructure forming region (second region) $R_2$ and a flat surface is formed in the flat surface region (first region) $R_1$ on the surface of the sheet was obtained. The arrangement pitch of the structures was 250 nm, the height of the structure was 200 nm, the shape of the structure was a truncated cone shape, and the arrangement of the structures was a hexagonal lattice arrangement.

(Film Forming Process)

Next, an ITO layer was formed on the molding surface of the optical sheet by a sputtering method. An arrival vacuum degree was 0.00015 Pa, a vacuum degree during film forming was 0.24 Pa, and Ar gas and $O_2$ gas was introduced during the film forming so that the mixing ratio thereof was Ar:$O_2$=200:13. In addition, film forming conditions were adjusted so that the film thickness in terms of flat plate became 30 nm. In addition, the film thickness in terms of flat plate became substantially the same as the film thickness of the apex portion of the structure.

(Annealing Process)

Next, annealing was performed on the optical sheet having the ITO layer formed therein, in the atmosphere at 150° C. for 30 minutes. Accordingly, forming a polycrystal in the ITO layer was accelerated. Next, in order to check the accelerated state, the ITO layer was measured by X-ray diffraction (XRD), and a peak of $In_2O_3$ was confirmed.

(Removing Process)

Next, the optical sheet subjected to the annealing process was immersed into a solution with a PH of about 3 for 20 seconds.

(Cleaning Process)

Next, the optical sheet subjected to the removing process was cleaned by pure water.

Accordingly, a target transparent conductive sheet was obtained.

(Conduction/Non-Conduction Evaluation)

Regarding the surface of the transparent conductive sheet according to Example 1 obtained as described above, conduction or non-conduction was evaluated from points illustrated in FIG. 34B using a tester. The evaluation results are shown in Table 1.

Table 1 shows the evaluation results of the transparent conductive sheet according to Example 1.

TABLE 1

|  | Between A-B | Between E-A | Between C-D |
| --- | --- | --- | --- |
| Example 1 | Insulated | Insulated | 2000 Ω (conductive) |

From Table 1, the following can be seen.

In the surface of the transparent conductive sheet, the nanostructure forming region (second region) $R_2$ is in an insulated state while the flat surface region (first region) $R_1$ is in a conductive state. Therefore, only by sequentially performing the transfer process (imprinting process), the film forming process, and the removing process, a desired conductive pattern portion such as wiring or an electrode can be formed on the substrate surface. That is, throughput can be enhanced.

(Adhesion)

The adhesion of the transparent conductive sheet according to Example 1 obtained as described above was evaluated. As a result, it could be seen that by providing an undercoat layer made of a silane coupling agent between a sheet made of polyimide and nanostructures made of an ultraviolet ray-curable resin, the adhesion between the two could be enhanced.

Here, although details have been omitted, even in a case where a sheet made of polyethylene naphthalate (PEN) or a cycloolefin copolymer (COC) was used, the adhesion between the sheet and nanostructures could be enhanced by providing an undercoat layer made of a silane coupling agent. In addition, even in a case where an acrylic-based surface treatment agent or a mixed agent thereof was used as the surface treatment agent instead of the silane coupling agent, the same effect was obtained in enhancing adhesion.

Example 2-1

Transfer Process

First, a roll master copy in which a flat surface region (first region) $R_1$ and a nanostructure forming region (second region) $R_2$ were formed in a stripe pattern on a molding surface was prepared. Next, a plurality of UV light sources were arranged in a hollow portion of the roll master copy.

Next, a surface treatment solution was prepared by diluting a silane coupling agent with butyl acetate. Next, the surface of a sheet made of polyimide was treated by the prepared surface treatment solution, thereby forming an undercoat layer.

Next, an ultraviolet ray-curable resin was applied onto the surface of the sheet provided with the undercoat layer. Next, while the roll master copy was rotated, the transfer surface thereof was brought into close contact with the sheet to which the ultraviolet ray-curable resin was applied, and the ultraviolet ray-curable resin was irradiated by ultraviolet rays at a power of 100 mJ/cm$^2$ from the side of the transfer surface of the roll master copy so as to be cured and peeled off. Accordingly, an optical sheet (nanoimprinted film) to which the first region and the second region of the roll master copy were transferred was produced.

(Shape Measurement)

Next, the average wavelength λm and the average width Am of vibrations of the transfer surface of the produced optical sheet were measured, and the ratio (Am/λm) was obtained from the measured values. The results are shown in Table 2.

(Film Forming Process)

Next, an ITO layer was formed on the molding surface of the optical sheet by a sputtering method.

Film forming conditions during the forming of the ITO layer are shown below.

Arrival vacuum degree: 0.00015 Pa
Vacuum degree during film forming: 0.24 Pa
Gas type: mixed gas of Ar gas and $O_2$ gas
Mixing ratio of mixed gas (volume ratio): Ar:$O_2$=200:13
Film thickness in terms of flat plate: 36 nm Here, the film thickness in terms of flat plate is a film thickness when an ITO layer is formed on a flat plate under the same conditions as those when an ITO layer is formed on the surface of an optical sheet and is substantially equal to the film thickness of the apex portion of a wavy surface.

Next, while a vacuum state was maintained, an Ag layer was formed on the ITO layer by a sputtering method.

Film forming conditions during the forming of the Ag layer are shown below.

Vacuum degree during film forming: 0.11 Pa
Gas type: Ar gas
Gas flow rate: 100 sccm
Film thickness in terms of flat plate: 200 nm
(Surface Resistance Measurement)

Next, the surface resistance of the optical sheet produced as described above was measured. The results are shown in Table 2.

(Removing Process)

Next, the optical sheet was immersed into a solution with a PH of about 3 for 20 seconds.

(Cleaning Process)

Next, the optical sheet was cleaned by pure water. Accordingly, a target conductive sheet was produced.

(Surface Resistance Measurement)

Next, the surface resistance of the conductive sheet produced as described above was measured. The results are shown in Table 2.

Example 2-2

Transfer Process

First, a roll master copy in which a flat surface region (first region) $R_1$ and a nanostructure forming region (second region) $R_2$ were formed in a stripe pattern on a molding surface was prepared. Next, a plurality of UV light sources were arranged in a hollow portion of the roll master copy.

Next, a surface treatment solution was prepared by diluting a silane coupling agent with butyl acetate. Next, the surface of a sheet made of polyimide was treated by the prepared surface treatment solution, thereby forming an undercoat layer.

Next, an ultraviolet ray-curable resin was applied onto the surface of the sheet provided with the undercoat layer. Next, while the roll master copy was rotated, the transfer surface thereof was brought into close contact with the sheet to which the ultraviolet ray-curable resin was applied, and the ultraviolet ray-curable resin was irradiated by ultraviolet rays at a power of 100 mJ/cm$^2$ from the side of the transfer surface of the roll master copy so as to be cured and peeled off. Accordingly, an optical sheet (nanoimprinted film) to which the first region and the second region of the roll master copy were transferred was produced.

(Shape Measurement)

Next, the average wavelength λm and the average width Am of vibrations of the transfer surface of the produced optical sheet were measured, and the ratio (Am/λm) was obtained from the measured values. The results are shown in Table 3.

(Film Forming Process)

Next, an ITO layer was formed on the molding surface of the optical sheet by a sputtering method.

Film forming conditions during the forming of the ITO layer are shown below.
Arrival vacuum degree: 0.00015 Pa
Vacuum degree during film forming: 0.24 Pa
Gas type: mixed gas of Ar gas and O$_2$ gas
Mixing ratio of mixed gas (volume ratio): Ar:O$_2$=200:13
Film thickness in terms of flat plate: 40 nm
Here, the film thickness in terms of flat plate is a film thickness when an ITO layer is formed on a flat plate under the same conditions as those when an ITO layer is formed on the surface of an optical sheet and is substantially equal to the film thickness of the apex portion of a wavy surface.

Next, while a vacuum state was maintained, an Ag layer was formed on the ITO layer by a sputtering method.

Film forming conditions during the forming of the Ag layer are shown below.
Vacuum degree during film forming: 0.11 Pa
Gas type: Ar gas
Gas flow rate: 100 sccm
Film thickness in terms of flat plate: 200 nm
(Surface Resistance Measurement)

Next, the surface resistance of the optical sheet produced as described above was measured. The results are shown in Table 3.

(Removing Process)

Next, the optical sheet was immersed into a solution with a PH of about 3 for 60 seconds.

(Cleaning Process)

Next, the optical sheet was cleaned by pure water. Accordingly, a target conductive sheet was produced.

(Surface Resistance Measurement)

Next, the surface resistance of the conductive sheet produced as described above was measured. The results are shown in Table 3.

(Surface Observation)

Figure 35:
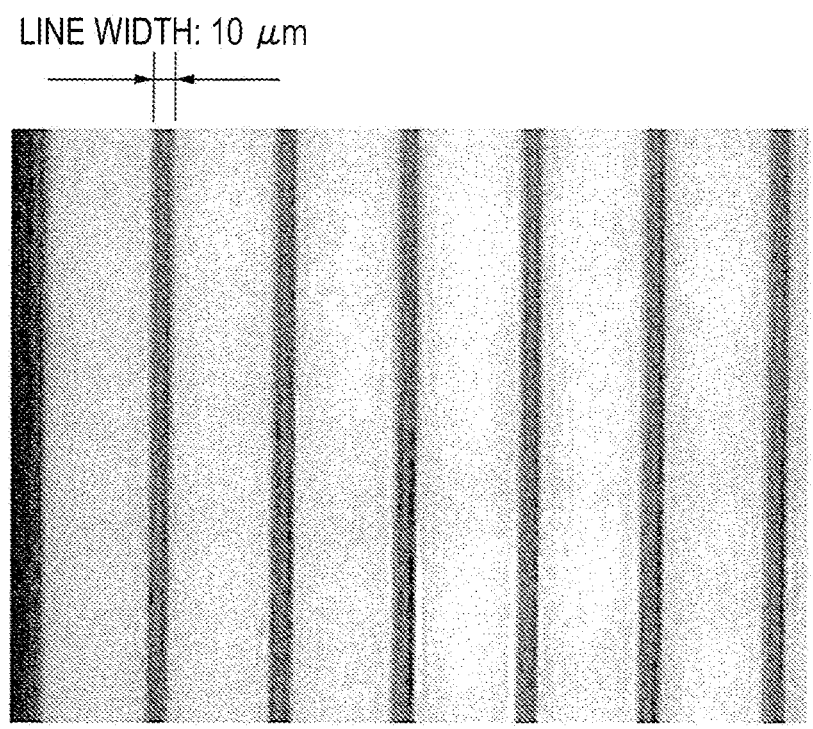
FIG. 35 is a view illustrating an image of the surface of a conductive sheet according to Example 2-2, which is observed by an optical microscope.

Next, the surface of the conductive sheet produced as described above was observed by using an optical microscope. The results are shown in FIG. 35.

Table 2 shows the measurement results of the conductive sheet according to Example 2-1.

TABLE 2

|  |  | Flat surface (First region) | Wavy surface (Second region) |
|---|---|---|---|
| Average wavelength λm (nm) | | — | 250 |
| Average width Am of vibrations (nm) | | — | 190 |
| Ratio (Am/λm) | | — | 0.76 |
| Layer configuration before removal | | ITO layer, Ag layer | |
| Surface resistance (Ω/□) | Before removal | 0.5 | 1.5 |
| | After removal | 0.5 | ∞ |

Table 3 shows the measurement results of the conductive sheet according to Example 2-2.

TABLE 3

|  |  | Flat surface (First region) | Wavy surface (Second region) |
|---|---|---|---|
| Average wavelength λm (nm) | | — | 300 |
| Average width Am of vibrations (nm) | | — | 300 |
| Ratio (Am/λm) | | — | 1 |
| Layer configuration before removal | | ITO layer, Ag layer | |
| Surface resistance (Ω/□) | Before removal | 0.5 | 1.5 |
| | After removal | 0.5 | ∞ |

The following can be seen from Tables 2 and 3.

In the surface of the conductive sheet, the ITO layer and the Ag layer are removed from the second region having the wavy surface in the removing process and an insulated state is achieved, while the ITO layer and the Ag layer are not removed from the first region having the flat surface in the removing process and the remaining conductive state is maintained.

Therefore, even in a case where the film configuration is a multi-layer structure for reducing electric resistance, removal selectivity can be secured, and thus the ITO layer and the Ag layer can be allowed to remain in the flat surface region. That is, wiring having a low resistance can be easily produced.

Example 2-3

First, a roll master copy in which a flat surface region (first region) $R_1$ and a nanostructure forming region (second region) $R_2$ were formed in a stripe pattern on a molding surface was prepared. Next, a plurality of UV light sources were arranged in a hollow portion of the roll master copy.

Next, a surface treatment solution was prepared by diluting a silane coupling agent with butyl acetate. Next, the surface of a sheet made of polyimide was treated by the prepared surface treatment solution, thereby forming an undercoat layer.

Next, an ultraviolet ray-curable resin was applied onto the surface of the sheet provided with the undercoat layer. Next, while the roll master copy was rotated, the transfer surface thereof was brought into close contact with the sheet to which the ultraviolet ray-curable resin was applied, and the ultraviolet ray-curable resin was irradiated by ultraviolet rays at a power of 100 mJ/cm² from the side of the transfer surface of the roll master copy so as to be cured and peeled off. Accordingly, an optical sheet (nanoimprinted film) to which the first region and the second region of the roll master copy were transferred was produced.

(Shape Measurement)

Next, the average wavelength λm and the average width Am of vibrations of the transfer surface of the produced optical sheet were measured, and the ratio (Am/λm) was obtained from the measured values. The results are shown in Table 4.

(Film Forming Process)

Next, an ITO layer was formed on the molding surface of the optical sheet by a sputtering method.

Film forming conditions during the forming of the ITO layer are shown below.

Arrival vacuum degree: 0.00015 Pa
   Vacuum degree during film forming: 0.24 Pa
   Gas type: mixed gas of Ar gas and $O_2$ gas
   Mixing ratio of mixed gas (volume ratio): Ar:$O_2$=200:13
   Film thickness in terms of flat plate: 36 nm Here, the film thickness in terms of flat plate is a film thickness when an ITO layer is formed on a flat plate under the same conditions as those when an ITO layer is formed on the surface of an optical sheet and is substantially equal to the film thickness of the apex portion of a structure.

Next, while a vacuum state was maintained, an Ag layer was formed on the ITO layer by a sputtering method.

Film forming conditions during the forming of the Ag layer are shown below.

Vacuum degree during film forming: 0.11 Pa
   Gas type: Ar gas
   Gas flow rate: 100 sccm
   Film thickness in terms of flat plate: 200 nm (Surface Resistance Measurement)

Next, the surface resistance of the optical sheet produced as described above was measured. The results are shown in Table 4.

(Removing Process)

Next, the optical sheet was immersed into a solution with a PH of about 3 for 20 seconds.

(Cleaning Process)

Next, the optical sheet was cleaned by pure water. Accordingly, a target conductive sheet was produced.

(Surface Resistance Measurement)

Next, the surface resistance of the conductive sheet produced as described above was measured. The results are shown in Table 4.

Table 4 shows the measurement results of the conductive sheet according to Example 2-3.

TABLE 4

| | First wavy surface (First region) | Second wavy surface (Second region) |
|---|---|---|
| Average wavelength λm (nm) | 270 | 250 |
| Average width Am of vibrations (nm) | 160 | 190 |
| Ratio (Am/λm) | 0.6 | 0.76 |
| Layer configuration before removal | ITO layer, Ag layer | |
| Surface resistance (Ω/□) Before removal | 1.3 | 1.5 |
| Surface resistance (Ω/□) After removal | 1.3 | ∞ |

The following can be seen from Table 4.

In the surface of the conductive sheet, the ITO layer and the Ag layer are removed from the second region having a high ratio (Am/λm=0.76) in the removing process and an insulated state is achieved. Contrary to this, the ITO layer and the Ag layer are not removed from the first region having a low ratio (Am/λm=0.6) in the removing process and the remaining conductive state is maintained.

Therefore, even in the case where the wavy surfaces are formed on both the first and second regions, removal selectivity can be secured by adjusting the ratio (Am/λm). Therefore, the ITO layer and the Ag layer can be allowed to remain in the first region having a low ratio (Am/λm=0.6). That is, wiring having a low resistance can be easily produced.

Example 3-1

Transfer Process

First, a roll master copy in which a flat surface region (first region) $R_1$ and a nanostructure forming region (second region) $R_2$ were formed in a stripe pattern on a molding surface was prepared. Next, a plurality of UV light sources were arranged in a hollow portion of the roll master copy.

Next, a surface treatment solution was prepared by diluting an acrylic-based surface treatment agent with butyl acetate. Next, the surface of a sheet made of polyimide was treated by the prepared surface treatment solution, thereby forming an undercoat layer.

Next, an ultraviolet ray-curable resin was applied onto the surface of the sheet provided with the undercoat layer. Next, while the roll master copy was rotated, the transfer surface thereof was brought into close contact with the sheet to which the ultraviolet ray-curable resin was applied, and the ultraviolet ray-curable resin was irradiated by ultraviolet rays at a power of 100 mJ/cm² from the side of the transfer surface of the roll master copy so as to be cured and peeled off. Accordingly, an optical sheet (nanoimprinted film) to which the first region and the second region of the roll master copy were transferred was produced.

(Shape Measurement)

Next, the average wavelength λm and the average width Am of vibrations of the transfer surface of the produced optical sheet were measured, and the ratio (Am/λm) was obtained from the measured values. The results are shown in Table 5.

(Film Forming Process)

Next, an ITO layer was formed on the molding surface of the optical sheet by a sputtering method.

Film forming conditions during the forming of the ITO layer are shown below.

Arrival vacuum degree: 0.00015 Pa
Vacuum degree during film forming: 0.24 Pa
Gas type: mixed gas of Ar gas and $O_2$ gas
Mixing ratio of mixed gas (volume ratio): $Ar:O_2=200:13$
Film thickness in terms of flat plate: 36 nm Here, the film thickness in terms of flat plate is a film thickness when an ITO layer is formed on a flat plate under the same conditions as those when an ITO layer is formed on the surface of an optical sheet and is substantially equal to the film thickness of the apex portion of a structure.

Next, while a vacuum state was maintained, an $SiO_2$ layer was formed on the ITO layer by a sputtering method.

Film forming conditions during the forming of the $SiO_2$ layer are shown below.

Vacuum degree during film forming: 0.28 Pa
Gas type: mixed gas of Ar gas and $O_2$ gas
Ar gas flow rate: 100 sccm
$O_2$ gas flow rate: 180 sccm
Film thickness in terms of flat plate: 5 nm (Surface Resistance Measurement)

Next, the surface resistance of the optical sheet produced as described above was measured. The results are shown in Table 5.

(Removing Process)

Next, the optical sheet was immersed into a solution with a PH of about 3 for 60 seconds.

(Cleaning Process)

Next, the optical sheet was cleaned by pure water. Accordingly, a target conductive sheet was produced.

(Surface Resistance Measurement)

Next, the surface resistance of the conductive sheet produced as described above was measured. The results are shown in Table 5.

Comparative Example 3-1

An optical sheet was produced in the same manner as in Example 3-1 except that the formation of the $SiO_2$ layer was omitted. In addition, the surface resistance of the optical sheet before and after the removing process was measured in the same manner as in Example 3-1. The results are shown in Table 6.

Table 5 shows the measurement results of the conductive sheet according to Example 3-1.

TABLE 5

|  |  | Flat surface (First region) | Wavy surface (Second region) |
|---|---|---|---|
| Average wavelength λm (nm) | | — | 250 |
| Average width Am of vibrations (nm) | | — | 160 |
| Ratio (Am/λm) | | — | 0.64 |
| Layer configuration before removal | | ITO layer, $SiO_2$ layer | |
| Surface resistance (Ω/□) | Before removal | 400 | 1800 |
| | After removal | 400 | ∞ |

Table 6 shows the measurement results of the optical sheet according to Comparative Example 3-1.

TABLE 6

|  |  | Flat surface (First region) | Wavy surface (Second region) |
|---|---|---|---|
| Average wavelength λm (nm) | | — | 250 |
| Average width Am of vibrations (nm) | | — | 160 |
| Ratio (Am/λm) | | — | 0.64 |
| Layer configuration before removal | | ITO layer | |
| Surface resistance (Ω/□) | Before removal | 400 | 1800 |
| | After removal | ∞ | ∞ |

The following can be seen from Tables 5 and 6.

In Example 3-1, in the surface of the conductive sheet, the ITO layer and the $SiO_2$ layer are removed from the second region having the wavy surface in the removing process and the insulated state is achieved, while the ITO layer and the $SiO_2$ layer are not removed from the first region having the flat surface in the removing process and the remaining conductive state is maintained.

In Comparative Example 3-1 in which only the ITO layer is formed, after the removing process is performed for 60 seconds, the ITO layer is removed and the insulated state is achieved regardless of the wavy surface or the flat surface.

Therefore, even in a case where a multi-layer structure in which the $SiO_2$ layer that is a resist layer is used instead of the Ag layer that is a metal layer, removal selectivity can be secured, and thus the ITO layer and the $SiO_2$ layer can be allowed to remain in the flat surface region. In addition, by laminating the $SiO_2$ layer on the ITO layer, the resistance of the ITO layer is enhanced during the removing process, and the removal selectivity can be dramatically enhanced.

Example 3-2

First, a roll master copy in which a flat surface region (first region) $R_1$ and a nanostructure forming region (second region) $R_2$ were formed in a stripe pattern on a molding surface was prepared. Next, a plurality of UV light sources were arranged in a hollow portion of the roll master copy.

Next, a surface treatment solution was prepared by diluting an acrylic-based surface treatment agent with butyl acetate. Next, the surface of a sheet made of polyimide was treated by the prepared surface treatment solution, thereby forming an undercoat layer.

Next, an ultraviolet ray-curable resin was applied onto the surface of the sheet provided with the undercoat layer. Next, while the roll master copy was rotated, the transfer surface thereof was brought into close contact with the sheet to which the ultraviolet ray-curable resin was applied, and the ultraviolet ray-curable resin was irradiated by ultraviolet rays at a power of 100 $mJ/cm^2$ from the side of the transfer surface of the roll master copy so as to be cured and peeled off. Accordingly, an optical sheet (nanoimprinted film) to which the first region and the second region of the roll master copy were transferred was produced.

(Shape Measurement)

Next, the average wavelength λm and the average width Am of vibrations of the transfer surface of the produced optical sheet were measured, and the ratio (Am/λm) was obtained from the measured values. The results are shown in Table 7.

(Film Forming Process)

Next, an ITO layer was formed on the molding surface of the optical sheet by a sputtering method.

Film forming conditions during the forming of the ITO layer are shown below.

Arrival vacuum degree: 0.00015 Pa
Vacuum degree during film forming: 0.24 Pa
Gas type: mixed gas of Ar gas and $O_2$ gas
Mixing ratio of mixed gas (volume ratio): Ar:$O_2$=200:13
Film thickness in terms of flat plate: 36 nm Here, the film thickness in terms of flat plate is a film thickness when an ITO layer is formed on a flat plate under the same conditions as those when an ITO layer is formed on the surface of an optical sheet and is substantially equal to the film thickness of the apex portion of a structure.

Next, while a vacuum state was maintained, an $SiO_2$ layer was formed on the ITO layer by a sputtering method.

Film forming conditions during the forming of the $SiO_2$ layer are shown below.

Vacuum degree during film forming: 0.28 Pa
Gas type: mixed gas of Ar gas and $O_2$ gas
Ar gas flow rate: 100 sccm
$O_2$ gas flow rate: 180 sccm
Film thickness in terms of flat plate: 5 nm (Surface Resistance Measurement)

Next, the surface resistance of the optical sheet produced as described above was measured. The results are shown in Table 7.

(Removing Process)

Next, the optical sheet was immersed into a solution with a PH of about 3 for 60 seconds.

(Cleaning Process)

Next, the optical sheet was cleaned by pure water. Accordingly, a target conductive sheet was produced.

(Surface Resistance Measurement)

Next, the surface resistance of the conductive sheet produced as described above was measured. The results are shown in Table 7.

Comparative Example 3-2

An optical sheet was produced in the same manner as in Example 2-2 except that the formation of the $SiO_2$ layer was omitted. In addition, the surface resistance of the optical sheet before and after the removing process was measured in the same manner as in Example 2-2. The results are shown in Table 8.

Table 7 shows the measurement results of the conductive sheet according to Example 3-2.

TABLE 7

| | First wavy surface (First region) | Second wavy surface (Second region) |
|---|---|---|
| Average wavelength λm (nm) | 250 | 250 |
| Average width Am of vibrations (nm) | 130 | 160 |
| Ratio (Am/λm) | 0.52 | 0.64 |
| Layer configuration before removal | ITO layer, $SiO_2$ layer | |
| Surface resistance (Ω/□) Before removal | 705 | 1800 |
| Surface resistance (Ω/□) After removal | 800 | ∞ |

Table 8 shows the measurement results of the optical sheet according to Comparative Example 3-2.

TABLE 8

| | First wavy surface (First region) | Second wavy surface (Second region) |
|---|---|---|
| Average wavelength λm (nm) | 250 | 250 |
| Average width Am of vibrations (nm) | 130 | 160 |
| Ratio (Am/λm) | 0.52 | 0.64 |
| Layer configuration before removal | ITO layer | |
| Surface resistance (Ω/□) Before removal | 700 | 1800 |
| Surface resistance (Ω/□) After removal | ∞ | ∞ |

The following can be seen from Tables 7 and 8.

In Example 3-2, in the surface of the conductive sheet, the ITO layer and the $SiO_2$ layer are removed from the second region having a high ratio (Am/λm=0.64) in the removing process and an insulated state is achieved. Contrary to this, the ITO layer and the $SiO_2$ layer are not removed from the first region having a low ratio (Am/λm=0.52) in the removing process and the remaining conductive state is maintained.

In Comparative Example 3-2 in which only the ITO layer is formed, after the removing process is performed for 60 seconds, the ITO layer is removed and the insulated state is achieved regardless of the magnitude of the high ratio (Am/λm).

Therefore, even in a case where the multi-layer structure in which the $SiO_2$ layer that is a resist layer is used instead of the Ag layer that is a metal layer, removal selectivity can be secured by adjusting the magnitude of the ratio (Am/λm), and thus the ITO layer and the $SiO_2$ layer can be allowed to remain in the first region having a low ratio (Am/λm=0.52). In addition, by laminating the $SiO_2$ layer on the ITO layer, the resistance of the ITO layer is enhanced during the removing process, and the removal selectivity can be dramatically enhanced.

Example 4

Transfer Process

First, a roll master copy in which a first region having a flat surface Sp1, a second region having a wavy surface Sw2, and a third region having a wavy surface Sw3 are sequentially formed in a stripe pattern on a molding surface was produced. Next, a plurality of UV light sources were arranged in a hollow portion of the roll master copy.

Next, a surface treatment solution was prepared by diluting an acrylic-based surface treatment agent with butyl acetate. Next, the surface of a sheet made of polyimide was treated by the prepared surface treatment solution, thereby forming an undercoat layer.

Next, an ultraviolet ray-curable resin was applied onto the surface of the sheet provided with the undercoat layer. Next, while the roll master copy was rotated, the transfer surface thereof was brought into close contact with the sheet to which the ultraviolet ray-curable resin was applied, and the ultraviolet ray-curable resin was irradiated by ultraviolet rays at a power of 100 mJ/cm$^2$ from the side of the transfer surface of the roll master copy so as to be cured and peeled off. Accordingly, an optical sheet (nanoimprinted film) to which the first region, the second region, and the third region of the roll master copy were transferred was produced.

(Shape Measurement)

Next, the average wavelengths λm and the average widths Am of vibrations of the wavy surfaces Sw2 and Sw3 on the transfer surface of the produced optical sheet were measured, and the ratio (Am/λm) was obtained from the measured values. The results are shown in Table 2.
(Film Forming Process)

Next, a laminated film was formed on the molding surface of the optical sheet by a sputtering method.

The configuration of the laminated film is described below.

TiOx layer (second functional layer)/ITO layer (adhesion layer)/Ag layer (first functional layer)/ITO layer (adhesion layer)/TiOx layer (second functional layer)/ITO layer (conductive layer)/optical sheet molding surface Hereinafter, film forming conditions of each layer are shown below.

TiOx layer (second functional layer)
Vacuum degree during film forming: about 0.28 Pa
Gas type: mixed gas of Ar gas and $O_2$ gas
Film thickness in terms of flat plate: 10 nm
ITO layer (adhesion layer)
Arrival vacuum degree: 0.00015 Pa
Vacuum degree during film forming: 0.24 Pa
Gas type: mixed gas of Ar gas and $O_2$ gas
Mixing ratio of mixed gas (volume ratio): Ar:$O_2$=200:16
Film thickness in terms of flat plate: 20 nm
Ag layer (first functional layer)
Vacuum degree during film forming: 0.11 Pa
Gas type: Ar gas
Gas flow rate: 100 sccm
Film thickness in terms of flat plate: 100 nm
ITO layer (conductive layer)
Arrival vacuum degree: 0.00015 Pa
Vacuum degree during film forming: 0.24 Pa
Gas type: mixed gas of Ar gas and $O_2$ gas
Mixing ratio of mixed gas (volume ratio): Ar:$O_2$=200:16
Film thickness in terms of flat plate: 40 nm Here, the film thickness in terms of flat plate is a film thickness when an ITO layer, a TiOx layer, or an Ag layer is formed on a flat plate under the same conditions as those when an ITO layer, a TiOx layer, or an Ag layer is formed on the surface of the optical sheet described above and is substantially equal to the film thickness of the apex portion of the wavy surface of the optical sheet described above.
(Surface Resistance Measurement)

Next, the surface resistance of the conductive sheet produced as described above was measured.
(Removing Process)

Next, the conductive sheet was immersed into a solution with a PH of about 3 for 60 seconds.
(Cleaning Process)

Next, the conductive sheet was cleaned by pure water. Accordingly, a target conductive sheet was produced.
(Surface Resistance Measurement)

Next, the surface resistance of the conductive sheet produced as described above was measured.

Example 5

A conductive sheet was produced in the same manner as in Example 4 except that a ZrOx layer was used instead of the TiOx layer as the second functional layer, and the surface resistance thereof before and after the removing process was measured.

Example 6

A conductive sheet was produced in the same manner as in Example 4 except that a TaOx layer was used instead of the TiOx layer as the second functional layer, and the surface resistance thereof before and after the removing process was measured.

Example 7

A conductive sheet was produced in the same manner as in Example 4 except that an NbOx layer was used instead of the TiOx layer as the second functional layer, and the surface resistance thereof before and after the removing process was measured.

Example 8

A conductive sheet was produced in the same manner as in Example 4 except that an SiNx layer was used instead of the TiOx layer as the second functional layer, and the surface resistance thereof before and after the removing process was measured.

Example 9

A conductive sheet was produced in the same manner as in Example 4 except that an SiOx layer was used instead of the TiOx layer as the second functional layer, and the surface resistance thereof before and after the removing process was measured.

Example 10

A conductive sheet was produced in the same manner as in Example 9 except that an $SnO_2$ layer was used instead of the ITO layer as the adhesion layer, and the surface resistance thereof before and after the removing process was measured.

Example 11

A conductive sheet was produced in the same manner as in Example 9 except that an $In_2O_3$ layer was used instead of the ITO layer as the adhesion layer, and the surface resistance thereof before and after the removing process was measured.

Tables 9 show the measurement results of the conductive sheet according to Examples 4 to 11.

TABLE 9

|  |  | Flat surface (First region) | Wavy surface (Second region) | Wavy surface (Third region) |
|---|---|---|---|---|
| Example 4 | Average wavelength λm (nm) | — | 250 | 250 |
|  | Average width Am of vibrations (nm) | — | 130 | 160 |
|  | Ratio (Am/λm) | — | 0.52 | 0.64 |
|  | Layer configuration before removal | TiOx layer/ITO layer/Ag layer/ITO layer/TiOx layer/ITO layer | | |
|  | Layer configuration before | Entire layers remaining | Three layers remaining | Entire layers removed |

TABLE 9-continued

| | | Flat surface (First region) | Wavy surface (Second region) | Wavy surface (Third region) |
|---|---|---|---|---|
| Example 5 | removal | | (ITO layer/NbOx layer/ITO layer) | |
| | Change in surface resistance before and after removal | Substantially no change (low resistance maintained) | Increase by about 100 times (change to high resistance) | Change from conductive to insulated |
| | Average wavelength λm (nm) | — | 250 | 250 |
| | Average width Am of vibrations (nm) | — | 130 | 160 |
| | Ratio (Am/λm) | — | 0.52 | 0.64 |
| | Layer configuration before removal | ZrOx layer/ITO layer/Ag layer/ITO layer/ZrOx layer/ITO layer | | |
| | Layer configuration before removal | Entire layers remaining | Three layers remaining (ITO layer/NbOx layer/ITO layer) | Entire layers removed |
| Example 6 | Change in surface resistance before and after removal | Substantially no change (low resistance maintained) | Increase by about 100 times (change to high resistance) | Change from conductive to insulated |
| | Average wavelength λm (nm) | — | 250 | 250 |
| | Average width Am of vibrations (nm) | — | 130 | 160 |
| | Ratio (Am/λm) | — | 0.52 | 0.64 |
| | Layer configuration before removal | TaOx layer/ITO layer/Ag layer/ITO layer/TaOx layer/ITO layer | | |
| | Layer configuration before removal | Entire layers remaining | Three layers remaining (ITO layer/NbOx layer/ITO layer) | Entire layers removed |
| Example 7 | Change in surface resistance before and after removal | Substantially no change (low resistance maintained) | Increase by about 100 times (change to high resistance) | Change from conductive to insulated |
| | Average wavelength λm (nm) | — | 250 | 250 |
| | Average width Am of vibrations (nm) | — | 130 | 160 |
| | Ratio (Am/λm) | — | 0.52 | 0.64 |
| | Layer configuration before removal | NbOx layer/ITO layer/Ag layer/ITO layer/NbOx layer/ITO layer | | |
| | Layer configuration before removal | Entire layers remaining | Three layers remaining (ITO layer/NbOx layer/ITO layer) | Entire layers removed |
| Example 8 | Change in surface resistance before and after removal | Substantially no change (low resistance maintained) | Increase by about 100 times (change to high resistance) | Change from conductive to insulated |
| | Average wavelength λm (nm) | — | 250 | 250 |
| | Average width Am of vibrations (nm) | — | 130 | 160 |
| | Ratio (Am/λm) | — | 0.52 | 0.64 |
| | Layer configuration before removal | SiNx layer/ITO layer/Ag layer/ITO layer/SiNx layer/ITO layer | | |
| | Layer configuration before removal | Entire layers remaining | Three layers remaining (ITO layer/SiNx layer/ITO layer) | Entire layers removed |
| Example 9 | Change in surface resistance before and after removal | Substantially no change (low resistance maintained) | Increase by about 100 times (change to high resistance) | Change from conductive to insulated |
| | Average wavelength λm (nm) | — | 250 | 250 |
| | Average width Am of vibrations (nm) | — | 130 | 160 |
| | Ratio (Am/λm) | — | 0.52 | 0.64 |
| | Layer configuration before removal | SiOx layer/ITO layer/Ag layer/ITO layer/SiOx layer/ITO layer | | |
| | Layer configuration before removal | Entire layers remaining | Three layers remaining (ITO layer/SiOx layer/ITO layer) | Entire layers removed |
| Example 10 | Change in surface resistance before and after removal | Substantially no change (low resistance maintained) | Increase by about 100 times (change to high resistance) | Change from conductive to insulated |
| | Average wavelength λm (nm) | — | 250 | 250 |
| | Average width Am of vibrations (nm) | — | 130 | 160 |
| | Ratio (Am/λm) | — | 0.52 | 0.64 |
| | Layer configuration before removal | SiOx layer/SnO$_2$ layer/Ag layer/SnO$_2$ layer/SiOx layer/ITO layer | | |
| | Layer configuration before removal | Entire layers remaining | Three layers remaining (SnO$_2$ layer/SiOx layer/ITO layer) | Entire layers removed |
| Example 11 | Change in surface resistance before and after removal | Substantially no change (low resistance maintained) | Increase by about 100 times (change to high resistance) | Change from conductive to insulated |
| | Average wavelength λm (nm) | — | 250 | 250 |
| | Average width Am of vibrations (nm) | — | 130 | 160 |
| | Ratio (Am/λm) | — | 0.52 | 0.64 |
| | Layer configuration before removal | SiOx layer/In$_2$O$_3$ layer/Ag layer/In$_2$O$_3$ layer/SiOx layer/ITO layer | | |

TABLE 9-continued

|  | Flat surface (First region) | Wavy surface (Second region) | Wavy surface (Third region) |
| --- | --- | --- | --- |
| Layer configuration before removal | Entire layers remaining | Three layers remaining (In$_2$O$_3$ layer/SiOx layer/ITO layer) | Entire layers removed |
| Change in surface resistance before and after removal | Substantially no change (low resistance maintained) | Increase by about 100 times (change to high resistance) | Change from conductive to insulated |

The following can be seen from the above measurement results.

In the surface of the conductive sheet, the entire layers remain in the first region having the flat surface Sp1 even after the removing process, and thus a low resistance is held.

In the surface of the conductive sheet, the second region having the wavy surface Sw2 is opaque and has a low resistance before the removing process but becomes transparent and has a high resistance after the removing process. It is thought that this is because the layers including the Ag layer and the higher layers are removed in the removing process and the ITO layer at the lowermost layer remains.

In the surface of the conductive sheet, the third region having the wavy surface Sw3 is opaque and has a low resistance before the removing process but becomes transparent and enters an insulated state after the removing process. It is thought that this is because the entire layers are removed by the removing process.

Reference Example 1-1

Film Forming Process

First, a PET sheet having a flat surface was prepared. Next, an ITO layer was formed on the PET sheet by a sputtering method. The arrival vacuum degree was 0.00015 Pa, the vacuum degree during film forming was 0.24 Pa, Ar gas and O$_2$ gas were introduced during film forming, and the mixing ratio thereof was Ar:O$_2$=20:1. In addition, film forming conditions were adjusted so that the film thickness of the ITO layer became 30 nm.
(Annealing Process)

Next, annealing was performed on the PET sheet having the ITO layer formed therein, in the atmosphere at 150° C. for 60 minutes. Accordingly, forming a polycrystal in the ITO layer was accelerated. Next, in order to check the accelerated state, the ITO layer was measured by X-ray diffraction (XRD), and a peak of In$_2$O$_3$ was confirmed.

Accordingly, a target optical sheet was obtained.

Reference Example 1-2

Film Forming Process, Annealing Process

First, a film forming process and an annealing process were performed in the same manner as in Reference Example 1-1, thereby producing a PET film having an ITO layer subjected to the annealing treatment.
(Removing Process)

Next, the PET film subjected to the annealing treatment was immersed into a solution with a PH of about 3 for 10 seconds to etch the ITO layer.
(Cleaning Process)

Next, pure water cleaning, IPA (isopropyl alcohol) cleaning, and pure water cleaning were sequentially performed on the PET sheet subjected to the removing treatment.

Accordingly, a target optical sheet was obtained.

Reference Example 1-3

An optical sheet was obtained in the same manner as in Reference Example 1-2 except that the immersion time was changed to 20 seconds.

Reference Example 1-4

An optical sheet was obtained in the same manner as in Reference Example 1-2 except that the immersion time was changed to 30 seconds.

Reference Example 1-5

An optical sheet was obtained in the same manner as in Reference Example 1-2 except that the immersion time was changed to 40 seconds.

Reference Example 1-6

An optical sheet was obtained in the same manner as in Reference Example 1-2 except that the immersion time was changed to 50 seconds.

Reference Example 1-7

An optical sheet was obtained in the same manner as in Reference Example 1-2 except that the immersion time was changed to 60 seconds.

Reference Example 2-1

Transfer Process

First, a quartz master copy in which concave nanostructures were formed on a molding surface was prepared. Next, an ultraviolet ray-curable resin was applied to the quartz master copy having the nanostructures formed thereon, and a PET sheet to which an easy adhesive layer was attached was brought into close contact to be irradiated with ultra violet rays and cured, and the PET sheet was peeled off in this state. Accordingly, the PET sheet having a number of nanostructures formed on the surface was obtained.

Details of the configuration of the nanostructures formed on the surface of the PET sheet are shown below.

Arrangement of structures: hexagonal lattice arrangement
Uneven shape of structure: convex
Overall shape of structure: truncated cone
Arrangement pitch of structures: 250 nm
Height of structure: 90 nm
Aspect ratio of structure: 0.36
(Film Forming Process)

Next, an ITO layer was formed on the surface of the PET sheet having the nanostructures formed thereon by a sputtering method. An arrival vacuum degree was 0.00015 Pa, a vacuum degree during film forming was 0.24 Pa, and Ar gas and $O_2$ gas was introduced during the film forming so that the mixing ratio thereof was Ar:$O_2$=20:1. In addition, film forming conditions were adjusted so that the film thickness in terms of flat plate became 30 nm. In addition, the film thickness in terms of flat plate is a film thickness when an ITO layer is formed on a flat plate under the same conditions as those when the ITO layer is formed on the surface of the PET sheet having the nanostructures formed thereon. According to the knowledge of the engineers, the film thickness in terms of flat plate became substantially the same as the film thickness of the apex portion of the structure.

(Annealing Process)

Next, annealing was performed on the PET sheet having the ITO layer formed therein, in the atmosphere at 150° C. for 60 minutes. Accordingly, forming a polycrystal in the ITO layer was accelerated. Next, in order to check the accelerated state, the ITO layer was measured by X-ray diffraction (XRD), and a peak of $In_2O_3$ was confirmed.

Accordingly, a target optical sheet was obtained.

Reference Example 2-2

Film Forming Process, Annealing Process

First, a film forming process and an annealing process were performed in the same manner as in Reference Example 2-1, thereby producing a PET film having an ITO layer subjected to the annealing treatment.

(Removing Process)

Next, the PET film subjected to the annealing treatment was immersed into a solution with a PH of about 3 for 10 seconds to remove the ITO layer.

(Cleaning Process)

Next, pure water cleaning, IPA cleaning, and pure water cleaning were sequentially performed on the PET sheet subjected to the removing treatment.

Accordingly, a target optical sheet was obtained.

Reference Example 2-3

An optical sheet was obtained in the same manner as in Reference Example 2-2 except that the immersion time was changed to 20 seconds.

Reference Example 3-1

An optical sheet was obtained in the same manner as in Reference Example 2-1 except that the arrangement pitch of the structures was set to 250 nm, the height of the structure was set to 120 nm, and the aspect ratio was set to 0.48.

Reference Example 3-2

An optical sheet was obtained in the same manner as in Reference Example 2-2 except that the arrangement pitch of the structures was set to 250 nm, the height of the structure was set to 120 nm, and the aspect ratio was set to 0.48.

Reference Example 3-3

An optical sheet was obtained in the same manner as in Reference Example 2-3 except that the arrangement pitch of the structures was set to 250 nm, the height of the structure was set to 120 nm, and the aspect ratio was set to 0.48.

Reference Example 4-1

An optical sheet was obtained in the same manner as in Reference Example 2-1 except that the arrangement pitch of the structures was set to 250 nm, the height of the structure was set to 155 nm, and the aspect ratio was set to 0.62.

Reference Example 4-2

An optical sheet was obtained in the same manner as in Reference Example 2-2 except that the arrangement pitch of the structures was set to 250 nm, the height of the structure was set to 155 nm, and the aspect ratio was set to 0.62.

Reference Example 4-3

An optical sheet was obtained in the same manner as in Reference Example 2-3 except that the arrangement pitch of the structures was set to 250 nm, the height of the structure was set to 155 nm, and the aspect ratio was set to 0.62.

Reference Example 5-1

Film Forming Process, Annealing Process

A film forming process and an annealing process were performed in the same manner as in Reference Example 3-1 except that the following prism sheet (produced by Sumitomo 3M Ltd., product name: T-BEF), thereby producing a prism sheet having an ITO layer subjected to the annealing treatment.

Accordingly, a target optical sheet was obtained.

Details of the configuration of the prism sheet are shown below.

arrangement of prisms (structures): one-dimensional arrangement uneven shape of prism: convex shape of prism: the cross-section is a columnar body having an isosceles triangle shape arrangement pitch of prisms: 10 μm height of prism: 5 μm aspect ratio of prism: 0.50

Reference Example 5-2

Film Forming Process, Annealing Process

First, a film forming process and an annealing process were performed in the same manner as in Reference Example 5-1, thereby producing a prism sheet having an ITO layer subjected to the annealing treatment.

(Etching Process)

Next, the prism sheet subjected to the annealing treatment was immersed into a solution with a PH of about 3 for 10 seconds to etch the ITO layer.

(Cleaning Process)

Next, pure water cleaning, IPA cleaning, and pure water cleaning were sequentially performed on the prism sheet subjected to the etching treatment.

Accordingly, a target optical sheet was obtained.

Reference Example 5-3

An optical sheet was obtained in the same manner as in Reference Example 5-2 except that the immersion time was changed to 20 seconds.

Reference Example 5-4

An optical sheet was obtained in the same manner as in Reference Example 5-2 except that the immersion time was changed to 30 seconds.

Reference Example 5-5

An optical sheet was obtained in the same manner as in Reference Example 5-2 except that the immersion time was changed to 40 seconds.

(Surface Resistance)

The surface resistance value of the surface of the optical sheet of Reference Examples 1-1 to 5-5 obtained as described above was measured by a four-point probe method. The results are shown in Table 10.

(Reciprocal of initial rate of change)

The reciprocal of the rate of change (change in virtual thickness) in the surface of the optical sheet of Reference Examples 1-1 to 5-5 obtained as described above was obtained by the following expression. The results are shown in Table 11 and FIG. 36.

(reciprocal of initial rate of change)=(surface resistance of sample before removal)/(surface resistance of sample after removal)

Figure 10:
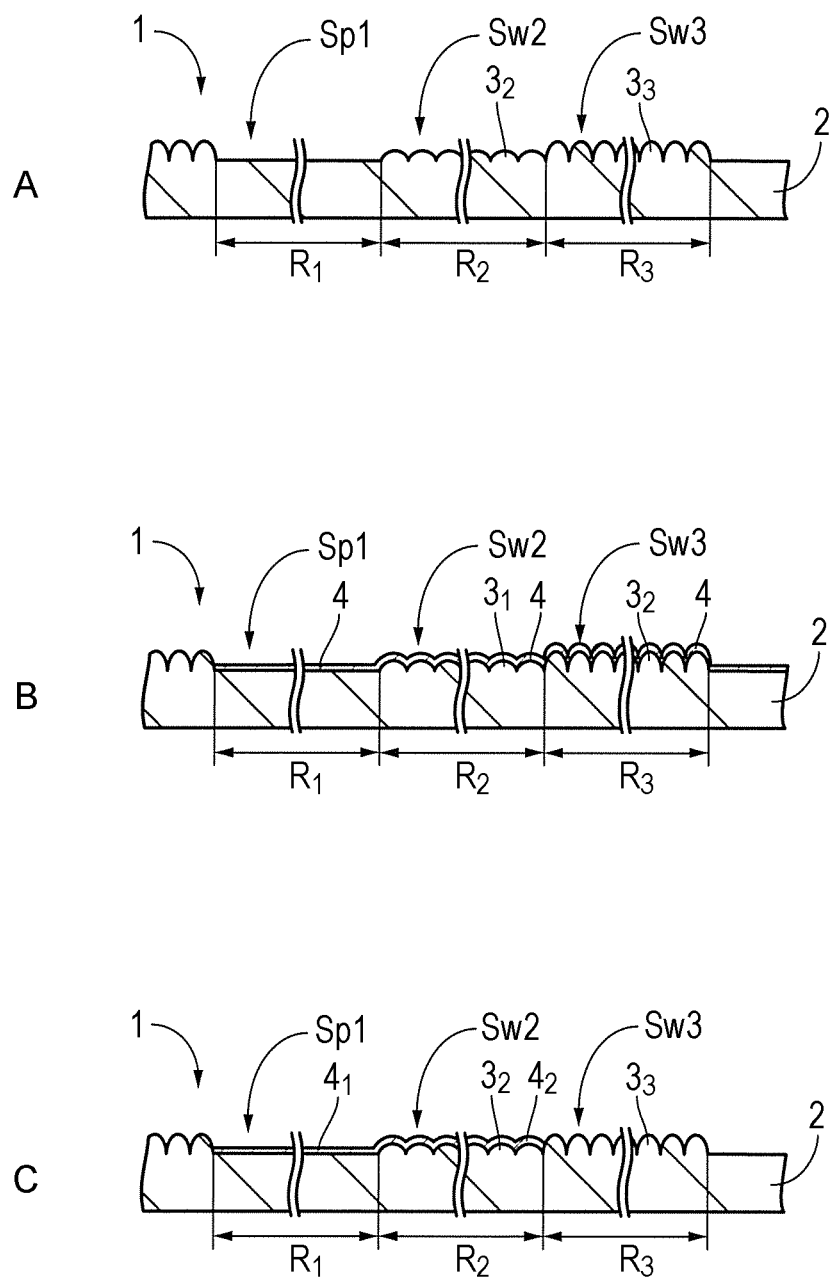
FIGS. 10A to 10C are process diagrams illustrating the example of the method of manufacturing the conductive element according to the first embodiment of the present technology.

FIG. 10 shows the evaluation results of the surface resistance of the optical sheet according to Reference Examples 1-1 to 5-5.

TABLE 10

|  | Pitch | Height | Aspect | Immersion time (sec) | | | | | | |
|---|---|---|---|---|---|---|---|---|---|---|
|  |  |  |  | 0 | 10 | 20 | 30 | 40 | 50 | 60 |
| Reference Examples 1-1 to 1-7 | 0 | 0 | 0.00 | 208 | 187 | 193 | 194 | 197 | 201 | 201.8 |
| Reference Examples 2-1 to 2-3 | 250 nm | 90 nm | 0.36 | 228 | 568 | ∞ | — | — | — | — |
| Reference Examples 3-1 to 3-3 | 250 nm | 120 nm | 0.48 | 258 | 2900 | ∞ | — | — | — | — |
| Reference Examples 4-1 to 4-3 | 250 nm | 155 nm | 0.62 | 309 | 9000 | ∞ | — | — | — | — |
| Reference Examples 5-1 to 5-5 | 10 μm | 5 μm | 0.50 | 282 | 634 | 740 | 3000 | ∞ | — | — | unit: Ω/□

Table 11 shows the evaluation results of the reciprocal of the initial rate of change in the optical sheet according to Reference Examples 1-1 to 5-5.

TABLE 11

|  | Pitch | Height | Aspect | Immersion time (sec) | | | | | | |
|---|---|---|---|---|---|---|---|---|---|---|
|  |  |  |  | 0 | 10 | 20 | 30 | 40 | 50 | 60 |
| Reference Examples 1-1 to 1-7 | 0 | 0 | 0.00 | 1 | 1.11 | 1.08 | 1.07 | 1.06 | 1.03 | 1.03 |
| Reference Examples 2-1 to 2-3 | 250 nm | 90 nm | 0.36 | 1 | 0.40 | 0 | — | — | — | — |
| Reference Examples 3-1 to 3-3 | 250 nm | 120 nm | 0.48 | 1 | 0.09 | 0 | — | — | — | — |
| Reference Examples 4-1 to 4-3 | 250 nm | 155 nm | 0.62 | 1 | 0.03 | 0 | — | — | — | — |
| Reference Examples 5-1 to 5-5 | 10 μm | 5 μm | 0.50 | 1 | 0.44 | 0.38 | 0.09 | 0 | — | — |

(reciprocal of initial rate of change)=(surface resistance of sample before etching)/(surface resistance of sample after etching)

Figure 36:
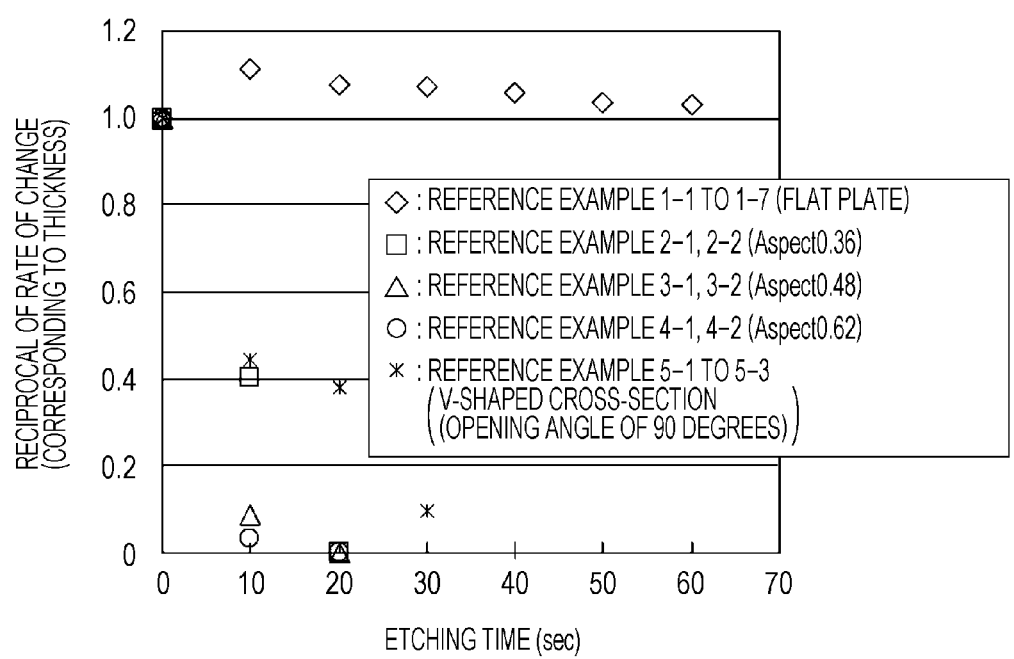
FIG. 36 is a graph showing the relationship between the etching time and the reciprocal of an initial surface resistance (change in virtual thickness).

The following can be seen from Tables 10 and 11 and FIG. 36.

In Reference Examples 1-1 to 1-7 in which the ITO layer is formed on the flat surface, the film thickness of the ITO layer is not substantially changed by the removal but the surface resistance tends to be substantially constant. Contrary to this, in Reference Examples 2-1 to 2-3, Reference Examples 3-1 to 3-3, and Reference Examples 4-1 to 4-3 in which the ITO layer is formed on a number of structures, the film thickness of the ITO layer is dramatically reduced by the removal and the surface resistance tends to dramatically increase.

Even in Reference Examples 5-1 to 5-5 in which a number of structures are formed at an arrangement pitch on the order of micrometers, the same tendency as in Reference Examples 2-1 to 2-3, Reference Examples 3-1 to 3-3, and Reference Examples 4-1 to 4-3 in which a number of structures are formed at an arrangement pitch on the order of nanometers is shown.

While the embodiments of the present technology have been described in detail, the present technology is not limited to the above-described embodiments, and various modifications based on the technical spirit of the present technology can be made.

For example, the configurations, methods, processes, shapes, materials, numerical values, and the like employed in the above-described embodiments are merely examples, and different configurations, methods, processes, shapes, materials, numerical values, and the like may be used as needed.

In addition, the configurations, methods, processes, shapes, materials, numerical values, and the like of the above-described embodiments can be combined without departing from the concept of the present technology.

Moreover, in the above-described embodiments, the example in which the present technology is applied to a single-layered conductive element having wiring formed on one surface or on both surfaces is described. However, the present technology is not limited to this example and may also be applied to a multi-layered conductive element.

Furthermore, in the above-described embodiments, the case where wiring is formed on the substrate surface on the flat surface is exemplified. However, the surface where the wiring is formed is not limited to the flat surface and wiring may also be formed on the substrate surface on a curved surface.

(Configurations of Present Technology)

In addition, the present technology may employ the following configurations.

(1) A conductive element including:
a substrate;
a shape layer which is provided on a surface of the substrate and has a first wavy surface, a second wavy surface, and a third wavy surface;
a first layer provided on the first wavy surface; and
a second layer provided on the second wavy surface,
wherein the shape layer contains an energy ray-curable resin composition,
the first layer has a laminated structure in which two or more layers are laminated,
the second layer has a single-layered structure or a laminated structure including a partial layer of the first layer,
the first and second layers form a conductive pattern portion,
the first, second, and third wavy surfaces satisfy the following relationship:

$$0 \leq (Am1/\lambda m1) < (Am2/\lambda m2) < (Am3/\lambda m3) \leq 1.8$$

(where $Am1$ is an average width of vibrations of the first wavy surface, $Am2$ is an average width of vibrations of the second wavy surface, $Am3$ is an average width of vibrations of the third wavy surface, $\lambda m1$ is an average wavelength of the first wavy surface, $\lambda m2$ is an average wavelength of the second wavy surface, and $\lambda m3$ is an average wavelength of the third wavy surface.)

(2) The conductive element described in (1),
wherein unit regions having a predetermined uneven pattern are continuously formed on a surface of the shape layer without causing inconsistency between uneven shapes, and
the substrate has impenetrability to energy rays for curing the energy ray-curable resin composition.

(3) The conductive element described in (2),
wherein the substrate has a band-like shape, and
the unit regions are continuously formed in a longitudinal direction of the substrate.

(4) The conductive element described in (2),
wherein the inconsistency between the uneven shapes is a disorder of cycles of the predetermined uneven pattern.

(5) The conductive element described in (2),
wherein the inconsistency between the uneven shapes is an overlap, a gap, or a non-transfer portion between adjacent unit regions.

(6) The conductive element described in (2),
wherein the unit regions are connected without causing inconsistency in curing degree of the energy ray-curable resin composition.

(7) The conductive element described in (6),
wherein the inconsistency in the curing degree of the energy ray-curable resin composition is a difference in degree of polymerization.

(8) The conductive element described in any one of (1) to (7),
wherein the shape layer is formed by a curing reaction performed on the energy ray-curable resin composition applied onto the substrate in a direction from the opposite side to the substrate.

(9) The conductive element described in (2),
wherein the unit region is a transfer region formed by making one revolution of a rotation surface of a rotation master copy.

(10) The conductive element described in (2),
wherein the uneven pattern is formed by one-dimensionally or two-dimensionally arranging a plurality of convex or concave structures.

(11) The conductive element described in any one of (1) to (10),
wherein the first, second, and third wavy surfaces satisfy the following relationship, and a wavelength $\lambda 2$ of the second wavy surface and a wavelength $\lambda 3$ of the third wavy surface are equal to or shorter than a wavelength of visible light:

$$(Am1/\lambda m1)=0, 0<(Am2/\lambda m2)<(Am3/\lambda m3) \leq 1.8.$$

(12) The conductive element described in any one of (1) to (10),
wherein the first, second, and third wavy surfaces satisfy the following relationship, and
a wavelength $\lambda 1$ of the first wavy surface, a wavelength $\lambda 2$ of the second wavy surface, and a wavelength $\lambda 3$ of the third wavy surface are equal to or shorter than a wavelength of visible light:

$$0<(Am1/\lambda m1)<(Am2/\lambda m2)<(Am3/\lambda m3) \leq 1.8$$

(13) The conductive element described in any one of (1) to (10),
wherein the first, second, and third wavy surfaces satisfy the following relationship, and a wavelength λ2 of the second wavy surface and a wavelength λ3 of the third wavy surface are equal to or shorter than 100 µm:

$$(Am1/\lambda m1)=0,0<(Am2/\lambda m2)<(Am3/\lambda m3)\leq 1.8$$

(14) The conductive element described in any one of (1) to (10),
wherein the first, second, and third wavy surfaces satisfy the following relationship, and
a wavelength λ1 of the first wavy surface, a wavelength λ2 of the second wavy surface, and a wavelength λ3 of the third wavy surface are equal to or shorter than 100 µm:

$$0<(Am1/\lambda m1)<(Am2/\lambda m2)<(Am3/\lambda m3)\leq 1.8$$

(15) The conductive element described in any one of (1) to (10), further including:
a third layer formed on the third wavy surface,
wherein the third layer includes a partial layer of the second layer, and
the first, second, and third layers satisfy the following relationship:

$$S1>S2>S3$$

(where S1 is a unit region of the first layer, S2 is a unit region of the second layer, and S3 is a unit region of the third layer.)

(16) The conductive element described in (15),
wherein the first and second layers are continuously formed on the first and second wavy surfaces, respectively, and
the third layer is discontinuously formed on the third wavy surface.

(17) The conductive element described in any one of (1) to (10), further including:
a third layer formed on the third wavy surface,
wherein the first, second, and third layers satisfy the following relationship:

$$d1>d2>d3$$

(where d1 is an average thickness of the first layer, d2 is an average thickness of the second layer, and d3 is an average thickness of the third layer.)

(18) The conductive element described in any one of (1) to (10),
wherein the first layer includes a conductive layer, a first functional layer formed on the conductive layer, and a second functional layer formed on the first functional layer, and
the second layer has a conductive layer.

(19) The conductive element described in (18), further including:
a second functional layer formed between the conductive layer and the first functional layer.

(20) The conductive element described in (18),
wherein the conductive layer is a transparent conductive layer containing an oxide semiconductor, and
the oxide semiconductor contains indium tin oxide or zinc oxide.

(21) The conductive element described in (20),
wherein the oxide semiconductor has a mixed state of amorphous and polycrystalline structures.

(22) The conductive element described in (18),
wherein the first functional layer and the second functional layer are made of different materials.

(23) The conductive element described in (22),
wherein the first and second functional layers are metal layers, and
the metal layers contain at least one type selected from the group consisting of Ag, Al, Au, Pt, Pd, Ni, Cr, Nb, W, Mo, Ti, Cu, and Nd.

(24) The conductive element described in (22),
wherein the first and second functional layers contain at least one type selected from the group consisting of an oxide and a transition metal compound.

(25) The conductive element described in (24),
wherein the first and second functional layers contain at least one type of a film in which amorphous and polycrystalline structures are mixed and a polycrystalline film.

(26) A wiring element including:
the conductive element described in any one of (1) to (25).

(27) An information input device including:
the conductive element described in any one of (1) to (25).

(28) A display apparatus including:
the conductive element described in any one of (1) to (25).

(29) An electronic device including:
the conductive element described in any one of (1) to (25).

(30) A master copy for producing:
the conductive element described in any one of (1) to (25).

(31) A master copy for producing:
the wiring element described in (26).

(32) A method of manufacturing a conductive element including:
applying an energy ray-curable resin composition to a surface of a substrate;
while a rotation surface of a rotation master copy is rotated and is brought into close contact with the energy ray-curable resin composition applied to the surface of the substrate, irradiating the energy ray-curable resin composition with energy rays emitted by an energy ray source provided in the rotation master copy via the rotation surface so as to be cured, thereby forming a shape layer having a first wavy surface, a second wavy surface, and a third wavy surface on the surface of the substrate;
forming a laminated film on the first, second, and third wavy surfaces; and
removing the laminated film formed on the third wavy surface among the first, second, and third wavy surfaces, allowing the laminated film formed on the first wavy surface to remain as a first layer, and allowing a partial layer of the laminated film formed on the second wavy surface to remain as a second layer, thereby forming a conductive pattern portion,
wherein the first, second, and third wavy surfaces satisfy the following relationship:

$$0\leq(Am1/\lambda m1)<(Am2/\lambda m2)<(Am3/\lambda m3)\leq 1.8$$

(where Am1 is an average width of vibrations of the first wavy surface, Am2 is an average width of vibrations of the second wavy surface, Am3 is an average width of vibrations of the third wavy surface, λm1 is an average wavelength of the first wavy surface, λm2 is an average wavelength of the second wavy surface, and λm3 is an average wavelength of the third wavy surface.)

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

EXPLANATION OF REFERENCE NUMERALS

1 CONDUCTIVE ELEMENT
2 SUBSTRATE
$3_1, 3_2, 3_3$ STRUCTURE
4a CONDUCTIVE LAYER
4b FIRST FUNCTIONAL LAYER
4c SECOND FUNCTIONAL LAYER
11 ROLL MASTER COPY
12 STRUCTURE
13 RESIST LAYER
Sp1 FLAT SURFACE
Sw1, Sw2, Sw3 WAVY SURFACE

The invention claimed is:

1. A conductive element comprising:
a substrate;
a shape layer which is provided on a surface of the substrate and has a first wavy surface, a second wavy surface, and a third wavy surface;
a first layer provided on the first wavy surface; and
a second layer provided on the second wavy surface,
wherein the shape layer contains an energy ray-curable resin composition,
the first layer has a laminated structure in which two or more layers are laminated,
the second layer has a single-layered structure or a laminated structure including a partial layer of the first layer,
the first and second layers form a conductive pattern portion, and
the first, second, and third wavy surfaces satisfy the following relationship:

$$0 \leq (Am1/\lambda m1) < (Am2/\lambda m2) < (Am3/\lambda m3) \leq 1.8$$

(where Am1 is an average width of vibrations of the first wavy surface, Am2 is an average width of vibrations of the second wavy surface, Am3 is an average width of vibrations of the third wavy surface, $\lambda$m1 is an average wavelength of the first wavy surface, $\lambda$m2 is an average wavelength of the second wavy surface, and $\lambda$m3 is an average wavelength of the third wavy surface).

2. The conductive element according to claim 1,
wherein unit regions having a predetermined uneven pattern are continuously formed on a surface of the shape layer without causing inconsistency between uneven shapes, and
the substrate has impenetrability to energy rays for curing the energy ray-curable resin composition.

3. The conductive element according to claim 2,
wherein the substrate has a band-like shape, and
the unit regions are continuously formed in a longitudinal direction of the substrate.

4. The conductive element according to claim 2,
wherein the inconsistency between the uneven shapes is a disorder of cycles of the predetermined uneven pattern.

5. The conductive element according to claim 2,
wherein the inconsistency between the uneven shapes is an overlap, a gap, or a non-transfer portion between adjacent unit regions.

6. The conductive element according to claim 2,
wherein the unit regions are connected without causing inconsistency in curing degree of the energy ray-curable resin composition.

7. The conductive element according to claim 6,
wherein the inconsistency in the curing degree of the energy ray-curable resin composition is a difference in degree of polymerization.

8. The conductive element according to claim 2,
wherein the shape layer is formed by a curing reaction performed on the energy ray-curable resin composition applied onto the substrate in a direction from the opposite side to the substrate.

9. The conductive element according to claim 2,
wherein the unit region is a transfer region formed by making one revolution of a rotation surface of a rotation master copy.

10. The conductive element according to claim 2,
wherein the uneven pattern is formed by one-dimensionally or two-dimensionally arranging a plurality of convex or concave structures.

11. The conductive element according to claim 1,
wherein the first, second, and third wavy surfaces satisfy the following relationship, and
a wavelength $\lambda$2 of the second wavy surface and a wavelength $\lambda$3 of the third wavy surface are equal to or shorter than a wavelength of visible light:

$$(Am1/\lambda m1)=0, 0<(Am2/\lambda m2)<(Am3/\lambda m3) \leq 1.8.$$

12. The conductive element according to claim 1,
wherein the first, second, and third wavy surfaces satisfy the following relationship, and
a wavelength $\lambda$1 of the first wavy surface, a wavelength $\lambda$2 of the second wavy surface, and a wavelength $\lambda$3 of the third wavy surface are equal to or shorter than a wavelength of visible light:

$$0<(Am1/\lambda m1)<(Am2/\lambda m2)<(Am3/\lambda m3) \leq 1.8.$$

13. The conductive element according to claim 1,
wherein the first, second, and third wavy surfaces satisfy the following relationship, and
a wavelength $\lambda$2 of the second wavy surface and a wavelength $\lambda$3 of the third wavy surface are equal to or shorter than 100 μm:

$$(Am1/\lambda m1)=0, 0<(Am2/\lambda m2)<(Am3/\lambda m3) \leq 1.8.$$

14. The conductive element according to claim 1,
wherein the first, second, and third wavy surfaces satisfy the following relationship, and
a wavelength $\lambda$1 of the first wavy surface, a wavelength $\lambda$2 of the second wavy surface, and a wavelength $\lambda$3 of the third wavy surface are equal to or shorter than 100 μm:

$$0<(Am1/\lambda m1)<(Am2/\lambda m2)<(Am3/\lambda m3) \leq 1.8.$$

15. The conductive element according to claim 1, further comprising:
a third layer formed on the third wavy surface,
wherein the third layer includes a partial layer of the second layer, and
the first, second, and third layers satisfy the following relationship:

$$S1>S2>S3$$

(where S1 is a unit region of the first layer, S2 is a unit region of the second layer, and S3 is a unit region of the third layer).

16. The conductive element according to claim 15,
wherein the first and second layers are continuously formed on the first and second wavy surfaces, respectively, and
the third layer is discontinuously formed on the third wavy surface.

17. The conductive element according to claim 1, further comprising:
a third layer formed on the third wavy surface,
wherein the first, second, and third layers satisfy the following relationship:

$$d1 > d2 > d3$$

(where d1 is an average thickness of the first layer, d2 is an average thickness of the second layer, and d3 is an average thickness of the third layer).

18. A master copy for producing:
the conductive element or the wiring element according to claim 1.

19. A wiring element comprising:
a substrate;
a shape layer which is provided on a surface of the substrate and has a first wavy surface, a second wavy surface, and a third wavy surface;
a first layer provided on the first wavy surface; and
a second layer provided on the second wavy surface,
wherein the shape layer contains an energy ray-curable resin composition,
the first layer has a laminated structure in which two or more layers are laminated,
the second layer has a single-layered structure or a laminated structure including a partial layer of the first layer,
the first and second layers form a conductive pattern portion, and
the first, second, and third wavy surfaces satisfy the following relationship:

$$0 \leq (Am1/\lambda m1) < (Am2/\lambda m2) < (Am3/\lambda m3) \leq 1.8$$

(where Am1 is an average width of vibrations of the first wavy surface, Am2 is an average width of vibrations of the second wavy surface, Am3 is an average width of vibrations of the third wavy surface, $\lambda m1$ is an average wavelength of the first wavy surface, $\lambda m2$ is an average wavelength of the second wavy surface, and $\lambda m3$ is an average wavelength of the third wavy surface).

20. A method of manufacturing a conductive element comprising:
applying an energy ray-curable resin composition to a surface of a substrate;
while a rotation surface of a rotation master copy is rotated and is brought into close contact with the energy ray-curable resin composition applied to the surface of the substrate, irradiating the energy ray-curable resin composition with energy rays emitted by an energy ray source provided in the rotation master copy via the rotation surface so as to be cured, thereby forming a shape layer having a first wavy surface, a second wavy surface, and a third wavy surface on the surface of the substrate;
forming a laminated film on the first, second, and third wavy surfaces; and
removing the laminated film formed on the third wavy surface among the first, second, and third wavy surfaces, allowing the laminated film formed on the first wavy surface to remain as a first layer, and allowing a partial layer of the laminated film formed on the second wavy surface to remain as a second layer, thereby forming a conductive pattern portion, wherein the first, second, and third wavy surfaces satisfy the following relationship:

$$0 \leq (Am1/\lambda m1) < (Am2/\lambda m2) < (Am3/\lambda m3) \leq 1.8$$

(where Am1 is an average width of vibrations of the first wavy surface, Am2 is an average width of vibrations of the second wavy surface, Am3 is an average width of vibrations of the third wavy surface, $\lambda m1$ is an average wavelength of the first wavy surface, $\lambda m2$ is an average wavelength of the second wavy surface, and $\lambda m3$ is an average wavelength of the third wavy surface).

* * * * *